(12) United States Patent
Yang et al.

(10) Patent No.: US 12,167,648 B2
(45) Date of Patent: Dec. 10, 2024

(54) ARRAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Huijuan Yang, Beijing (CN); Xiaofeng Jiang, Beijing (CN); Tinghua Shang, Beijing (CN); Yang Zhou, Beijing (CN); Yi Zhang, Beijing (CN); Lulu Yang, Beijing (CN); Lu Bai, Beijing (CN)

(73) Assignees: Beijing BOE Technology Development Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 769 days.

(21) Appl. No.: 17/311,606

(22) PCT Filed: Nov. 17, 2020

(86) PCT No.: PCT/CN2020/129336
§ 371 (c)(1),
(2) Date: Jun. 7, 2021

(87) PCT Pub. No.: WO2021/189875
PCT Pub. Date: Sep. 30, 2021

(65) Prior Publication Data
US 2022/0367590 A1 Nov. 17, 2022

(30) Foreign Application Priority Data
Mar. 25, 2020 (WO) ............... PCT/CN2020/081155

(51) Int. Cl.
*H10K 59/121* (2023.01)
*H10K 50/813* (2023.01)
(Continued)

(52) U.S. Cl.
CPC ......... *H10K 59/131* (2023.02); *H10K 50/813* (2023.02); *H10K 59/1213* (2023.02); *H10K 59/1216* (2023.02); *H10K 59/122* (2023.02)

(58) Field of Classification Search
CPC .................. H10K 59/131; H10K 59/1216
See application file for complete search history.

(56) References Cited

U.S. PATENT DOCUMENTS

2002/0196208 A1* 12/2002 Nanno ................. G09G 3/3659
345/55
2006/0232537 A1* 10/2006 Kim .................. G02F 1/134363
345/63

(Continued)

FOREIGN PATENT DOCUMENTS

CN      110265458 A    9/2019
EP       2874143 B1    4/2019

OTHER PUBLICATIONS

Extended European Search Report in the European Patent Application No. 20927204.6, dated Mar. 21, 2023.

(Continued)

*Primary Examiner* — Eric K Ashbahian
(74) *Attorney, Agent, or Firm* — Intellectual Valley Law, P.C.

(57) ABSTRACT

An array substrate is provided. The array substrate includes a gate line extending along a first direction. The gate line includes a plurality of wide portions and a plurality of narrow portions respectively arranged along the first direction, the plurality of wide portions having a first dimension greater than a second dimension of the plurality of narrow (Continued)

portions along a second direction, the second direction at an angle in a range of 80 degrees to 100 degrees with respect to the first direction. An orthographic projection of a respective one of the plurality of wide portions in the respective subpixel on the base substrate overlaps with an orthographic projection of a portion of the semiconductor material layer in the respective subpixel on the base substrate, forming an active layer of the data-write transistor in the respective subpixel.

20 Claims, 35 Drawing Sheets

(51) Int. Cl.
*H10K 59/131* (2023.01)
*H10K 59/122* (2023.01)

(56) References Cited

U.S. PATENT DOCUMENTS

| | | | |
|---|---|---|---|
| 2020/0043990 A1 | 2/2020 | Huangfu et al. | |
| 2020/0105849 A1* | 4/2020 | Kim | H10K 59/1213 |
| 2020/0411611 A1 | 12/2020 | Liu et al. | |
| 2021/0151542 A1* | 5/2021 | Choe | H10K 59/1216 |

OTHER PUBLICATIONS

Extended European Search Report in the European Patent Application No. 20923711.4, dated Sep. 6, 2023.

* cited by examiner

ARRAY SUBSTRATE AND DISPLAY APPARATUS

CROSS-REFERENCE TO RELATED APPLICATION

This application is a national stage application under 35 U.S.C. § 371 of International Application No. PCT/CN2020/129336, filed Nov. 17, 2020, which is a continuation-in-part of International Application No. PCT/CN2020/081155, filed Mar. 25, 2020. Each of the forgoing applications is herein incorporated by reference in its entirety for all purposes.

TECHNICAL FIELD

The present invention relates to display technology, more particularly, to an array substrate and a display apparatus.

BACKGROUND

In recent years, miniaturized electro-optics devices are proposed and developed, including micro light emitting diode (micro LED). The micro LED-based display panels have the advantages of high brightness, high contrast ratio, fast response, and low power consumption. The micro LED-based display technology has found a wide range of applications in the display field, including smartphones and smart watches.

SUMMARY

In one aspect, the present disclosure provides an array substrate, comprising a base substrate; a semiconductor material layer on the base substrate; a gate line extending along a first direction; a plurality of pixel driving circuits respectively in a plurality of subpixels configured to respectively drive a plurality of light emitting elements; wherein a respective one of the plurality of pixel driving circuits comprises a driving transistor configured to generate a driving current for driving a light emitting element to emit light, a data-write transistor configured to write a voltage into a source electrode of the driving transistor, and a compensating transistor; the gate line comprises a plurality of wide portions and a plurality of narrow portions respectively arranged along the first direction, the plurality of wide portions having a first dimension greater than a second dimension of the plurality of narrow portions along a second direction, the second direction at an angle in a range of 80 degrees to 100 degrees with respect to the first direction; an orthographic projection of a respective one of the plurality of wide portions in the respective subpixel on the base substrate overlaps with an orthographic projection of a portion of the semiconductor material layer in the respective subpixel on the base substrate, forming an active layer of the data-write transistor in the respective subpixel; and a ratio of a channel length to a channel width of the active layer of the data-write transistor is in a range of 1.5:1 to 3:1.

Optionally, the ratio of the channel length to the channel width of the active layer of the data-write transistor is in a range of 2:1 to 3:1.

Optionally, the plurality of wide portions and the plurality of narrow portions are arranged alternately along the first direction; and the plurality of wide portions are respectively in subpixels along the first direction.

Optionally, the plurality of wide portions has a first line width; the plurality of narrow portions has a second line width; and a ratio of the first line width to the second line width is in a range of 1.1:1 to 3:1.

Optionally, the respective one of the plurality of wide portions has the first dimension greater than the second dimension by protruding towards both sides along the second direction relative to the respective one of the plurality of narrow portions.

Optionally, the respective one of the plurality of pixel driving circuits further comprises a storage capacitor comprising a first capacitor electrode, a second capacitor electrode, and an insulating layer between the first capacitor electrode and the second capacitor electrode; the second capacitor electrode comprises a main portion and a connection portion connecting main portions of second capacitor electrodes respectively from two adjacent subpixels along the first direction; the main portion has a wider portion and a narrower portion, the wider portion having a width along a second direction greater than a width of the narrower portion along the direction perpendicular to the first direction; and orthographic projections of a respective one of the plurality of wide portions and the narrower portion on a line arranged along a first direction at least partially overlap with each other.

Optionally, the respective one of the plurality of pixel driving circuits further comprises a storage capacitor comprising a first capacitor electrode, a second capacitor electrode, and an insulating layer between the first capacitor electrode and the second capacitor electrode; the second capacitor electrode comprises a main portion and a connection portion connecting main portions of second capacitor electrodes respectively from two adjacent subpixels along the first direction; and orthographic projections of a respective one of the plurality of wide portions and the connection portion on a line arranged along a first direction at least partially overlap with each other.

Optionally, the array substrate further comprises a data line extending along the second direction; a respective column of pixel driving circuits corresponds to the data line; the data line comprises a main data line portion and a protruding data line portion; the protruding data line portion has a dimension along the first direction greater than a dimension of the main data line portion along the first direction; wherein the orthographic projection of the respective one of the plurality of wide portions on the base substrate partially overlaps with an orthographic projection of the data line on the base substrate forming an overlapped part, a ratio of a dimension of the overlapped part along the first direction to a dimension of the main data line portion along the first direction is in a range of 10% to 100%.

Optionally, the array substrate further comprises a data line extending along the second direction; a respective column of pixel driving circuits corresponds to the data line; the data line comprises a main data line portion and a protruding data line portion; the protruding data line portion has a dimension along the first direction greater than a dimension of the main data line portion along the first direction; wherein the orthographic projection of any one of the plurality of wide portions on the base substrate and an orthographic projection of the data line on the base substrate are spaced apart from each other.

Optionally, the array substrate further comprises a node connecting line connecting the gate electrode of the driving transistor and one of a source electrode and drain electrode of the compensating transistor; wherein the plurality of subpixels comprises a first subpixel configured to emit a light of a first color; a second subpixel configured to emit a light of a second color; a third subpixel configured to emit a light of a third color; orthographic projections of first nodes respectively in the first subpixel, the second subpixel, and the third subpixel on the base substrate are respectively at least 50% covered by orthographic projections of a first anode of a first light emitting element in the first subpixel, a second anode of a second light emitting element in the second subpixel, and a third anode of a third light emitting element in the third subpixel on the base substrate, a respective first node in a respective subpixel comprising a respective gate electrode of the driving transistor and a respective node connecting line in the respective subpixel; and orthographic projections of node connecting lines respectively in the first subpixel, the second subpixel, and the third subpixel on the base substrate are respectively at least 80% covered by orthographic projections of the first anode of the first light emitting element in the first subpixel, the second anode of the second light emitting element in the second subpixel, and the third anode of the third light emitting element in the third subpixel on the base substrate.

In another aspect, the present disclosure provides a display apparatus, comprising the array substrate described herein or fabricated by a method described herein.

In another aspect, the present disclosure provides an array substrate, comprising a plurality of pixel driving circuits respectively in a plurality of subpixels configured to respectively drive a plurality of light emitting elements; wherein a respective one of the plurality of pixel driving circuits comprises a driving transistor and a compensating transistor; wherein the array substrate comprises a node connecting line, the node connecting line connecting a gate electrode of the driving transistor and one of a first electrode and a second electrode of the compensating transistor; wherein the plurality of subpixels comprise a first subpixel configured to emit a light of a first color; a second subpixel configured to emit a light of a second color; a third subpixel configured to emit a light of a third color; orthographic projections of first nodes respectively in the first subpixel, the second subpixel, and the third subpixel on a base substrate are respectively at least 50% covered by orthographic projections of a first anode of a first light emitting element in the first subpixel, a second anode of a second light emitting element in the second subpixel, and a third anode of a third light emitting element in the third subpixel on the base substrate, a respective first node in a respective subpixel comprising a respective gate electrode of the driving transistor and a respective node connecting line in the respective subpixel; and orthographic projections of node connecting lines respectively in the first subpixel; the second subpixel, and the third subpixel on the base substrate are respectively at least 80% covered by orthographic projections of the first anode of the first light emitting element in the first subpixel, the second anode of the second light emitting element in the second subpixel, and the third anode of the third light emitting element in the third subpixel on the base substrate.

Optionally, the plurality of subpixels further comprise a fourth subpixel configured to emit a light of the second color; wherein an orthographic projection of a first node in the second subpixel on the base substrate is at least 60% covered by an orthographic projection of the second anode of the second light emitting element in the second subpixel on the base substrate; an orthographic projection of a first node in the fourth subpixel on the base substrate is at least 60% covered by an orthographic projection of a fourth anode of a fourth light emitting element in the fourth subpixel on the base substrate; and a first area of the orthographic projection of the first node in the second subpixel on the base substrate covered by the orthographic projection of the second anode of the second light emitting element in the second subpixel on the base substrate is greater than a second area of the orthographic projection of the first node in the fourth subpixel on the base substrate covered by the orthographic projection of the fourth anode of the fourth light emitting element in the fourth subpixel on the base substrate.

Optionally, the orthographic projection of the fourth anode of the fourth light emitting element in the fourth subpixel on the base substrate has a first edge and a second edge respectively on two sides, along the first direction, of an orthographic projection of a node connecting line in the fourth subpixel on the base substrate, the first direction perpendicular to the orthographic projection of a node connecting line in the fourth subpixel on the base substrate; the first edge is a non-straight line; and the second edge comprises a straight line.

Optionally, the compensating transistor has a double gate structure; an orthographic projection of a portion of the third anode of the third light emitting element in the third subpixel on the base substrate at least partially overlaps with an orthographic projection of a gate electrode of the compensating transistor on the base substrate.

Optionally, the first anode of the first light emitting element in the first subpixel comprises a first portion of a hexagonal shape, a second portion, and a third portion; the hexagonal shape has a first side and a second side directly connected to each other; the second portion abuts the first side; the third portion abuts the second side; the second portion and the third portion abut each other along a third side; and the first side, the second side, and the third side are directly connected to each other at a corner of the hexagonal shape.

Optionally, the second portion comprises a first sub-portion and a second sub-portion; an orthographic projection of the first sub-portion on the base substrate at least partially overlaps with an orthographic projection of a node connecting line in the first subpixel on the base substrate but is non-overlapping with an orthographic projection of the gate electrode of the driving transistor in the first subpixel on the base substrate; an orthographic projection of the second sub-portion on the base substrate at least partially overlaps with the orthographic projection of the node connecting line in the first subpixel cin the base substrate and at least partially overlaps with the orthographic projection of the gate electrode of the driving transistor in the first subpixel on the base substrate; the array substrate comprises a gate line extending along a first direction; and a first width of the second sub-portion along the first direction is greater than a second width of the first sub-portion along the first direction.

Optionally, anodes are on a side of a second planarization layer away from a first planarization layer; wherein, in the first subpixel, the first anode is connected to a first anode contact pad through a first via extending through the second planarization layer, the first anode contact pad is connected to a first relay electrode through a second via extending through the first planarization layer; in the second subpixel, the second anode is connected to a second anode contact pad through a third via extending through the second planarization layer, the second anode contact pad is connected to a second relay electrode through a fourth via extending through the first planarization layer; in the third subpixel, the third anode is connected to a third anode contact pad through a fifth via extending through the second planarization layer, the third anode contact pad is connected to a third relay electrode through a sixth via extending through the first planarization layer; and a first distance between orthographic projections of the first via and the second via on the base substrate is greater than a second distance between the third via and the fourth via; and a third distance between orthographic projections of the fifth via and the sixth via is greater than the second distance between the third via and the fourth via.

Optionally, a first shortest distance between an orthographic projection of a first effective light emitting region of the first subpixel on the base substrate and an orthographic projection of the second via on the base substrate is greater than a second shortest distance between an orthographic projection of a second effective light emitting region of the second subpixel on the base substrate and an orthographic projection of the fourth via on the base substrate; and a third shortest distance between an orthographic projection of a third effective light emitting region of the third subpixel on the base substrate and an orthographic projection of the sixth via on the base substrate is greater than the second shortest distance.

Optionally, a first length of the first anode contact pad along the second direction and a second length of the second anode contact pad along the second direction are less than a third length of the third anode contact pad along the second direction; a fourth shortest distance between an orthographic projection of the second via on the base substrate and an orthographic projection of any anodes adjacent to the first anode on the base substrate is greater than a fifth shortest distance between an orthographic projection of the sixth via on the base substrate and an orthographic projection of any anodes adjacent to the third anode on the base substrate; and a sixth shortest distance between an orthographic projection of the fourth via on the base substrate and an orthographic projection of any anodes adjacent to the second anode on the base substrate is greater than the fifth shortest distance.

Optionally, a third area of an orthographic projection of a first node in the first subpixel on the base substrate covered by an orthographic projection of the first anode of the first light emitting element in the first subpixel on the base substrate is substantially same as a fourth area of an orthographic projection of a first node in the third subpixel on the base substrate covered by an orthographic projection of the third anode of the third light emitting element in the third subpixel on the base substrate; and the third area and the fourth area are less than a first area of an orthographic projection of a first node in the second subpixel on the base substrate covered by the orthographic projection of the second anode of the second light emitting element in the second subpixel on the base substrate.

Optionally, the array substrate further comprises a semiconductor material layer on the base substrate; and a gate line extending along a first direction; wherein a respective one of the plurality of pixel driving circuits comprises a driving transistor configured to generate a driving current for driving a light emitting element to emit light, a data-write transistor configured to write a voltage into a source electrode of the driving transistor, and a compensating transistor; the gate line comprises a plurality of wide portions and a plurality of narrow portions respectively arranged along the first direction, the plurality of wide portions having a first dimension greater than a second dimension of the plurality of narrow portions along a second direction, the second direction at an angle in a range of 80 degrees to 100 degrees with respect to the first direction; an orthographic projection of a respective one of the plurality of wide portions in the respective subpixel on the base substrate overlaps with an orthographic projection of a portion of the semiconductor material layer in the respective subpixel on the base substrate, forming an active layer of the data-write transistor in the respective subpixel; and a ratio of a channel length to a channel width of the active layer of the data-write transistor is in a range of 1.5:1 to 3:1.

In another aspect, the present disclosure provides a display apparatus, comprising the array substrate described herein or fabricated by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
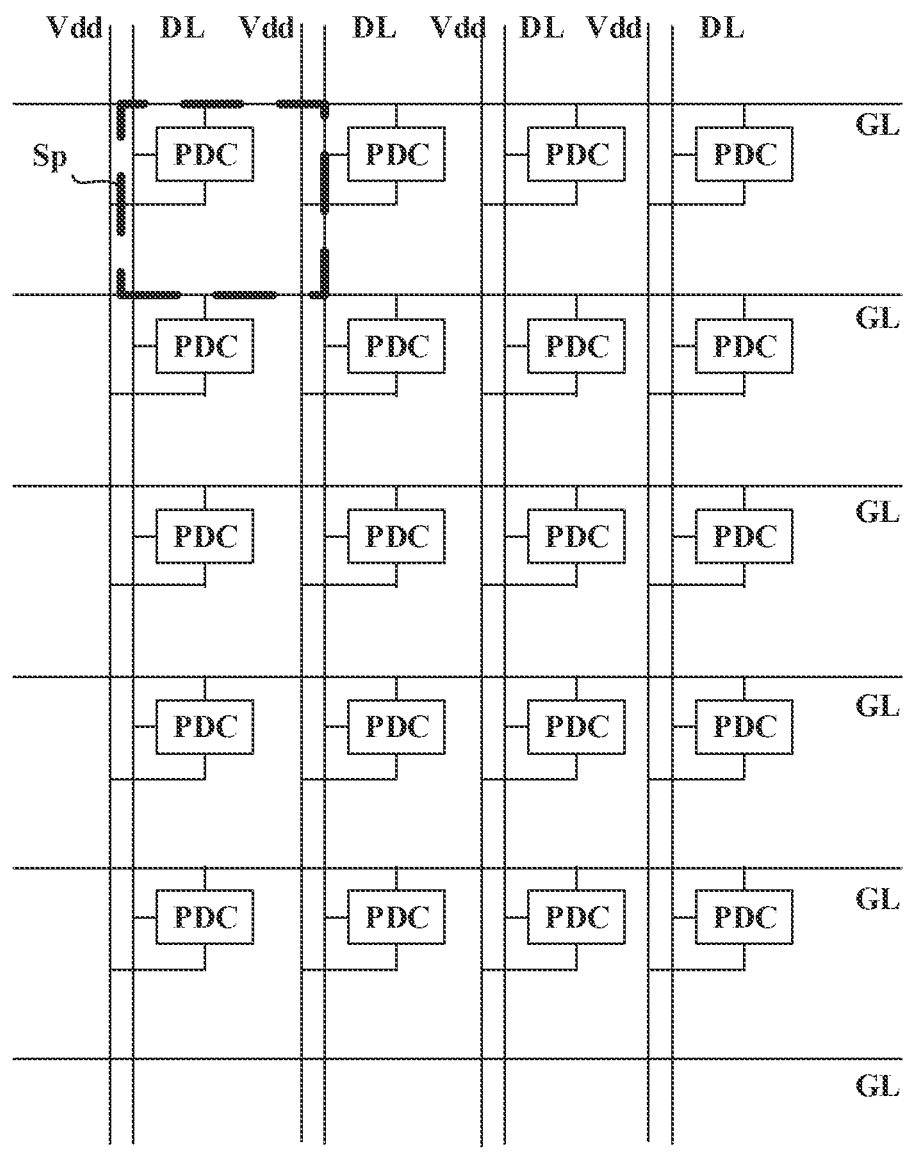
FIG. 1 is a plan view of an array substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a base substrate; a semiconductor material layer on the base substrate; a gate line extending along a first direction; and a plurality of pixel driving circuits respectively in a plurality of subpixels configured to respectively drive a plurality of light emitting elements. Optionally, a respective one of the plurality of pixel driving circuits comprises a driving transistor configured to generate a driving current for driving a light emitting element to emit light, a data-write transistor configured to write a voltage into a source electrode of the driving transistor, and a compensating transistor. Optionally, the gate line comprises a plurality of wide portions and a plurality of narrow portions respectively arranged along the first direction, the plurality of wide portions having a first dimension greater than a second dimension of the plurality of narrow portions along a second direction, the second direction at an angle in a range of 80 degrees to 100 degrees with respect to the first direction. Optionally, an orthographic projection of a respective one of the plurality of wide portions in the respective subpixel on the base substrate overlaps with an orthographic projection of a portion of the semiconductor material layer in the respective subpixel on the base substrate, forming an active layer of the data-write transistor in the respective subpixel. Optionally, a ratio of a channel length to a channel width of the active layer of the data-write transistor is in a range of 1.5:1 to 3:1.

In some embodiments, the array substrate includes a plurality of pixel driving circuits respectively in a plurality of subpixels configured to respectively drive a plurality of light emitting elements. In some embodiments, a respective one of the plurality of pixel driving circuits includes a plurality of transistors, and a storage capacitor including a first capacitor electrode, a second capacitor electrode electrically connected to a respective voltage supply line, and an insulating layer between the first capacitor electrode and the second capacitor electrode. In some embodiments, the array substrate includes a semiconductor material layer on a base substrate; a node connecting line in a same layer as the respective voltage supply line, connected to the first capacitor electrode through a first main via, and connected to the semiconductor material layer through a second main via. Optionally, the plurality of subpixels includes a first subpixel configured to emit a light of a first color; a second subpixel configured to emit a light of a second color; a third subpixel configured to emit a light of a third color; and a fourth subpixel configured to emit a light of the second color. Optionally, percentages of orthographic projections of a first respective node connecting line in the first subpixel, a second respective node connecting line in the second subpixel, a third respective node connecting line in the third subpixel, and a fourth respective node connecting line in the fourth subpixel on the base substrate respectively covered by orthographic projections of a first anode of a first light emitting element in the first subpixel, a second anode of a second light emitting element in the second subpixel, a third anode of a third light emitting element in the third subpixel, and a fourth anode of a fourth light emitting element in the fourth subpixel on the base substrate are within 20% of each other.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a pixel driving circuit PDC. The array substrate includes a gate line GL, a data line DL, a voltage supply line (e.g., a high voltage supply line Vdd), and a second voltage supply line (e.g., a low voltage supply line Vss), each of which electrically is connected to the pixel driving circuit PDC. Light emission in a respective one of the subpixels Sp is driven by a pixel driving circuit PDC. In one example, a high voltage signal (e.g., a VDD signal) is input, through the high voltage supply line Vdd, to the pixel driving circuit PDC connected to an anode of the light emitting element; a low voltage signal (e.g., a VSS signal) is input, through a low voltage supply line Vss, to a cathode of the light emitting element. A voltage difference between the high voltage signal (e.g., the VDD signal) and the low voltage signal (e.g., the VSS signal) is a driving voltage $\Delta V$ that drives light emission in the light emitting element.

Various appropriate pixel driving circuits may be used in the present array substrate. Examples of appropriate driving circuits include 3T1C, 2T1C, 4T1C, 4T2C, 5T2C, 6T1C, 7T1C, 7T2C and 8T2C. In some embodiments, the respective one of the plurality of pixel driving circuits is a 7T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 2:
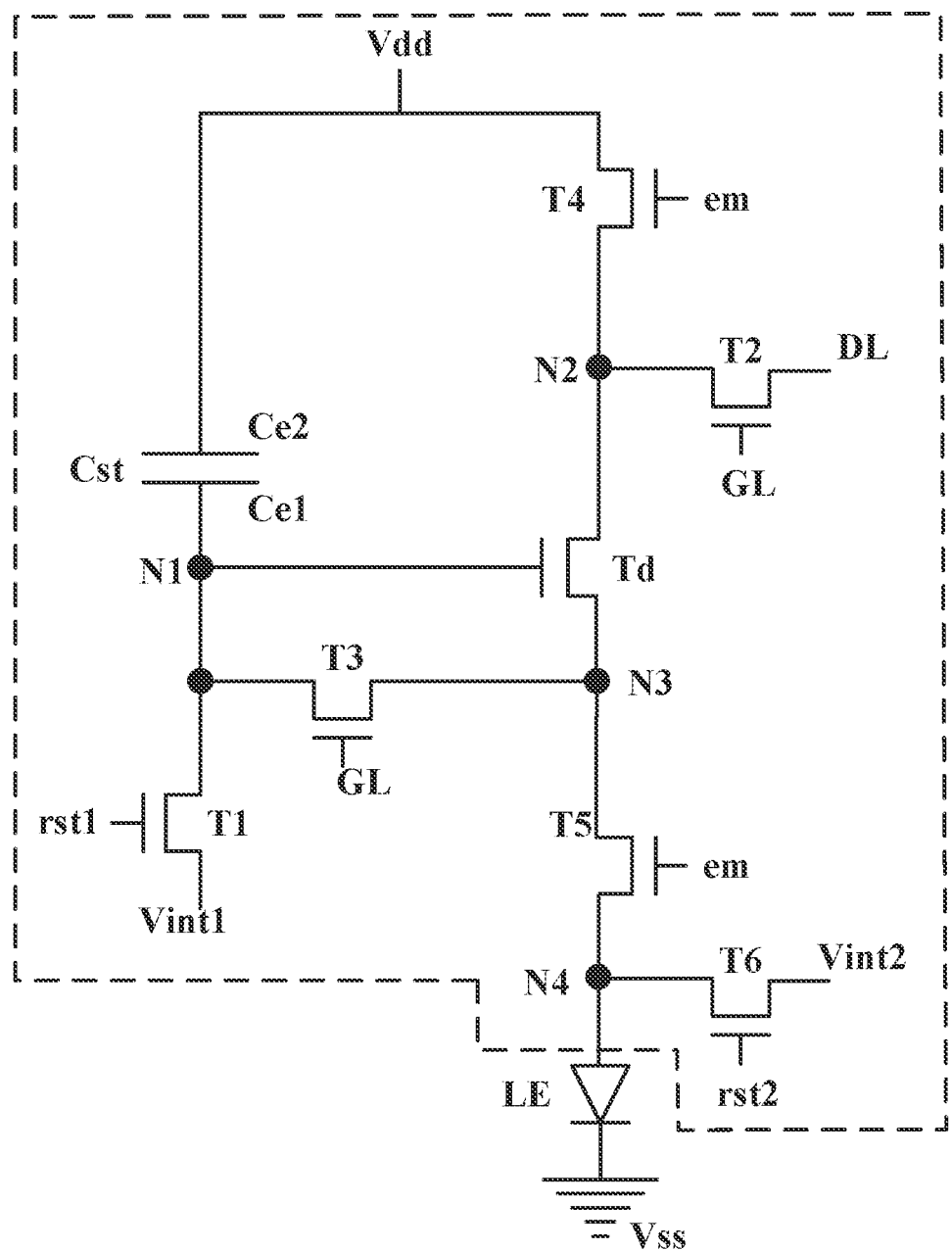
FIG. 2 is a circuit diagram illustrating the structure of a pixel driving circuit in some embodiments according to the present disclosure.

FIG. 2 is a circuit diagram illustrating the structure of a pixel driving circuit in some embodiments according to the present disclosure. Referring to FIG. 2, in some embodiments, the pixel driving circuit includes a driving transistor Td; a storage capacitor Cst having a first capacitor electrode Ce1 and a second capacitor electrode Ce2; a first transistor T1 having a gate electrode connected to a first reset control signal line rst1, a source electrode connected to a first reset signal line Vint1, and a drain electrode connected to a first capacitor electrode Ce1 of the storage capacitor Cst and a gate electrode of the driving transistor Td; a second transistor T2 having a gate electrode connected to a gate line GL, a source electrode connected to the data line DL, and a drain electrode connected to a source electrode of the driving transistor Td; a third transistor T3 having a gate electrode connected to the gate line GE, a source electrode connected to the first capacitor electrode Ce1 of the storage capacitor Cst and the gate electrode of the driving transistor Td, and a drain electrode connected to a drain electrode of the driving transistor Td; a fourth transistor T4 having a gate electrode connected to a light emitting control signal line em, a source electrode connected to the voltage supply line Vdd, and a drain electrode connected to the source electrode of the driving transistor Td and the drain electrode of the second transistor T2, a fifth transistor T5 having a gate electrode connected to the light emitting control signal line em, a source electrode connected to drain electrodes of the driving transistor Td and the third transistor T3, and a drain electrode connected to an anode of a light emitting element LE; and a sixth transistor T6 having a gate electrode connected to a second reset control signal line rst2, a source electrode connected to a second reset signal line Vint2, and a drain electrode connected to the drain electrode of the fifth transistor and the anode of the light emitting element LE. The second capacitor electrode Ce2 is connected to the voltage supply line Vdd and the source electrode of the fourth transistor T4.

The pixel driving circuit further include a first node N1, a second node N2, a third node N3, and a fourth node N4. The first node N1 is connected to the gate electrode of the driving transistor Td, the first capacitor electrode Ce1, and the source electrode of the third transistor T3. The second node N2 is connected to the drain electrode of the fourth transistor T4, the drain electrode of the second transistor T2, and the source electrode of the driving transistor Td. The third node N3 is connected to the drain electrode of the driving transistor Id, the drain electrode of the third transistor T3, and the source electrode of the fifth transistor T5. The fourth node N4 is connected to the drain electrode of the fifth transistor T5, the drain electrode of the sixth transistor T6, and the anode of the light emitting element LE.

Figure 3:
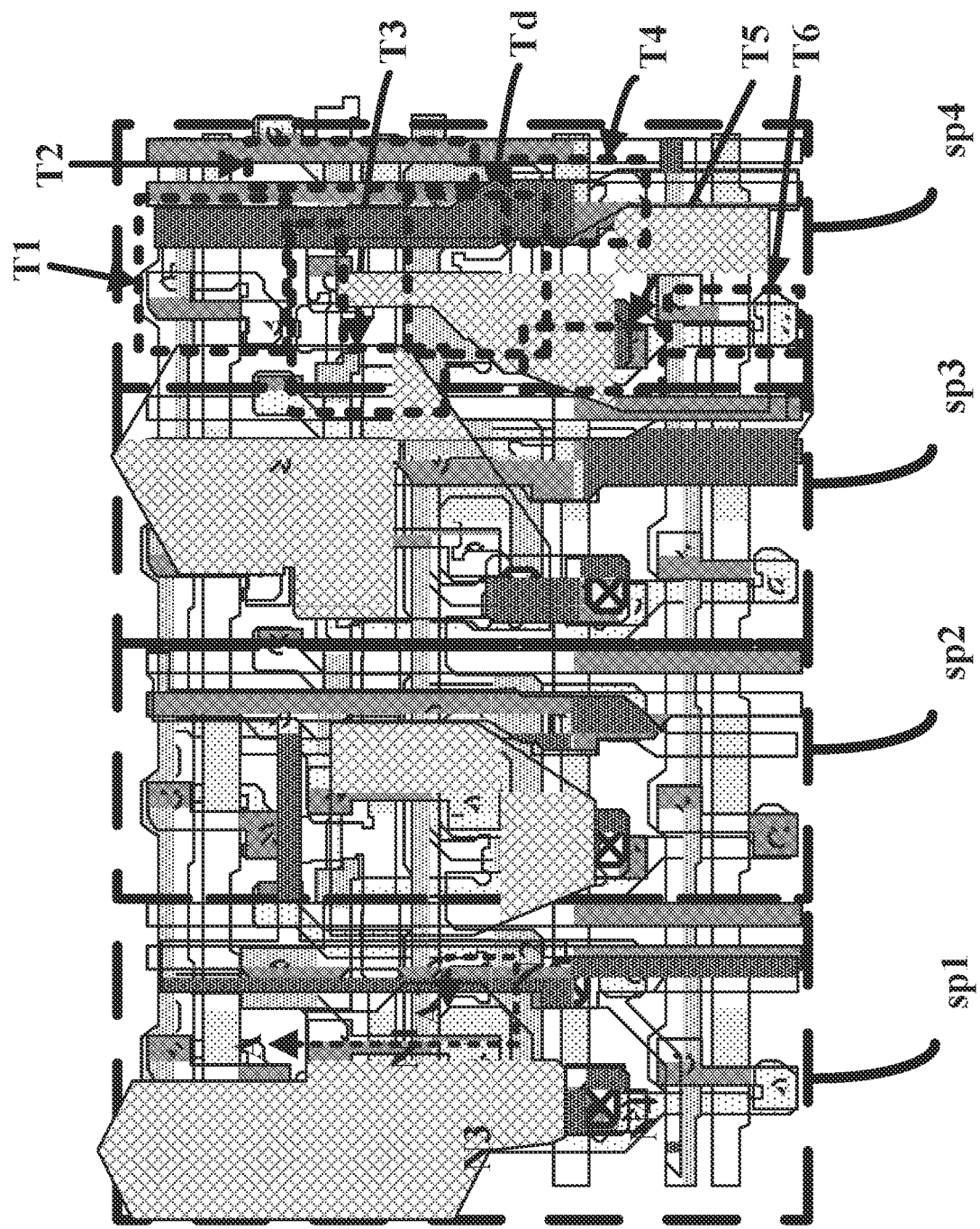
FIG. 3 is a diagram illustrating the structure of a plurality of subpixels of an array substrate in some embodiments according to the present disclosure.

FIG. 3 is a diagram illustrating the structure of a plurality of subpixels of an array substrate in some embodiments according to the present disclosure. Referring to FIG. 3, the array substrate in some embodiments includes a plurality of subpixels. In some embodiments, the plurality of subpixels includes a first subpixel sp1, a second subpixel sp2, a third subpixel sp3, and a fourth subpixel sp4. The plurality of subpixels in the array substrate are arranged in an array. In one example, the array of the plurality of subpixels includes a S1-S2-S3-S4 format repeating array, in which S1 stands for the first subpixel sp1, S2 stands for the second subpixel sp2, S3 stands for the third subpixel sp3, and S4 stands for the fourth subpixel sp4. In another example, the S1-S2-S3-S4 format is a C1-C2-C3-C2' format, in which C1 stands for the first subpixel sp1 of a first color, C2 stands for the second subpixel sp2 of a second color, C3 stands for the third subpixel sp3 of a third color, and C2' stands for the fourth subpixel sp4 of the second color. In another example, the C1-C2-C3-C2' format is a R-G-B-G format, in which the first subpixel sp1 is a red subpixel, the second subpixel sp2 is a green subpixel, the third subpixel sp3 is a blue subpixel, and the fourth subpixel sp4 is a green subpixel.

Figure 4:
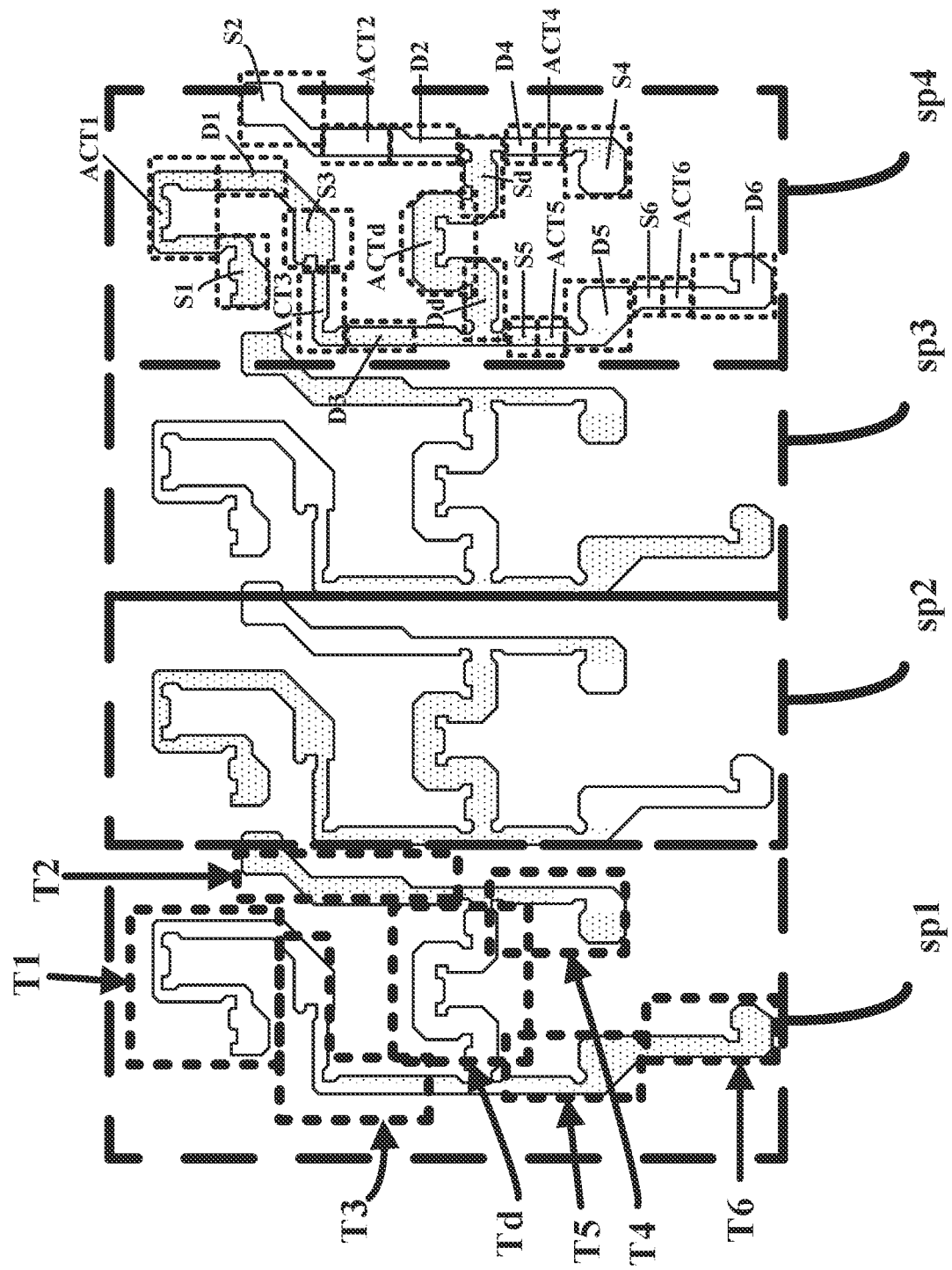
FIG. 4 is a diagram illustrating the structure of a semiconductor material layer in a plurality of subpixels of an array substrate depicted in FIG. 3.
Figure 5:
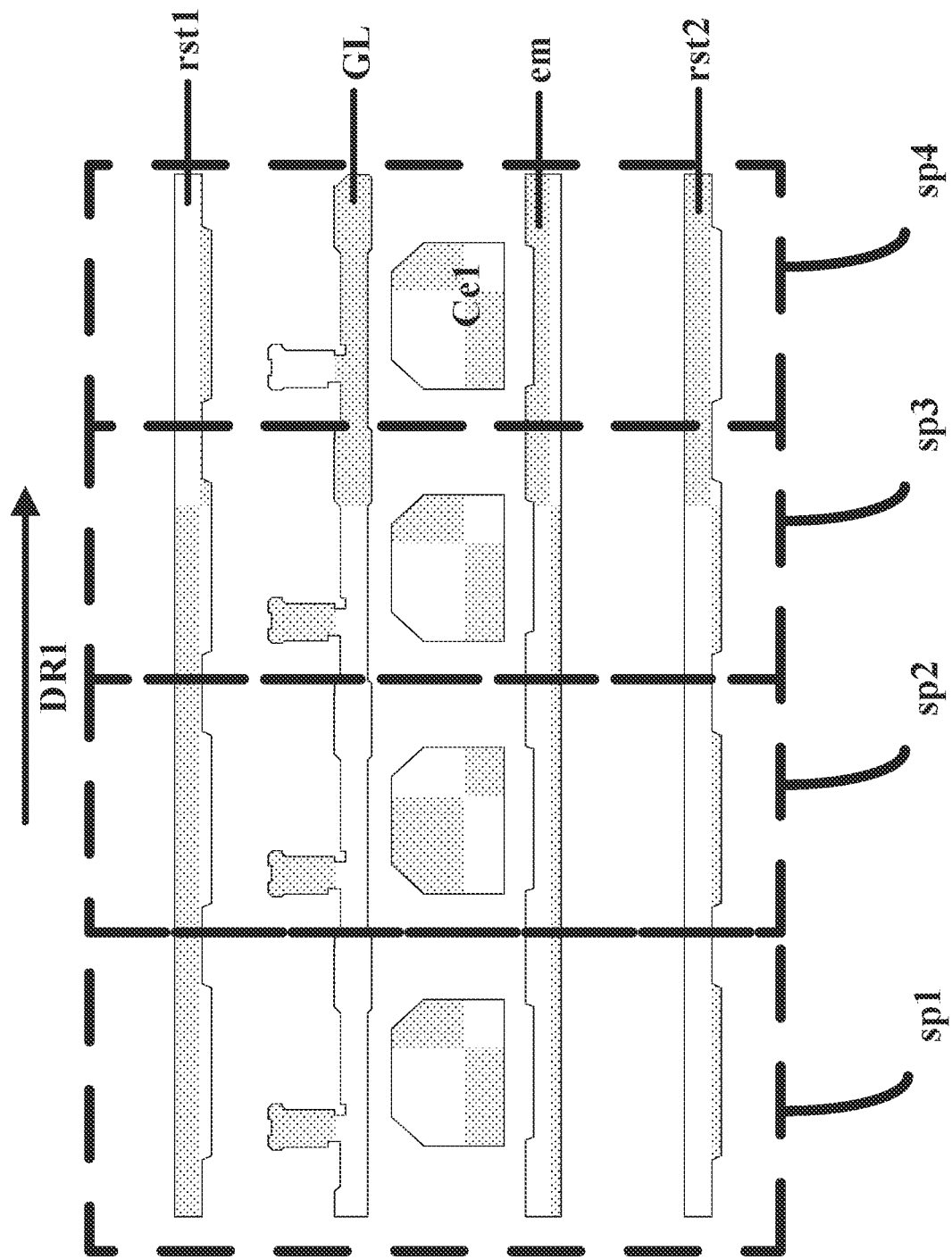
FIG. 5 is a diagram illustrating the structure of a first conductive layer in a plurality of subpixels of an array substrate depicted in FIG. 3.
Figure 6:
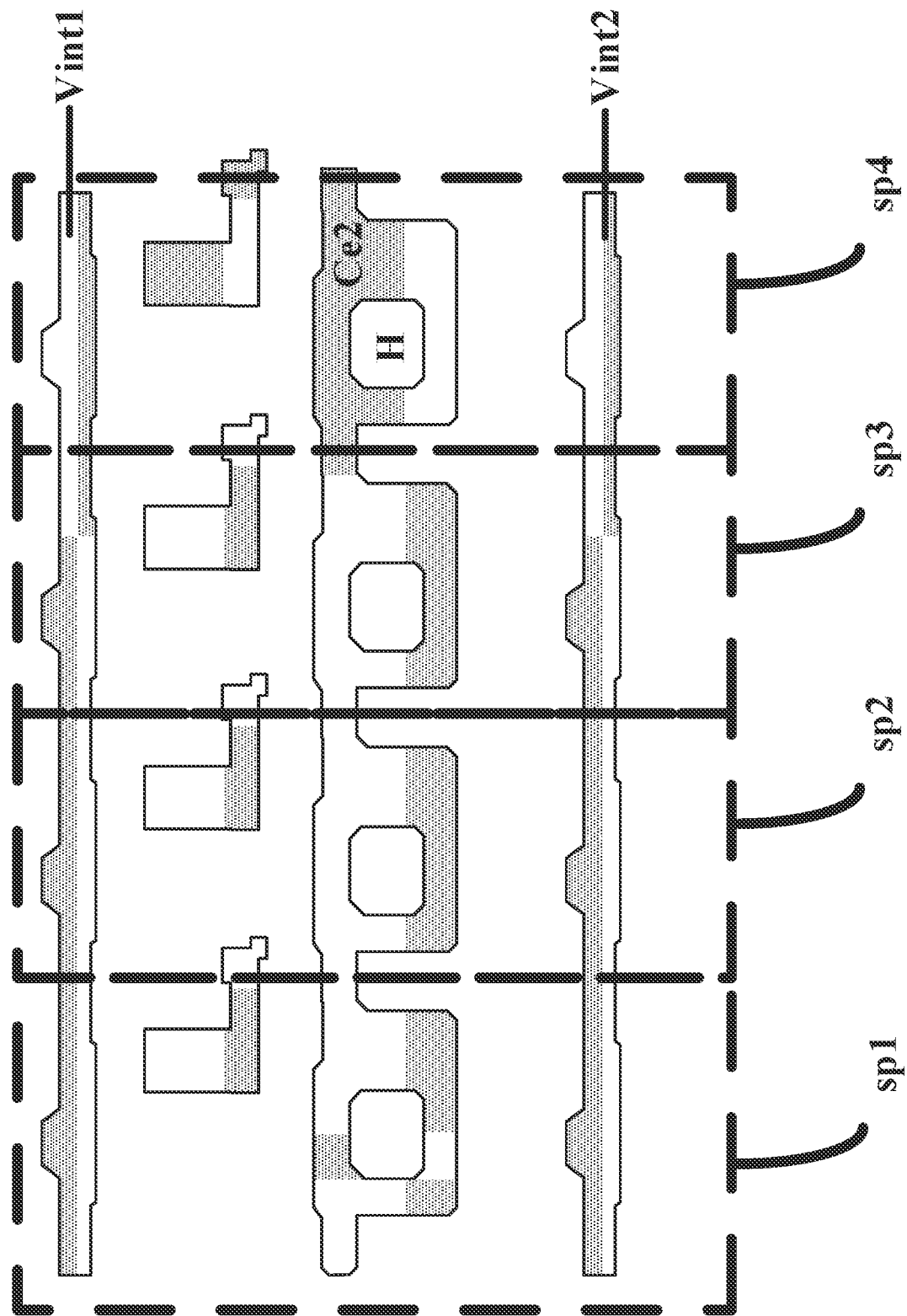
FIG. 6 is a diagram illustrating the structure of a second conductive layer in a plurality of subpixels of an array substrate depicted in FIG. 3.
Figure 7:
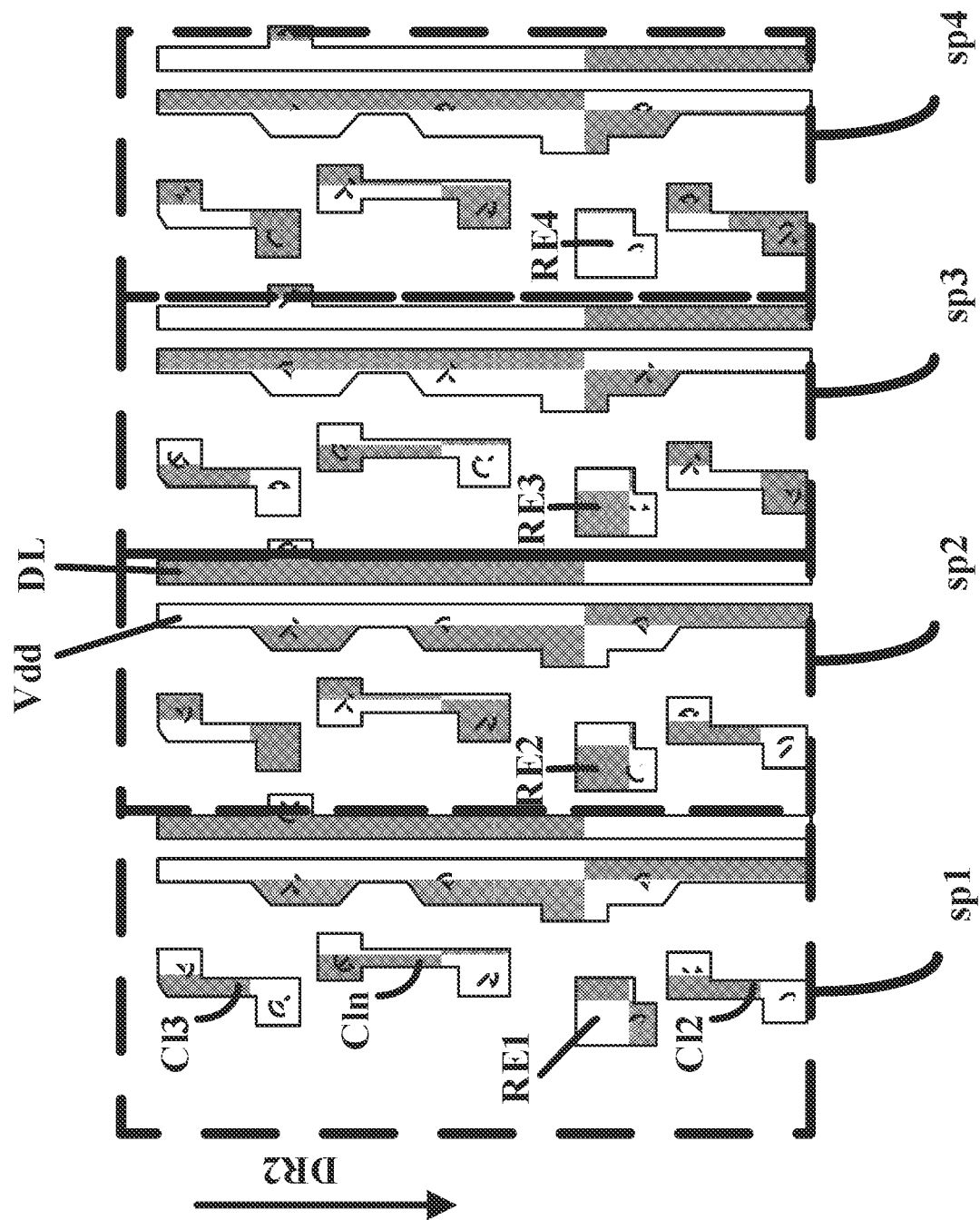
FIG. 7 is a diagram illustrating the structure of a first signal line layer in a plurality of subpixels of an array substrate depicted in FIG. 3.
Figure 8:
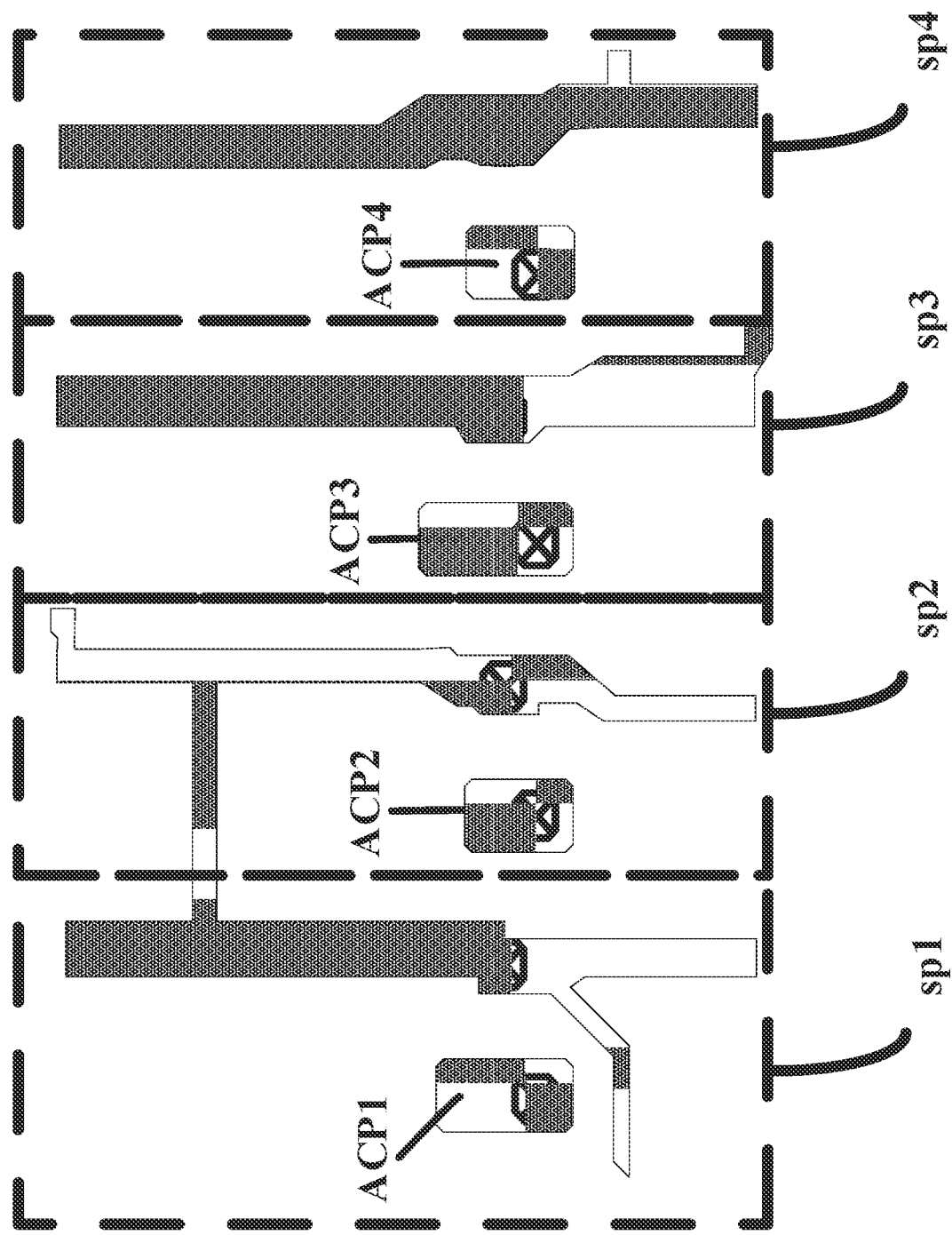
FIG. 8 is a diagram illustrating the structure of a second signal line layer in a plurality of subpixels of an array substrate depicted in FIG. 3.
Figure 9:
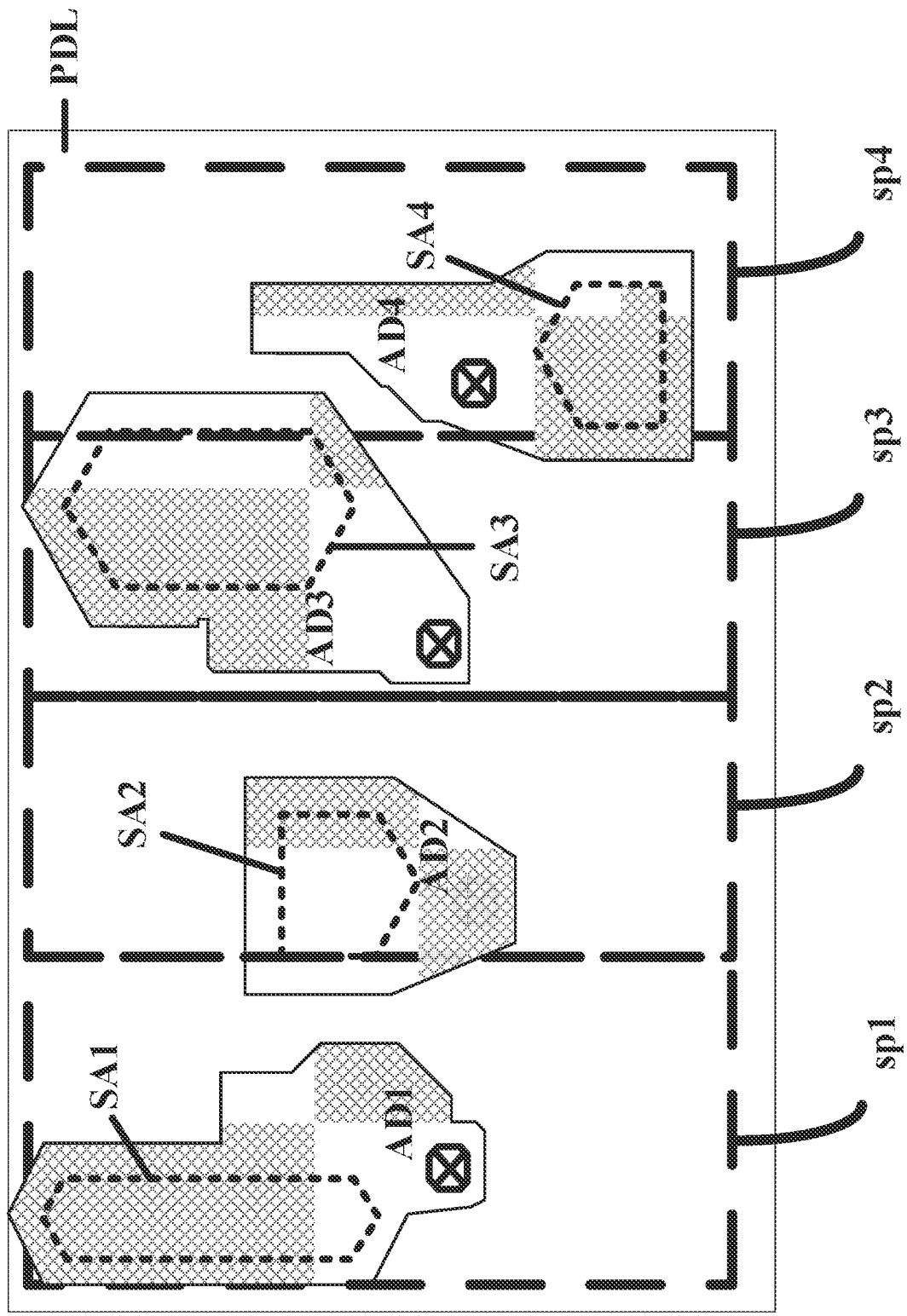
FIG. 9 is a diagram illustrating the structure of a pixel definition layer, and anodes of light emitting elements in a plurality of subpixels of an array substrate depicted in FIG. 3.
Figure 10:
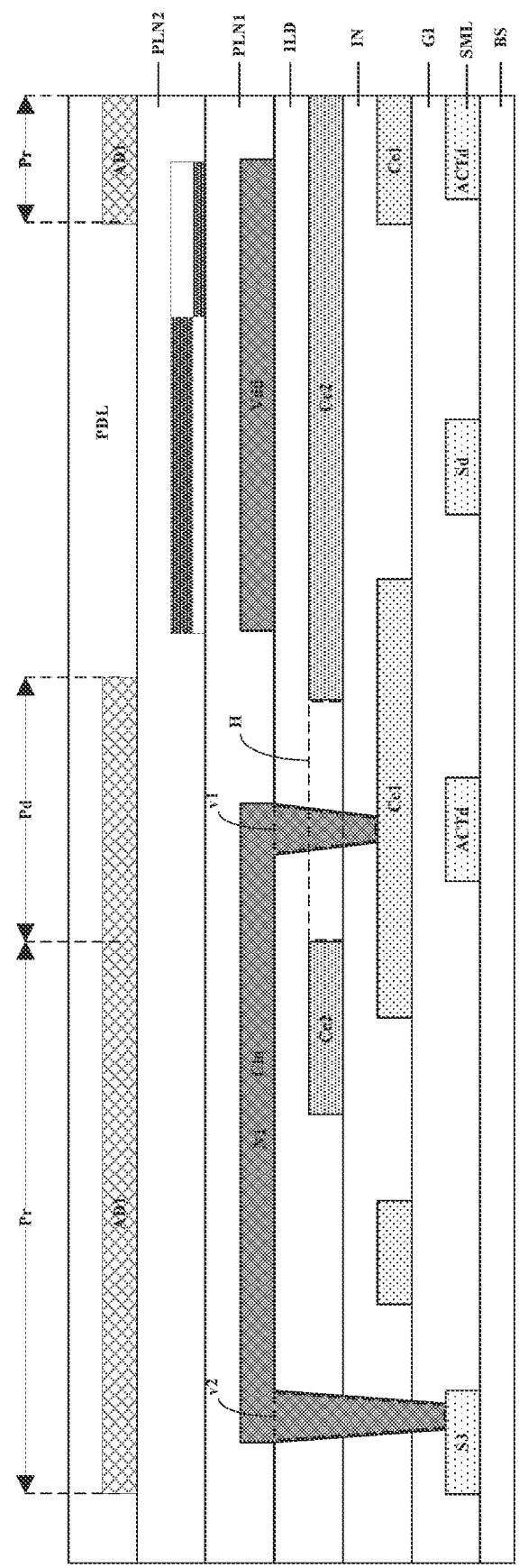
FIG. 10 is a cross-sectional view along an A-A' line in FIG. 3.

FIG. 4 is a diagram illustrating the structure of a semiconductor material layer in a plurality of subpixels of an array substrate depicted in FIG. 3. FIG. 5 is a diagram illustrating the structure of a first conductive layer in a plurality of subpixels of an array substrate depicted in FIG. 3. FIG. 6 is a diagram illustrating the structure of a second conductive layer in a plurality of subpixels of an array substrate depicted in FIG. 3. FIG. 7 is a diagram illustrating the structure of a first signal line layer in a plurality of subpixels of an array substrate depicted in FIG. 3. FIG. 8 is a diagram illustrating the structure of a second signal line layer in a plurality of subpixels of an array substrate depicted in FIG. 3. FIG. 9 is a diagram illustrating the structure of a pixel definition layer, and anodes of light emitting elements in a plurality of subpixels of an array substrate depicted in FIG. 3. FIG. 10 is a cross-sectional view along an A-A' line in FIG. 3, Referring to FIG. 3 to FIG. 10, in some embodiments, the array substrate includes a base substrate BS, a semiconductor material layer SML on the base substrate BS, a gate insulating layer GI on a side of the semiconductor material layer SW, away from the base substrate BS, a first conductive layer on a side of the gate insulating layer GI away from the semiconductor material layer SML, an insulating layer IN on a side of the first conductive layer away from the gate insulating layer GI, a second conductive layer on a side of the insulating layer IN away from the first conductive layer, an inter-layer dielectric layer ILD on a side of the second conductive layer away from the insulating layer IN, a first signal line layer on a side of the inter-layer dielectric layer ILD away from the second conductive layer, a first planarization layer PLN1 on a side of the first signal line layer away from the inter-layer dielectric layer ILD; a second signal line layer on a side of the first planarization layer PLN1 away from the inter-layer dielectric layer ILD; a second planarization layer PLN2 on a side of the second signal line layer away from the first planarization layer PLN1, and anodes on a side of the second planarization layer PLN2 away from the first planarization layer PLN1.

Referring to FIG. 3, each of the first subpixel sp1, the second subpixel sp2, the third subpixel sp3, and the fourth subpixel sp4, includes the first transistor T1, the second transistor T2, the third transistor T3, the fourth transistor T4, the fifth transistor T5, the sixth transistor T6, and the driving transistor Td.

Referring to FIG. 2, FIG. 3, and FIG. 4, in some embodiments, in each subpixel, the semiconductor material layer has a unitary structure. In FIG. 4, the first subpixel Sp1 on the left is annotated with labels indicating regions corresponding to the plurality of transistors in the pixel driving circuit, including the first transistor T1, the second transistor T2, the third transistor T3, the fourth transistor T4, the fifth transistor T5, the sixth transistor T6, and the driving transistor Td. In FIG. 4, the fourth subpixel Sp4 on the right is annotated with labels indicating components of each of the plurality of transistors in the pixel driving circuit. For example, the first transistor T1 includes an active layer ACT1, a source electrode S1, and a drain electrode D1. The second transistor T2 includes an active layer ACT2, a source electrode S2, and a drain electrode D2. The third transistor T3 includes an active layer ACT3, a source electrode S3, and a drain electrode D3. The fourth transistor T4 includes an active layer ACT4, a source electrode S4, and a drain electrode D4. The fifth transistor T5 includes an active layer ACT5, a source electrode S5, and a drain electrode D5. The sixth transistor T6 includes an active layer ACT6, a source electrode S6, and a drain electrode D6. The driving transistor Td includes an active layer ACTd, a source electrode Sd, and a drain electrode Dd. In one example, the active layers (ACT1, ACT2, ACT3, ACT4, ACT5, ACT6 and ACTd), the source electrodes (S1, S2, S3, S4, S5, S6, and Sd), and the drain electrodes (D1, D2, D3, D4, D5, D6, and Dd) of the transistors (T1, T2, T3, T4, T5, T6, and Td) in a respective subpixel are parts of a unitary structure in the respective subpixel. In another example, the active layers (ACT1, ACT2, ACT3, ACT4, ACT5, ACT6, and ACTd), the source electrodes (S1, S2, S3, S4, S5, S6, and Sd), and the drain electrodes (D1, D2, D3, D4, D5, D6, and Dd) of the transistors (T1, T2, T3, T4, T5, T6, and Td) are in a same layer.

As used herein, the active layer refers to a component of the transistor comprising at least a portion of the semiconductor material layer whose orthographic projection on the base substrate overlaps with an orthographic projection of a gate electrode on the base substrate. As used herein, a source electrode refers to a component of the transistor connected to one side of the active layer, and a drain electrode refers to a component of the transistor connected to another side of the active layer. In the context of a double-gate type transistor (for example, the third transistor T3), the active layer refers to a component of the transistor comprising a first portion of the semiconductor material layer whose orthographic projection on the base substrate overlaps with an orthographic projection of a first gate on the base substrate, a second portion of the semiconductor material layer whose orthographic projection on the base substrate overlaps with an orthographic projection of a second gate on the base substrate, and a third portion between the first portion and the second portion. In the context of a double-gate type transistor, a source electrode refers to a component of the transistor connected to a side of the first portion distal to the third portion, and a drain electrode refers to a component of the transistor connected to a side of the second portion distal to the third portion.

Referring to FIG. 2, FIG. 3, FIG. 5, and FIG. 10, the first conductive layer in some embodiments includes a gate line GL, a first reset control signal line rst1, a light emitting control signal line em, a second reset control signal line rst2, and a first capacitor electrode Ce1 of the storage capacitor Cst. Various appropriate electrode materials and various appropriate fabricating methods may be used to make the first conductive layer. For example, a conductive material may be deposited on the substrate by a plasma-enhanced chemical vapor deposition (PECVD) process and patterned. Examples of appropriate conductive materials for making the first conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the gate line GL, the first reset control signal line rst1, the light emitting control signal line em, the second reset control signal line rst2, and the first capacitor electrode Ce1 are in a same layer. As shown in FIG. 5, the gate line GL, the first reset control signal line rst1, the light emitting control signal line em, and the second reset control signal line rst2 respectively extend along a first direction DR1.

As used herein, the term "same layer" refers to the relationship between the layers simultaneously formed in the same step. In one example, the gate line GL and the first capacitor electrode Ce1 are in a same layer when they are formed as a result of one or more steps of a same patterning process performed in a same layer of material. In another example, the gate line GL and the first capacitor electrode Ce1 can be formed in a same layer by simultaneously performing the step of forming the gate line GL, and the step of forming the first capacitor electrode Ce1. The term "same layer" does not always mean that the thickness of the layer or the height of the layer in a cross-sectional view is the same.

Referring to FIG. 2, FIG. 3, FIG. 6, and FIG. 10, the second conductive layer in some embodiments includes a first reset signal line Vint1, a second capacitor electrode Ce1 of the storage capacitor Cst and a second reset signal line Vint2. Various appropriate conductive materials and various appropriate fabricating methods may be used to make the second conductive layer. For example, a conductive material may be deposited on the substrate by a plasma-enhanced chemical vapor deposition (PECVD) process and patterned. Examples of appropriate conductive materials for making the second conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the first reset signal line Vint1, the second reset signal line Vint2, and the second capacitor electrode Ce2 are in a same layer.

Referring to FIG. 2, FIG. 3, FIG. 7, and FIG. 10, the first signal line layer in some embodiments includes a voltage supply line Vdd, a data line DL, a node connecting line Cl1, a second connecting line Cl2, and a third connecting line Cl3. The node connecting line Cln connects the first capacitor electrode Ce1 and the source electrode of the third transistor T3 in a respective subpixel together. The second connecting line Cl2 connects the second reset signal line Vint2 and the source electrode of the sixth transistor T6 in a respective subpixel together. The third connecting line Cl3 connects the first reset signal line Vint1 and the source electrode of the first transistor T1 in a respective subpixel together. The first signal line layer in some embodiments further includes a first relay electrode RE1 in the first subpixel sp1, a second relay electrode RE2 in the second subpixel sp2, a third relay electrode RE3 in the third subpixel sp3, and a fourth relay electrode RE4 in the fourth subpixel sp4. These relay electrodes respectively connect sources electrodes of fifth transistors respectively in the first subpixel sp1, the second subpixel sp2, the third subpixel sp3, and the fourth subpixel sp4, to anode contact pads respectively in the first subpixel sp1, the second subpixel sp2, the third subpixel sp3, and the fourth subpixel sp4. Various appropriate conductive materials and various appropriate fabricating methods may be used to make the first signal line layer. For example, a conductive material may be deposited on the substrate by a plasma-enhanced chemical vapor deposition (PECVD) process and patterned. Examples of appropriate conductive materials for making the first signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the voltage supply line Vdd, the data line DL, the node connecting line Cl1, the second connecting line Cl2, and the third connecting line Cl3 are in a same layer. As shown in FIG. 7, the voltage supply line Vdd and the data line DL respectively extend along a second direction DR2.

Referring to FIG. 2, FIG. 3, FIG. 8, and FIG. 10, the second signal line layer in some embodiments includes a first anode contact pad ACP1 in the first subpixel sp1, a second anode contact pad ACP2 in the second subpixel sp2, a third anode contact pad ACP3 in the third subpixel sp3, and a fourth anode contact pad ACP4 in the fourth subpixel sp4. These anode contact pads respectively connects relay electrodes (e.g., the first relay electrode RE1, the second relay electrode RE2, the third relay electrode RE3, and the fourth relay electrode RE4 depicted in FIG. 7) to anodes respectively in the first subpixel sp1, the second subpixel sp2, the third subpixel sp3, and the fourth subpixel sp4. Various appropriate conductive materials and various appropriate fabricating methods may be used to make the second signal line layer. For example, a conductive material may be deposited on the substrate by a plasma-enhanced chemical vapor deposition (PECVD) process and patterned. Examples of appropriate conductive materials for making the second signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the first anode contact pad ACP1, the second anode contact pad ACP2, the third anode contact pad ACP3, and the fourth anode contact pad ACP4 are in a same layer.

Referring to FIG. 2, FIG. 3, FIG. 9, and FIG. 10, the array substrate in some embodiments includes a first anode AD1 in the first subpixel sp1, a second anode AD2 in the second subpixel sp2, a third anode AD3 in the third subpixel sp3, and a fourth anode AD4 in the fourth subpixel sp4. The first anode AD1, the second anode AD2, the third anode AD3, and the fourth anode AD4, are respectively anodes of a first light emitting element, a second light emitting element, a third light emitting element, and a fourth light emitting element, respectively in the first subpixel sp1, the second subpixel sp2, the third subpixel sp3, and the fourth subpixel sp4. The array substrate in some embodiments further includes a pixel definition layer PDL on a side of the first anode AD1, the second anode AD2, the third anode AD3, and the fourth anode AD4 away from the second planarization layer PLN2. The array substrate further includes a first subpixel aperture SA1, a second subpixel aperture SA2, a third subpixel aperture SA3, a fourth subpixel aperture SA4 respectively extending through the pixel definition layer PDL.

Referring to FIG. 2, FIG. 3, FIG. 5, FIG. 6, and FIG. 10, in some embodiments, an orthographic projection of the second capacitor electrode Ce2 on a base substrate BS completely covers, with a margin, an orthographic projection of the first capacitor electrode Ce1 on the base substrate BS except for a hole region H in which a portion of the second capacitor electrode Ce2 is absent.

Figure 11:
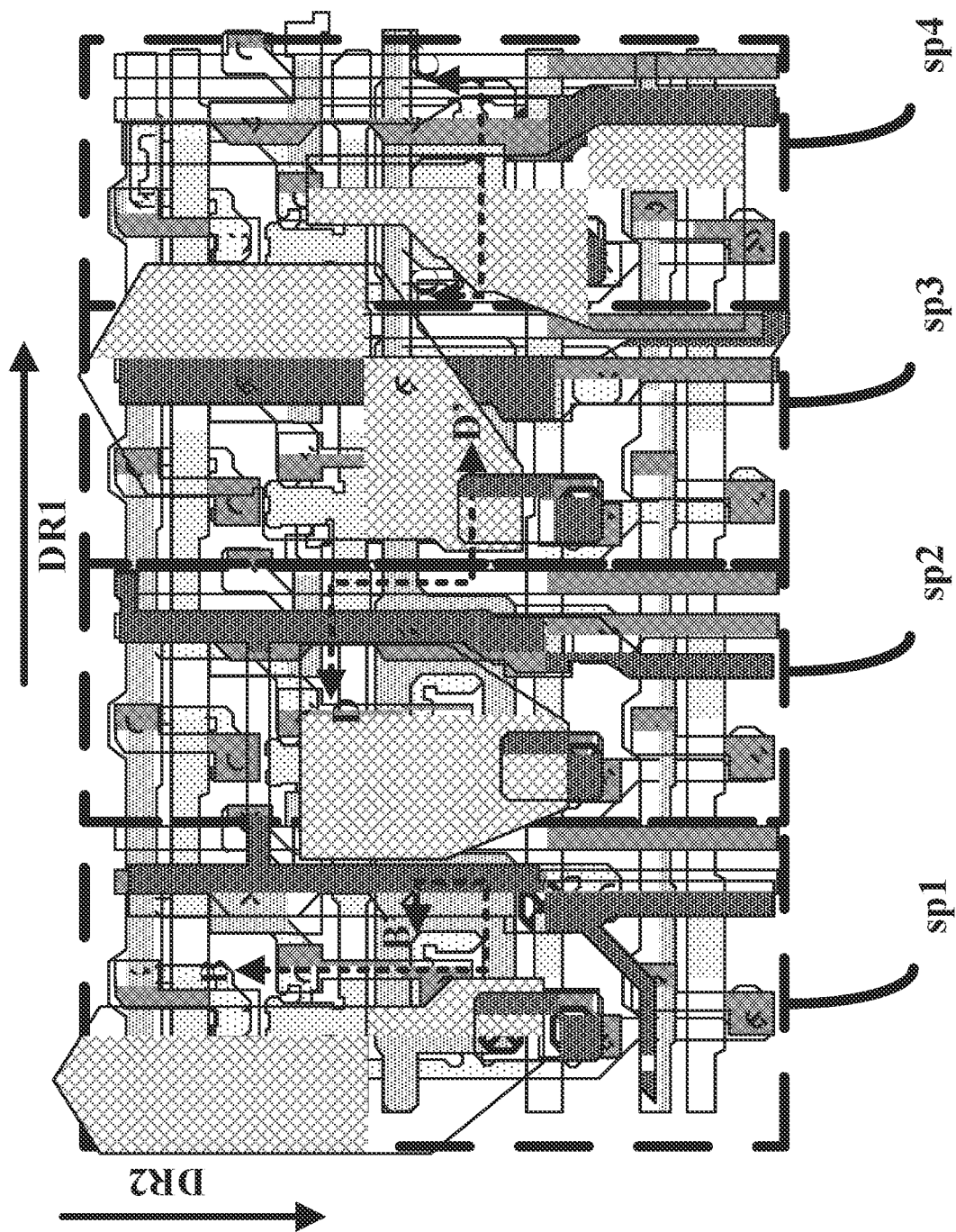
FIG. 11 is a diagram illustrating the structure of a plurality of subpixels of an array substrate in some embodiments according to the present disclosure.
Figure 12:
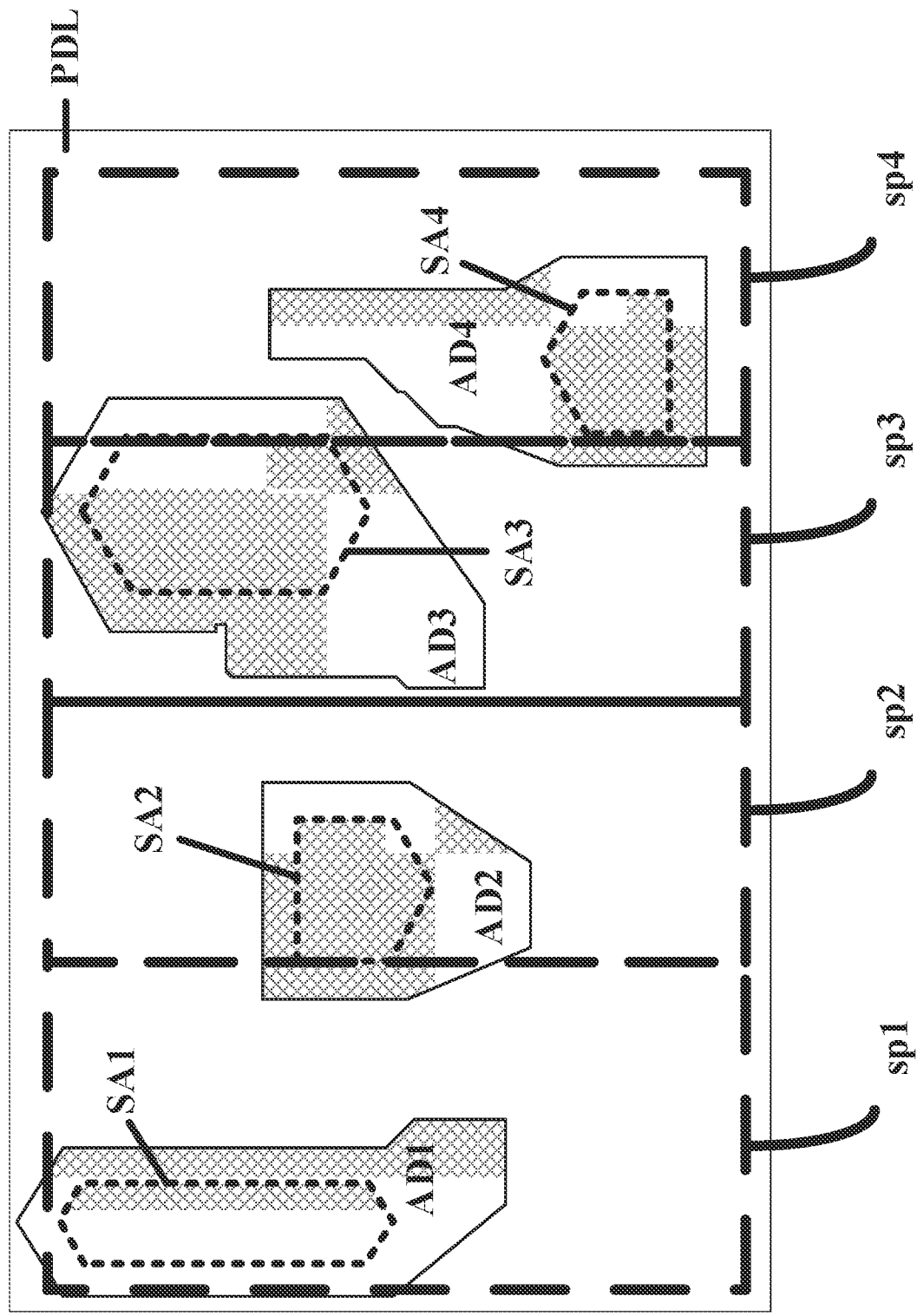
FIG. 12 is a diagram illustrating the structure of a pixel definition layer, and anodes of light emitting elements in a plurality of subpixels of an array substrate depicted in FIG. 11.
Figure 13:
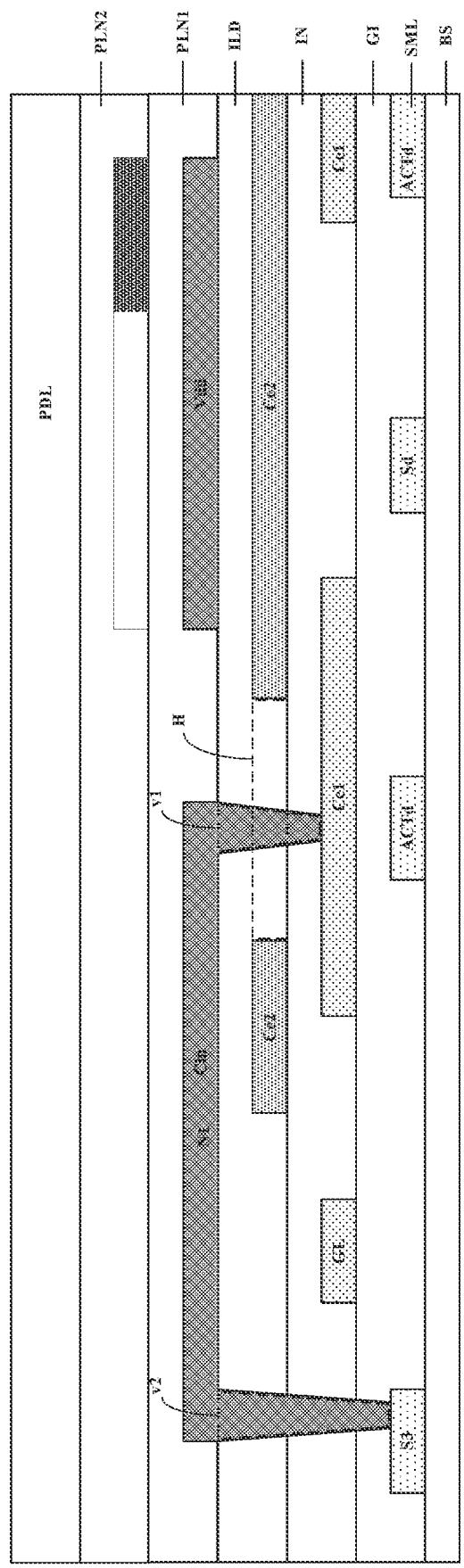
FIG. 13 is a cross-sectional view along a B-B' line in FIG. 11.

FIG. 11 is a diagram illustrating the structure of a plurality of subpixels of an array substrate in some embodiments according to the present disclosure. FIG. 12 is a diagram illustrating the structure of a pixel definition layer, and anodes of light emitting elements in a plurality of subpixels of an array substrate depicted in FIG. 11. FIG. 13 is a cross-sectional view along a B-B' line in FIG. 11. Comparing the array substrate in FIG. 11 with the array substrate in FIG. 3, a main difference between the two array substrates resides in the structure of the first anode of the first light emitting element in the first subpixel sp1. The first anode AD1 in FIG. 12 is smaller than the first anode AD1 in FIG. 9. Comparing the cross section in FIG. 10 with the cross section in FIG. 13, the first anode AD1 in FIG. 10 covers the node connecting line Cl1 whereas the first anode AD1 in FIG. 13 does not.

Figure 14A:
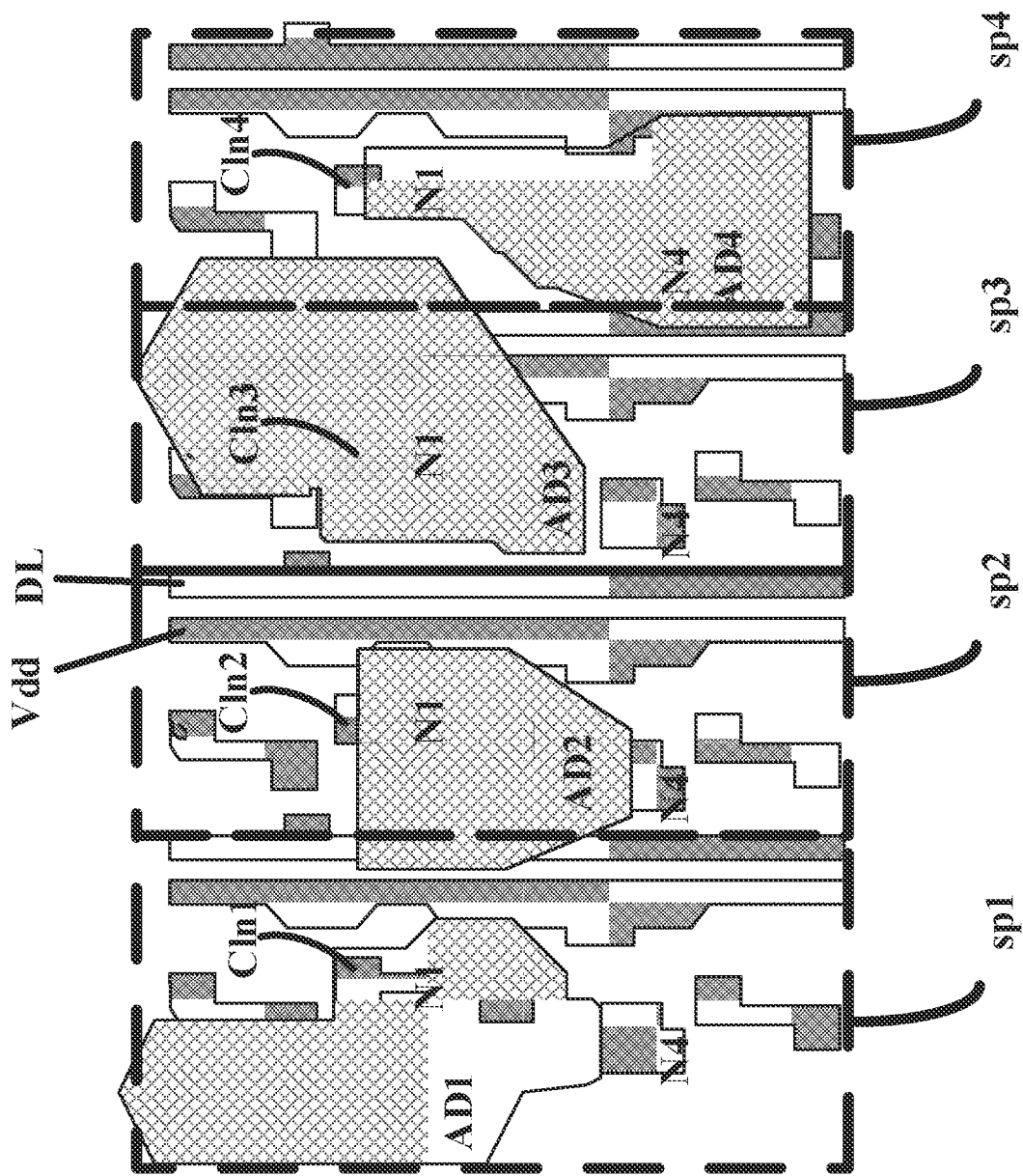
FIG. 14A is a diagram illustrating the structure of anodes and a first signal line layer in an array substrate depicted in FIG. 3.
Figure 15A:
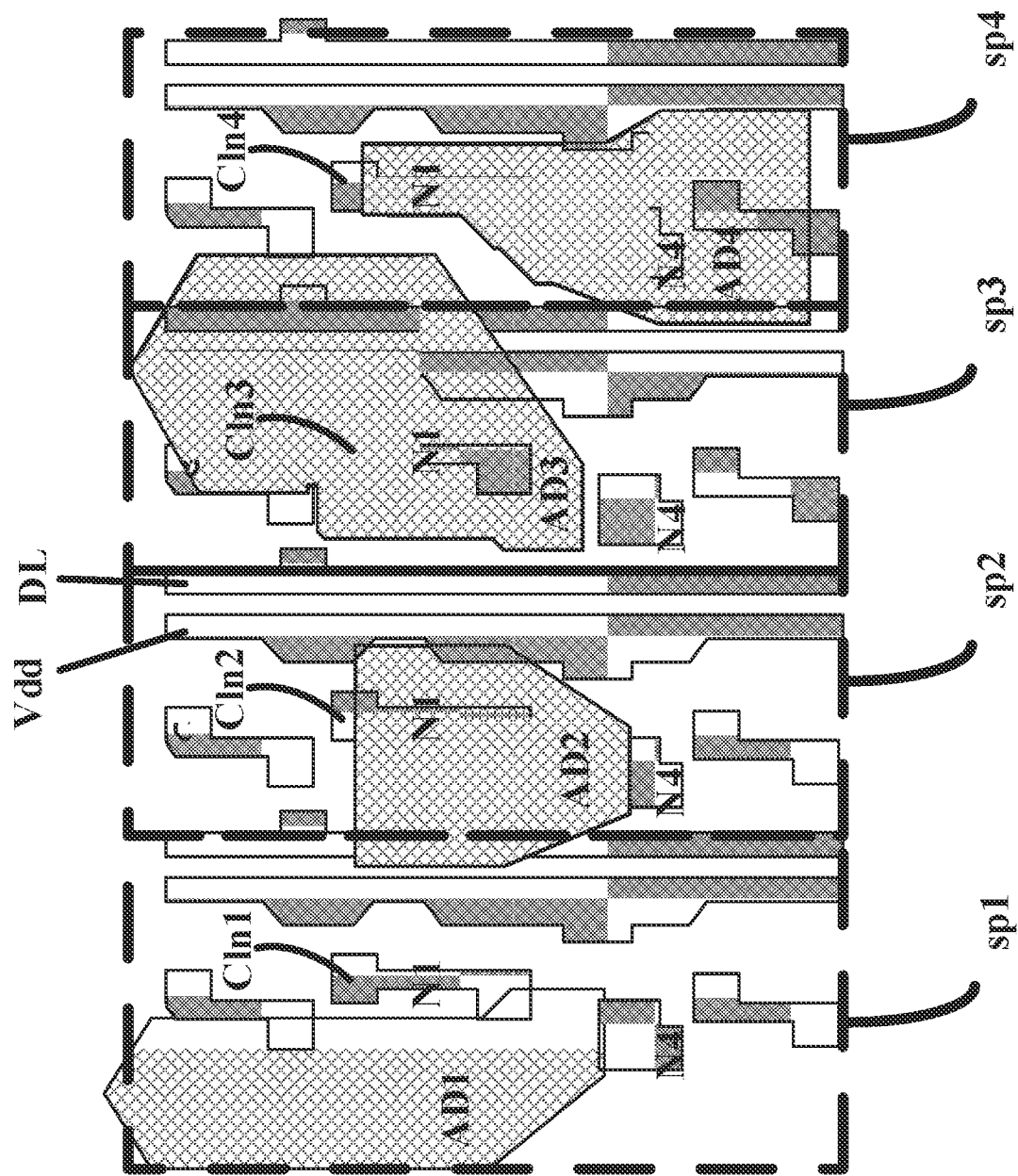
FIG. 15A is a diagram illustrating the structure of anodes and a first signal line layer in an array substrate depicted in FIG. 11.

FIG. 14A is a diagram illustrating the structure of anodes and a first signal line layer in an array substrate depicted in FIG. 3. FIG. 15A is a diagram illustrating the structure of anodes and a first signal line layer in an array substrate depicted in FIG. 11. Referring to FIG. 15A and FIG. 11, an orthographic projection of the second anode AD2 on a base substrate substantially covers an orthographic projection of the second respective node connecting line Cln2 on the base substrate; an orthographic projection of the third anode AD3 on a base substrate substantially covers an orthographic projection of the third respective node connecting line Cln3 on the base substrate; and an orthographic projection of the fourth anode AD4 on a base substrate substantially covers an orthographic projection of the fourth respective node connecting line Cln4 on the base substrate. As used herein, the term "substantially covers" refers to one orthographic projection covers at least 70 percent (e.g., at least 75 percent, at least 80 percent, at least 85 percent, at least 90 percent, at least 95 percent, at least 99 percent, or 100 percent) of another orthographic projection.

Referring to FIG. 11 and FIG. 15A, however, an orthographic projection of the first anode AD1 on a base substrate is substantially non-overlapping with an orthographic projection of the first respective node connecting line Cln1 on the base substrate. As used herein, the term "substantially non-overlapping" refers to two orthographic projections being at least 70 percent (e.g., at least 75 percent, at least 80 percent, at least 85 percent, at least 90 percent, at least 95 percent, at least 99 percent, or 100 percent) non-overlapping.

The inventors of the present disclosure discovers that a parasitic capacitance exists between the first node N1 and the fourth node N4 in the array substrate. The inventors of the present disclosure discovers that, when an orthographic projection of the first node N1 is covered by an orthographic projection of an anode, the parasitic capacitance between the first node N1 and the fourth node N4 is relatively larger. When the orthographic projection of the first node N1 is not covered by the orthographic projection of any anode, the parasitic capacitance between the first node N1 and the fourth node N4 is relatively smaller. The inventors of the present disclosure discovers that, in an array substrate as shown in FIG. 11, the parasitic capacitance between the first node N1 and the fourth node N4 in the first subpixel sp1 is smaller than the counterparts in the second subpixel sp2, the third subpixel sp3, and the fourth subpixel sp4. The inconsistent parasitic capacitances in subpixels result in inconsistent data loading in the subpixels, leading to display defects in a display panel having the array substrate. The problem becomes particularly severe when line width fluctuation and alignment imprecision during a fabrication process are considered.

In one example, the parasitic capacitance between the first node N1 and the fourth node N4 in an array substrate depicted in FIG. 11 may have a designed value of 0.374 fF; the current through the light emitting element may have a designed value of 15.416 pA. Considering the line width fluctuation and alignment imprecision during the fabrication process, the parasitic capacitance between the first node N1 and the fourth node N4 may vary in a range of 0.244 fF to 0.617 fF; and the current through the light emitting element may vary in a range of 15.113 to 15.578 pA. Thus, a ratio of $\Delta I/I$ may vary in a range of −1966% to 1.049%, wherein I stands for the designed value of the current through the light emitting element, and $\Delta I$ stands for a change in the current due to the line width fluctuation and alignment imprecision during the fabrication process. It is discovered in the present disclosure that the change in current becomes more prominent in regions have a lower grayscale value, thus adversely affecting grayscale uniformity in the display panel.

The inventors of the present disclosure discovers that by having a first anode AD1 in the first subpixel sp1 to have an enlarged area as shown in FIG. 3 and FIG. 14A, the display defects due to the inconsistent parasitic capacitance between the first node N1 and the fourth node N4 can be unexpectedly and surprisingly improved or eliminated. In one example, the parasitic capacitance between the first node N1 and the fourth node N4 in an array substrate depicted in FIG. 3 may have a designed value of 0.374 fF; the current through the light emitting element may have a designed value of 15.416 pA. Considering the line width fluctuation and alignment imprecision during the fabrication process, the parasitic capacitance between the first node N1 and the fourth node N4 may vary in a surprisingly smaller range of 0.372 fF to 0.376 fF; and the current through the light emitting element may vary in a much smaller range of 15.415 pA to 15.417 pA. Thus, a ratio of $\Delta I/I$ may vary in a much smaller range of −0.0065% to 0.0065%, wherein I stands for the designed value of the current through the light emitting element, and $\Delta I$ stands for a change in the current due to the line width fluctuation and alignment imprecision during the fabrication process.

Referring to FIG. 3, FIG. 10 and FIG. 14A, in some embodiments, percentages of orthographic projections of a first respective node connecting line Cln1 in the first subpixel sp1, a second respective node connecting line Cln2 in the second subpixel sp2, a third respective node connecting line Cln3 in the third subpixel sp3, and a fourth respective node connecting line Cln4 in the fourth subpixel sp4 on the base substrate BS respectively covered by orthographic projections of a first anode AD1 of a first light emitting element in the first subpixel sp1, a second anode AD2 of a second light emitting element in the second subpixel sp2, a third anode AD3 of a third light emitting element in the third subpixel sp3, and a fourth anode AD4 of a fourth light emitting element in the fourth subpixel sp4 on the base substrate BS are within 20% of each other, for example, within 18% of each other, within 16% of each other, within 14 of each other, within 12% of each other, within 10% of each other, within 8% of each other, within 6% of each other, within 4% of each other, within 2% of each other, or within 1% of each other.

As a comparison, in an array substrate depicted in FIG. 11, FIG. 13, and FIG. 15A, a percentage of the orthographic projection of the first respective node connecting line Cln1 in the first subpixel sp1 covered by the orthographic projection of the first anode AD1 of the first light emitting element in the first subpixel sp1 is much smaller than percentages of orthographic projections of the second respective node connecting line Cln2 in the second subpixel sp2, the third respective node connecting line Cln3 in the third subpixel sp3, and the fourth respective node connecting line Cln4 in the fourth subpixel sp4 on the base substrate BS respectively covered by orthographic projections of the second anode AD2 of the second light emitting element in the second subpixel sp2, the third anode AD3 of the third light emitting element in the third subpixel sp3, and the fourth anode AD4 of the fourth light emitting element in the fourth subpixel sp4 on the base substrate BS. In one example, in the array substrate depicted in FIG. 11 and FIG. 15A, the percentage of the orthographic projection of the first respective node connecting line Cln1 in the first subpixel sp1 covered by the orthographic projection of the first anode AD1 of the first light emitting element in the first subpixel sp1 is less than 20% (e.g., less than 15%, less than 10%, or less than 5%); whereas the percentages of orthographic projections of the second respective node connecting line Cln2 in the second subpixel sp2, the third respective node connecting line Cln3 in the third subpixel sp3, and the fourth respective node connecting line Cln4 in the fourth subpixel sp4 on the base substrate BS respectively covered by orthographic projections of the second anode AD2 of the second light emitting element in the second subpixel sp2, the third anode AD3 of the third light emitting element in the third subpixel sp3, and the fourth anode AD4 of the fourth light emitting element in the fourth subpixel sp4 on the base substrate BS are greater than 80% (e.g., greater than 85%, greater than 90%, or greater than 95%).

Referring to FIG. 3, FIG. 10, and FIG. 14A, In some embodiments, the orthographic projections of the first respective node connecting line Cln1 in the first subpixel sp1, the second respective node connecting line Cln2 in the second subpixel sp2, the third respective node connecting line Cln3 in the third subpixel sp3, and the fourth respective node connecting line Cln4 in the fourth subpixel sp4 on the base substrate BS are, respectively, substantially covered by the orthographic projections of the first anode AD1 of the first light emitting element in the first subpixel sp1, the second anode AD2 of the second light emitting element in the second subpixel sp2, the third anode AD3 of the third light emitting element in the third subpixel sp3, and the fourth anode AD4 of the fourth light emitting element in the fourth subpixel sp4 on the base substrate BS. As used herein, the term "substantially covered by" refers to one orthographic projection being at least 70 percent (e.g., at least 75 percent, at least 80 percent, at least 85 percent, at least 90 percent, at least 95 percent, at least 99 percent, or 100 percent) covered by another orthographic projection.

As a comparison, the orthographic projection of the first respective node connecting line Cln1 in the first subpixel sp1 in the array substrate depicted in FIG. 11, FIG. 13, and FIG. 15A is not substantially covered by the orthographic projections of the first anode AD1 of the first light emitting element in the first subpixel sp1.

Figure 14B:
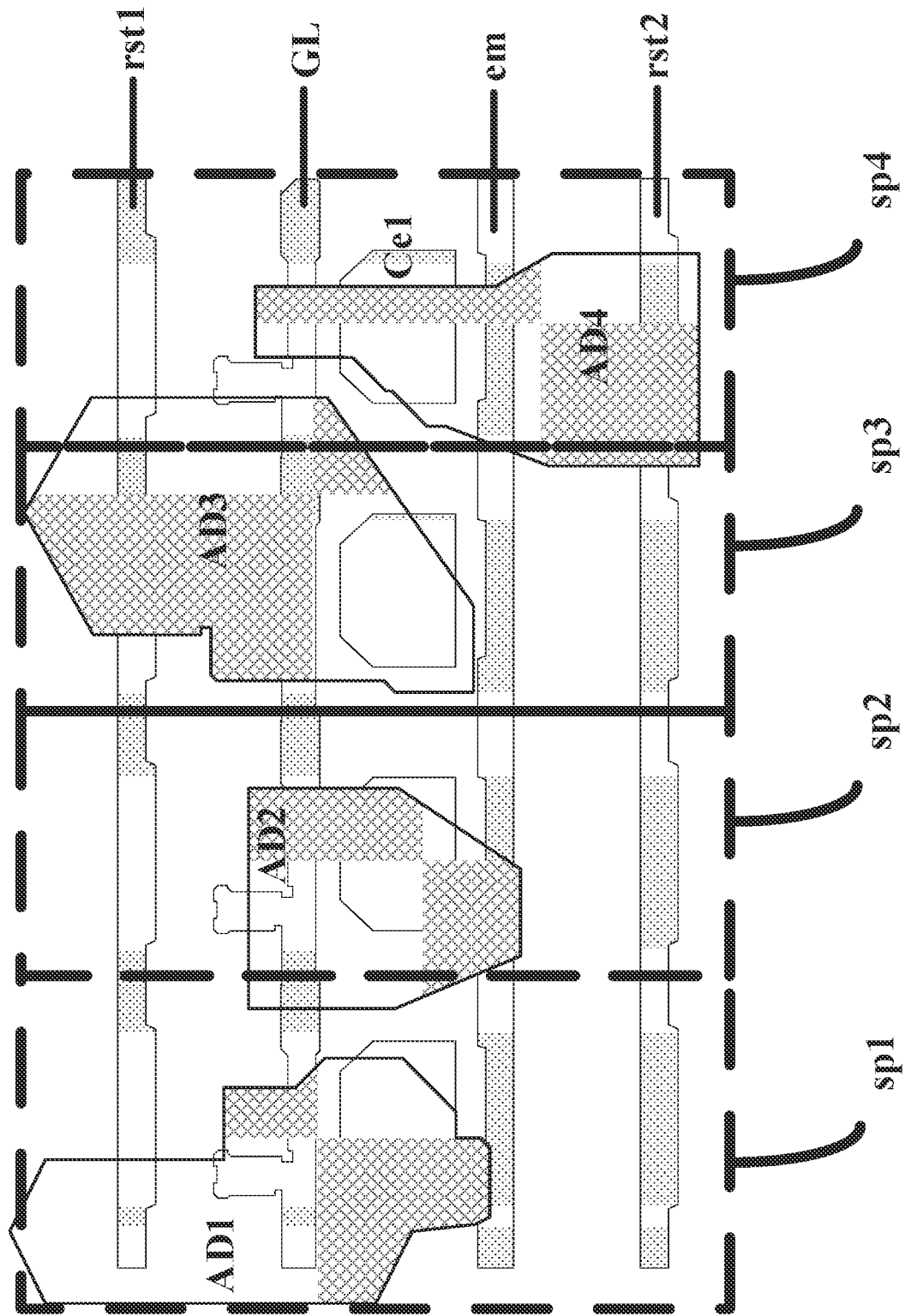
FIG. 14B is a diagram illustrating the structure of anodes and a first conductive layer in an array substrate depicted in FIG. 3.

FIG. 14B is a diagram illustrating the structure of anodes and a first conductive layer in an array substrate depicted in FIG. 3, Referring to FIG. 3, FIG. 10, and FIG. 14B, in some embodiments, percentages of orthographic projections of first capacitor electrodes respectively in the first subpixel sp1, the second subpixel sp2, the third subpixel sp3, and the fourth subpixel sp4 on the base substrate BS respectively covered by the orthographic projections of the first anode AD1 of the first light emitting element in the first subpixel sp1, the second anode AD2 of the second light emitting element in the second subpixel sp2, the third anode AD3 of the third light emitting element in the third subpixel sp3, and the fourth anode AD4 of the fourth light emitting element in the fourth subpixel sp4 on the base substrate BS are within 20% of each other, for example, within 18% of each other, within 16% of each other, within 14% of each other, within 12% of each other, within 10% of each other, within 8% of each other, within 6% of each other, within 4 bio of each other, within 2% of each other, or within 1% of each other.

Figure 15B:
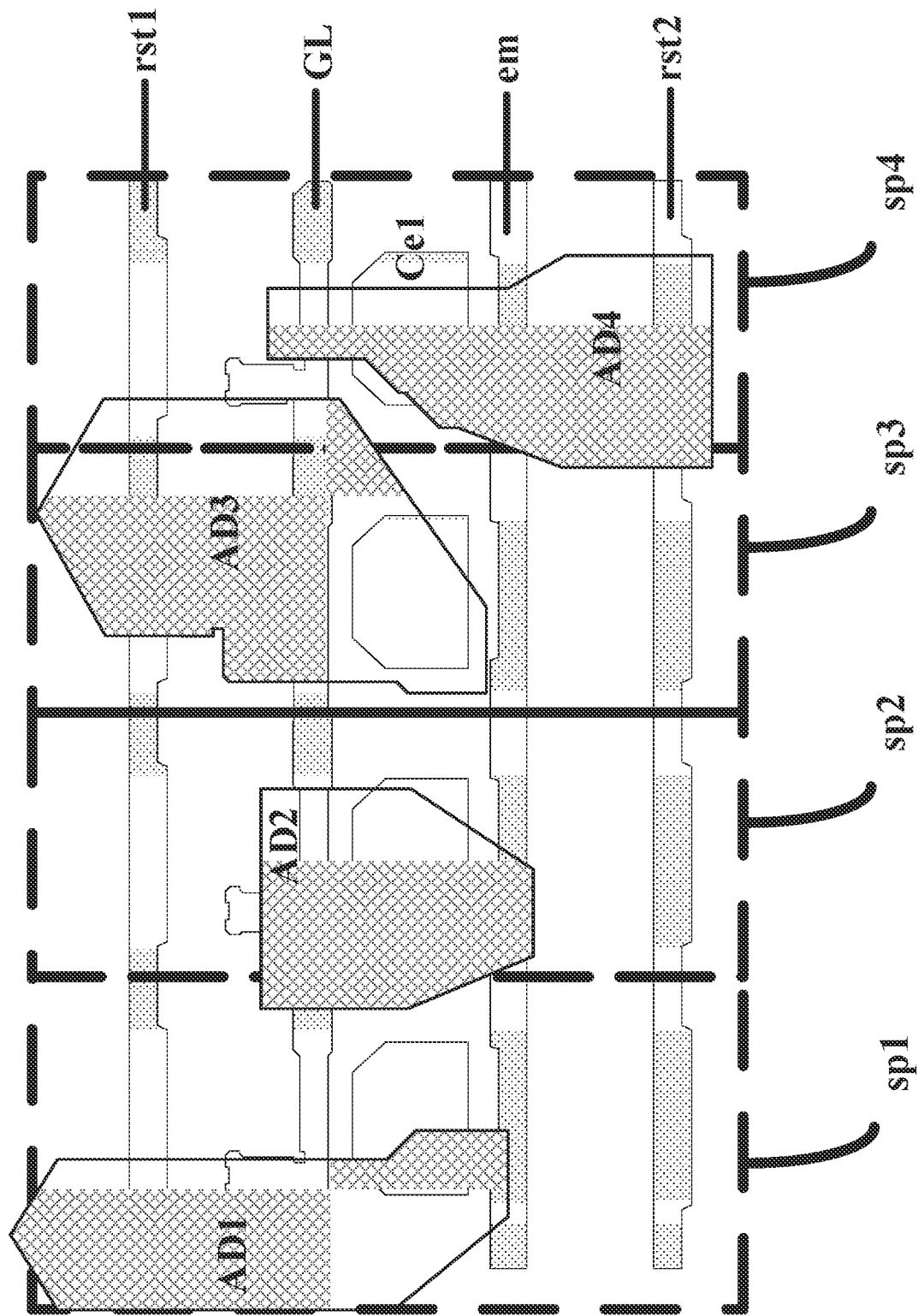
FIG. 15B is a diagram illustrating the structure of anodes and a first conductive layer in an array substrate depicted in FIG. 11.

FIG. 15B is a diagram illustrating the structure of anodes and a first conductive layer in an array substrate depicted in FIG. 11. As a comparison to the array substrate depicted in FIG. 14B, a percentage of the orthographic projection of the first capacitor electrodes Ce1 in the first subpixel sp1 covered by the orthographic projection of the first anode AD1 of the first light emitting element in the first subpixel sp1 is much smaller than percentages of orthographic projections of first capacitor electrodes in the second subpixel sp2, the third respective node connecting line Cln3 in the third subpixel sp3, and the fourth respective node connecting line Cln4 in the fourth subpixel sp4 on the base substrate BS respectively covered by orthographic projections of the second anode AD2 of the second light emitting element in the second subpixel sp2, the third anode AD3 of the third light emitting element in the third subpixel sp3, and the fourth anode AD4 of the fourth light emitting element in the fourth subpixel sp4 on the base substrate BS. In one example, in the array substrate depicted in FIG. 11, FIG. 13, and FIG. 15A, the percentage of the orthographic projection of the first capacitor electrodes Ce1 in the first subpixel sp1 covered by the orthographic projection of the first anode AD1 of the first light emitting element in the first subpixel sp1 is less than 40% (e.g., less than 35%, less than 30%, or less than 25%); whereas the percentages of orthographic projections of the first capacitor electrodes respectively in the second subpixel sp2, the third subpixel sp3, and the fourth subpixel sp4 on the base substrate BS respectively covered by orthographic projections of the second anode AD2 of the second light emitting element in the second subpixel sp2, the third anode AD3 of the third light emitting element in the third subpixel sp3, and the fourth anode AD4 of the fourth light emitting element in the fourth subpixel sp4 on the base substrate BS are greater than 60% (e.g., greater than 65%, greater than 70%, or greater than 75%).

Referring to FIG. 2, FIG. 3, and FIG. 10, in some embodiments, the signal line layer includes a node connecting line Cln on a side of the inter-layer dielectric layer ILD away from the second capacitor electrode Ce1. The node connecting line Cln is in a same layer as the voltage supply line Vdd and the data line DL Optionally, the array substrate further includes a first main via v1 in the hole region H and extending through the inter-layer dielectric layer ILD and the insulating layer LN. Optionally, the node connecting line Cln is connected to the first capacitor electrode Ce1 through the first main via v1.

In some embodiments, the first capacitor electrode Ce1 is on a side of the gate insulating layer IN away from the base substrate BS. Optionally, the array substrate further includes a first main via v1 and a second main via v2. The first main via v1 is in the hole region H and extends through the inter-layer dielectric layer ILD and the insulating layer IN. The second main via v2 extends through the inter-layer dielectric layer ILD, the insulating layer IN, and the gate insulating layer GI. Optionally, the node connecting line Cln is connected to the first capacitor electrode Ce1 through the first main via v1, and is connected to the semiconductor material layer SML through the second main via v2. Optionally, the node connecting line Cln is connected to the source electrode S3 of third transistor, as depicted in FIG. 10.

Figure 14C:
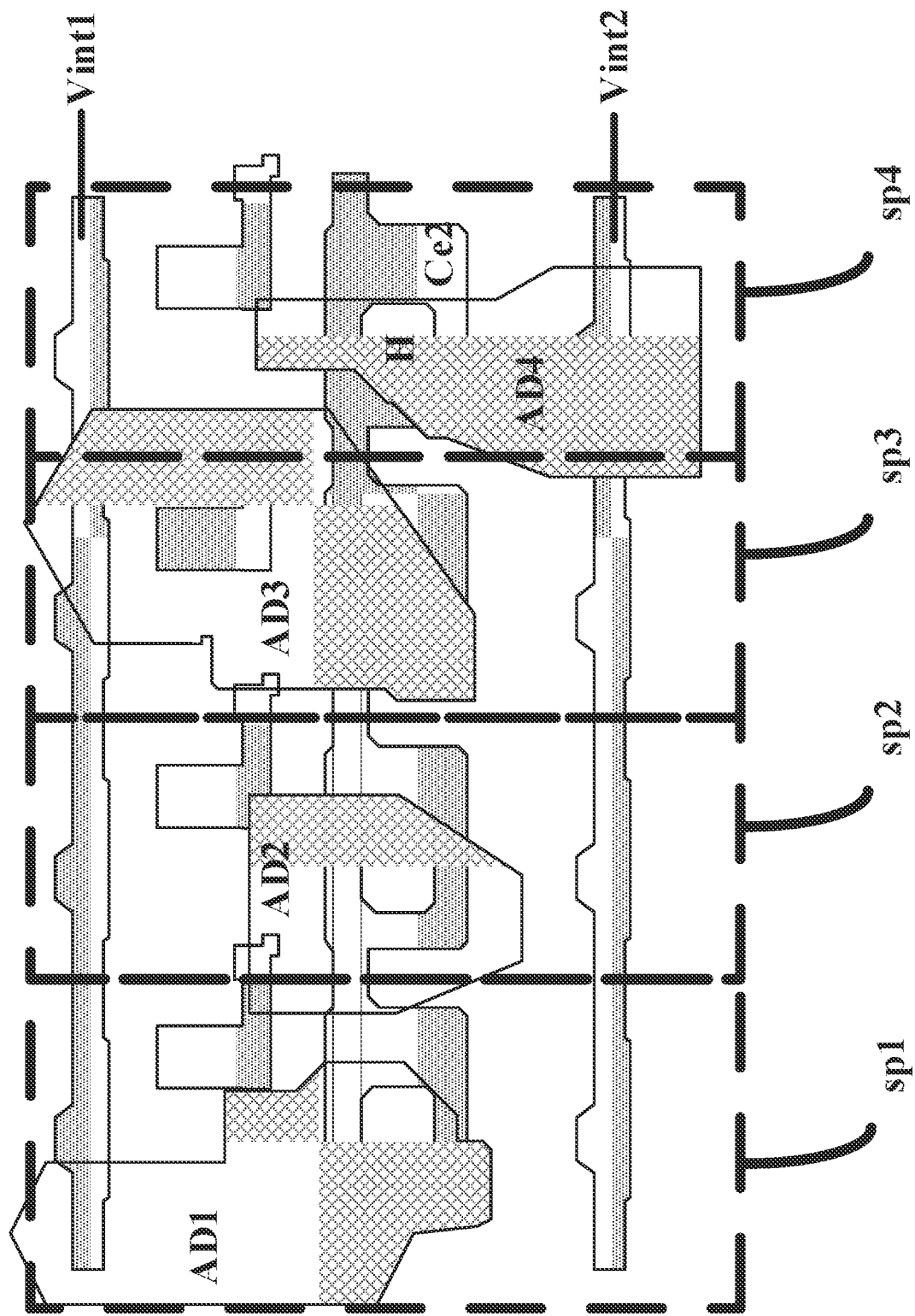
FIG. 14C is a diagram illustrating the structure of anodes and a second conductive layer in an array substrate depicted in FIG. 3.

FIG. 14C is a diagram illustrating the structure of anodes and a second conductive layer in an array substrate depicted in FIG. 3. Referring to FIG. 3, FIG. 10, and FIG. 14C, in some embodiments, respective portions of second capacitor electrodes in the first subpixel sp1, the second subpixel sp2, the third subpixel sp3, and the fourth subpixel sp4 are respectively absent in the hole regions. The hole regions are respectively surrounded by the second capacitor electrodes. In some embodiments, percentages of orthographic projections of hole regions respectively in the first subpixel sp1, the second subpixel sp2, the third subpixel sp3, and the fourth subpixel sp4 on the base substrate BS respectively covered by the orthographic projections of the first anode AD1 of the first light emitting element in the first subpixel sp1, the second anode AD2 of the second light emitting element in the second subpixel sp2, the third anode AD3 of the third light emitting element in the third subpixel sp3, and the fourth anode AD4 of the fourth light emitting element in the fourth subpixel sp4 on the base substrate BS are within 20% of each other, for example, within 18% of each other, within 16% of each other, within 14% of each other, within 12% of each other, within 10% of each other, within 8% of each other, within 6% of each other, within 4% of each other, within 2% of each other, or within 1% of each other.

Referring to FIG. 3, FIG. 10, and FIG. 14C, in some embodiments, the orthographic projections of the hole regions respectively in the first subpixel sp1, the second subpixel sp2, the third subpixel sp3, and the fourth subpixel sp4 on the base substrate BS are, respectively, substantially covered by the orthographic projections of the first anode AD1 of the first light emitting element in the first subpixel sp1, the second anode AD2 of the second light emitting element in the second subpixel sp2, the third anode AD3 of the third light emitting element in the third subpixel sp3, and the fourth anode AD4 of the fourth light emitting element in the fourth subpixel sp4 on the base substrate BS. Optionally, the orthographic projections of the hole regions respectively in the first subpixel sp1, the second subpixel sp2, the third subpixel sp3, and the fourth subpixel sp4 on the base substrate BS are, respectively, completely covered by the orthographic projections of the first anode AD1 of the first light emitting element in the first subpixel sp1, the second anode AD2 of the second light emitting element in the second subpixel sp2, the third anode AD3 of the third light emitting element in the third subpixel sp3, and the fourth anode AD4 of the fourth light emitting element in the fourth subpixel sp4 on the base substrate BS.

Figure 15C:
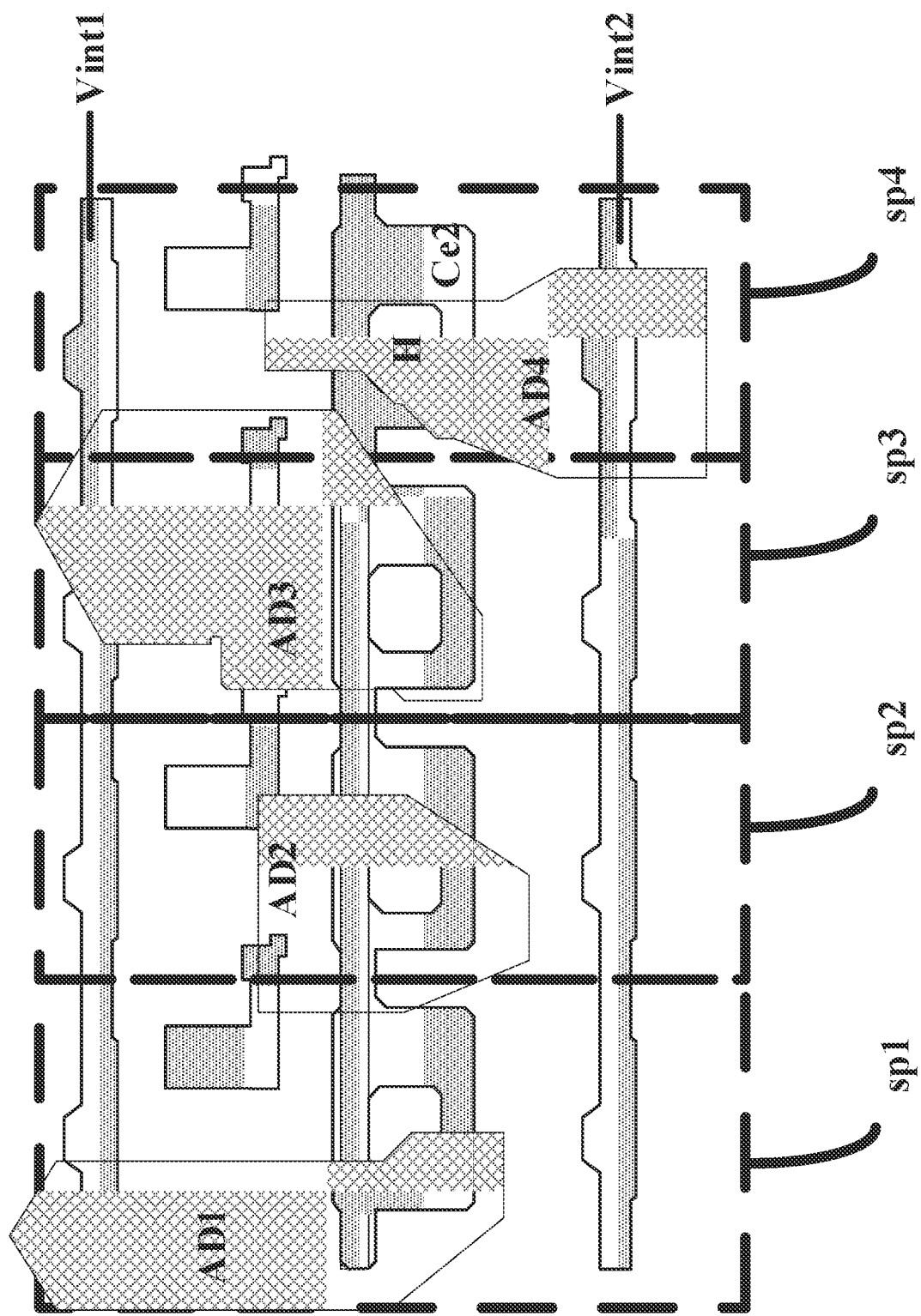
FIG. 15C is a diagram illustrating the structure of anodes and a second conductive layer in an array substrate depicted in FIG. 11.

FIG. 15C is a diagram illustrating the structure of anodes and a second conductive layer in an array substrate depicted in FIG. 11. As a comparison to the array substrate depicted in FIG. 14C, a percentage of the orthographic projection of the hole region H in the first subpixel sp1 covered by the orthographic projection of the first anode AD1 of the first light emitting element in the first subpixel sp1 is much smaller than percentages of orthographic projections of the hole regions respectively in the second subpixel sp2, the third subpixel sp3, and the fourth subpixel sp4 on the base substrate BS respectively covered by orthographic projections of the second anode AD2 of the second light emitting element in the second subpixel sp2, the third anode AD3 of the third light emitting element in the third subpixel sp3, and the fourth anode AD4 of the fourth light emitting element in the fourth subpixel sp4 on the base substrate BS. In one example, in the array substrate depicted in FIG. 11 FIG. 13, and FIG. 15C, the percentage of the orthographic projection of the hole region H in the first subpixel sp1 covered by the orthographic projection of the first anode AD1 of the first light emitting element in the first subpixel sp1 is less than 40% (e.g., less than 35%, less than 30%, or less than 25%); whereas the percentages of orthographic projections of the hole regions respectively in the second subpixel sp2, the third subpixel sp3, and the fourth subpixel sp4 on the base substrate BS respectively covered by orthographic projections of the second anode AD2 of the second light emitting element in the second subpixel sp2, the third anode AD3 of the third light emitting element in the third subpixel sp3, and the fourth anode AD4 of the fourth light emitting element in the fourth subpixel sp4 on the base substrate BS are greater than 60% (e.g., 100%).

Figure 14D:
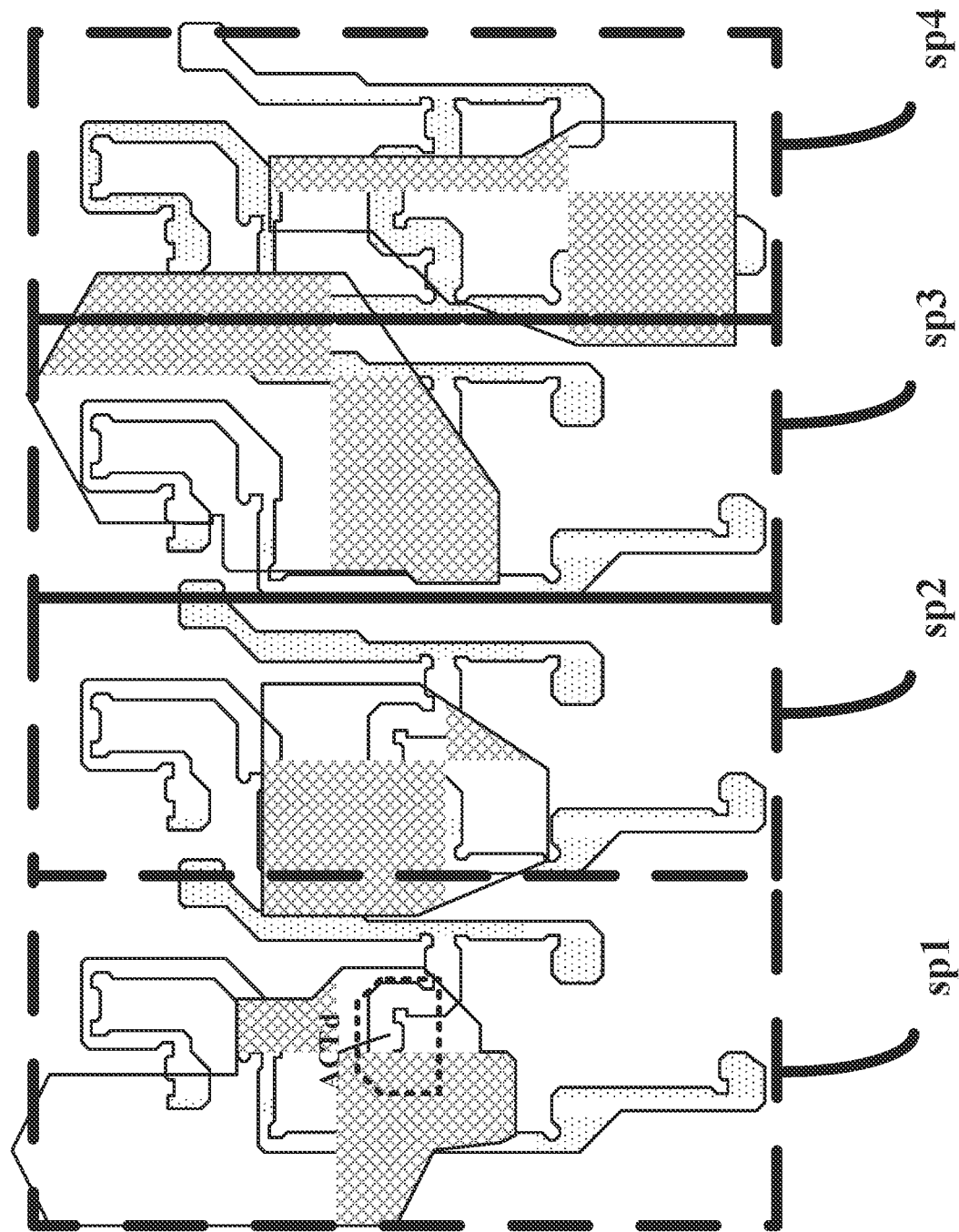
FIG. 14D is a diagram illustrating the structure of anodes and a semiconductor material layer in an array substrate depicted in FIG. 3.

FIG. 14D is a diagram illustrating the structure of anodes and a semiconductor material layer in an array substrate depicted in FIG. 3. Referring to FIG. 3, FIG. 10, and FIG. 14D, in some embodiments, percentages of orthographic projections of active layers of driving transistors respectively in the first subpixel, the second subpixel, the third subpixel, and the fourth subpixel on the base substrate respectively covered by the orthographic projections of the first anode AD1 of the first light emitting element in the first subpixel sp1, the second anode AD2 of the second light emitting element in the second subpixel sp2, the third anode AD3 of the third light emitting element in the third subpixel sp3, and the fourth anode AD4 of the fourth light emitting element in the fourth subpixel sp4 on the base substrate BS are within 20% of each other, for example, within 18% of each other, within 16% of each other, within 14% of each other, within 12% of each other, within 10% of each other, within 8% of each other, within 6% of each other, within 4% of each other, within 2% of each other, or within 1% of each other.

Referring to FIG. 3, FIG. 10, and FIG. 14D, in some embodiments, the orthographic projections of the active layers of driving transistors respectively in the first subpixel sp1, the second subpixel sp2, the third subpixel sp3, and the fourth subpixel sp4 on the base substrate BS are, respectively, substantially covered by the orthographic projections of the first anode AD1 of the first light emitting element in the first subpixel sp1, the second anode AD2 of the second light emitting element in the second subpixel sp2, the third anode AD3 of the third light emitting element in the third subpixel sp3, and the fourth anode AD4 of the fourth light emitting element in the fourth subpixel sp4 on the base substrate BS. Optionally, the orthographic projections of the active layers of driving transistors respectively in the first subpixel sp1, the second subpixel sp2, the third subpixel sp3, and the fourth subpixel sp4 on the base substrate BS are, respectively, completely covered by the orthographic projections of the first anode AD1 of the first light emitting element in the first subpixel sp1, the second anode AD2 of the second light emitting element in the second subpixel sp2, the third anode AD3 of the third light emitting element in the third subpixel sp3, and the fourth anode AD4 of the fourth light emitting element in the fourth subpixel sp4 on the base substrate BS.

Figure 15D:
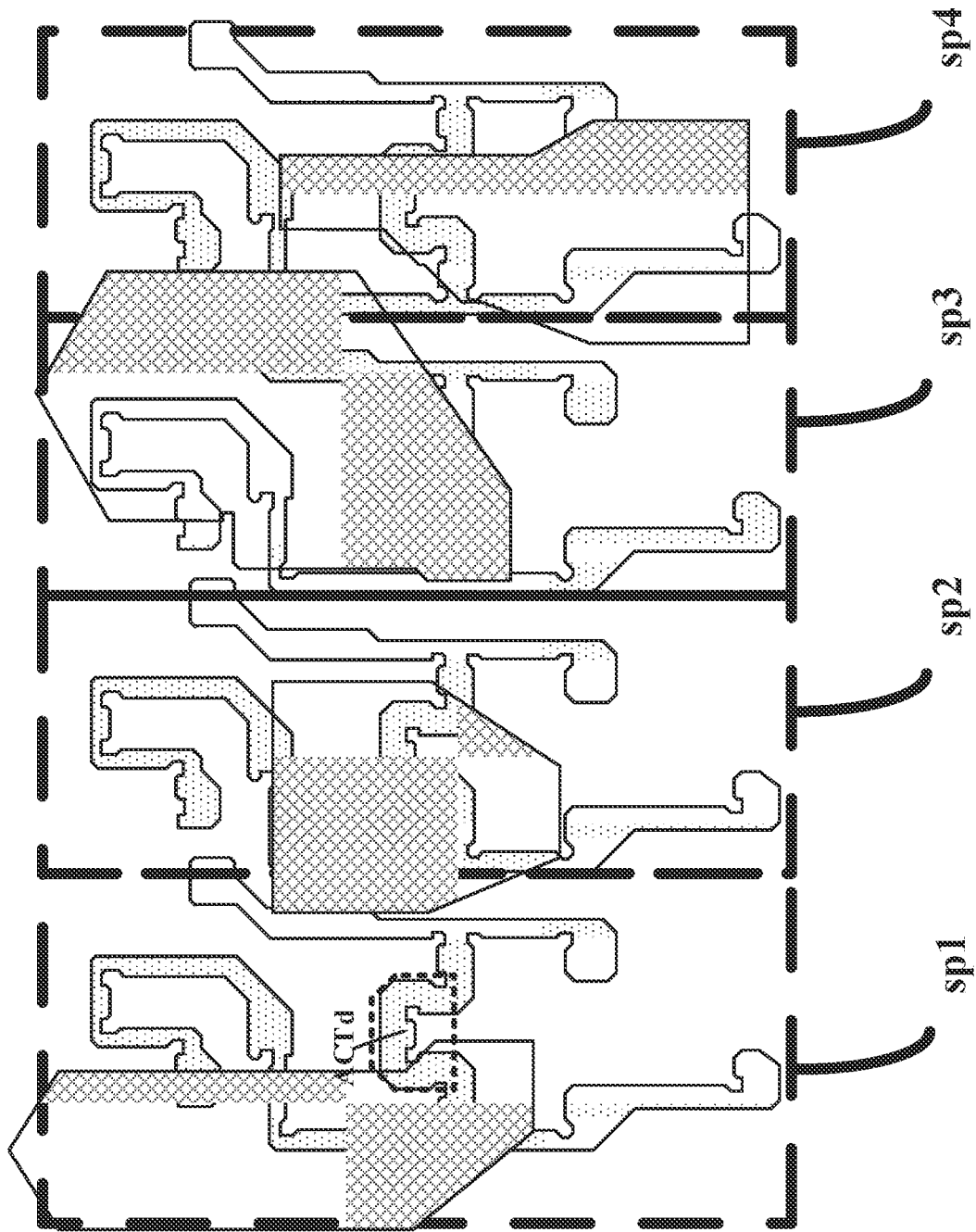
FIG. 15D is a diagram illustrating the structure of anodes and a semiconductor material layer in an array substrate depicted in FIG. 11.

FIG. 15D is a diagram illustrating the structure of anodes and a semiconductor material layer in an array substrate depicted in FIG. 11. As a comparison to the array substrate depicted in FIG. 14D, a percentage of the orthographic projection of the active layer ACTd of the driving transistor in the first subpixel sp1 covered by the orthographic projection of the first anode AD1 of the first light emitting element in the first subpixel sp1 is much smaller than percentages of orthographic projections of the active layers of the driving transistors respectively in the second subpixel sp2, the third subpixel sp3, and the fourth subpixel sp4 on the base substrate BS respectively covered by orthographic projections of the second anode AD2 of the second light emitting element in the second subpixel sp2, the third anode AD3 of the third light emitting element in the third subpixel sp3, and the fourth anode AD4 of the fourth light emitting element in the fourth subpixel sp4 on the base substrate BS. In one example, in the array substrate depicted in FIG. 11, FIG. 13, and FIG. 15D, the percentage of the orthographic projection of the active layer ACTd of the driving transistor in the first subpixel sp1 covered by the orthographic projection of the first anode AD1 of the first light emitting element in the first subpixel sp1 is less than 40% (e.g., less than 35%, less than 30%, or less than 25%); whereas the percentages of orthographic projections of the active layers of the driving transistors respectively in the second subpixel sp2, the third subpixel sp3, and the fourth subpixel sp4 on the base substrate BS respectively covered by orthographic projections of the second anode AD2 of the second light emitting element in the second subpixel sp2, the third anode AD3 of the third light emitting element in the third subpixel sp3, and the fourth anode AD4 of the fourth light emitting element in the fourth subpixel sp4 on the base substrate BS are greater than 60% (e.g., 100%).

Figure 14E:
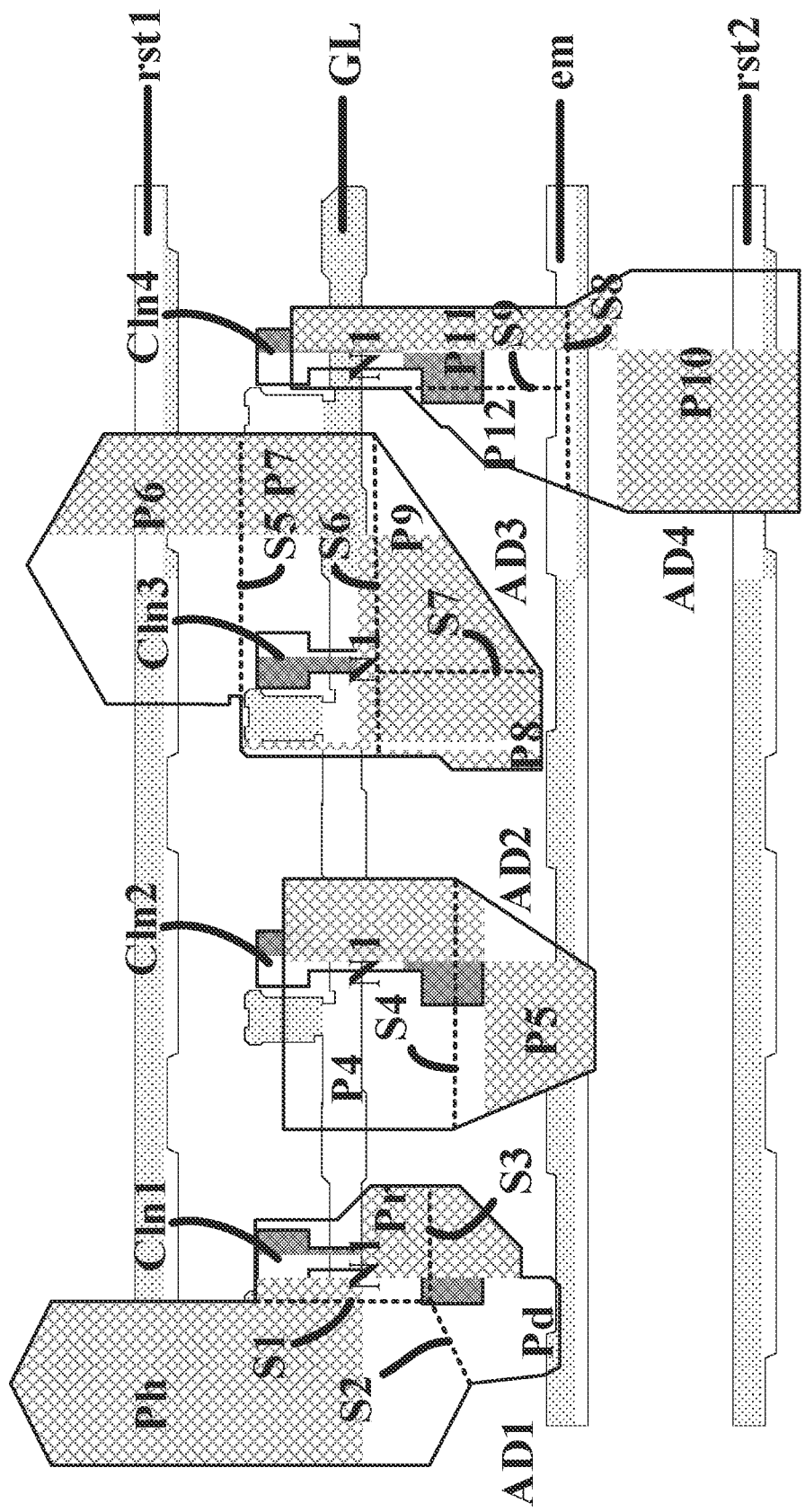
FIG. 14E is a diagram illustrating the structure of anodes, node connecting lines, and a first conductive layer in an array substrate depicted in FIG. 3.

FIG. 14E is a diagram illustrating the structure of anodes, node connecting lines, and a first conductive layer in an array substrate depicted in FIG. 3. Referring to FIG. 14E, in some embodiments, the first anode AD1 of the first light emitting element in the first subpixel sp1 includes a first portion Ph of a hexagonal shape, a second portion Pr, and a third portion Pd. Optionally, the hexagonal shape has a first side S1 and a second side S2 directly connected to each other. The second portion Pr abuts the first side S1. The third portion Pd abuts the second side S2. The second portion Pr and the third portion Pd abut each other along a third side S3. The first side S1, the second side S2, and the third side S3 are directly connected to each other at a corner of the hexagonal shape.

As shown in FIG. 3, FIG. 10, and FIG. 14E, in some embodiments, the orthographic projection of the first respective node connecting line Cln1 in the first subpixel sp1 on the base substrate BS are, respectively, substantially covered by a combination of orthographic projections of the second portion Pr and the third portion Pd on the base substrate BS, and is substantially non-overlapping with an orthographic projection of the first portion Ph on the base substrate BS. An orthographic projection of a portion of the first respective node connecting line Cln1 in the second main via v2 on the base substrate BS is substantially covered by an orthographic projection of the second portion Pr on the base substrate BS. An orthographic projection of a portion of the first respective node connecting line Cln1 in the first main via v1 on the base substrate BS is substantially covered by an orthographic projection of the third portion Pd on the base substrate BS. An orthographic projection of the second portion Pr on the base substrate BS at least partially overlaps with an orthographic projection of the source electrode S3 of the third transistor T3 in the first subpixel sp1 on the base substrate BS. Optionally, an orthographic projection of at least one of the second portion Pr or the third portion Pd on the base substrate BS at least partially overlaps with an orthographic projection of the respective voltage supply line Vdd in the first subpixel sp1 on the base substrate BS.

Figure 15E:
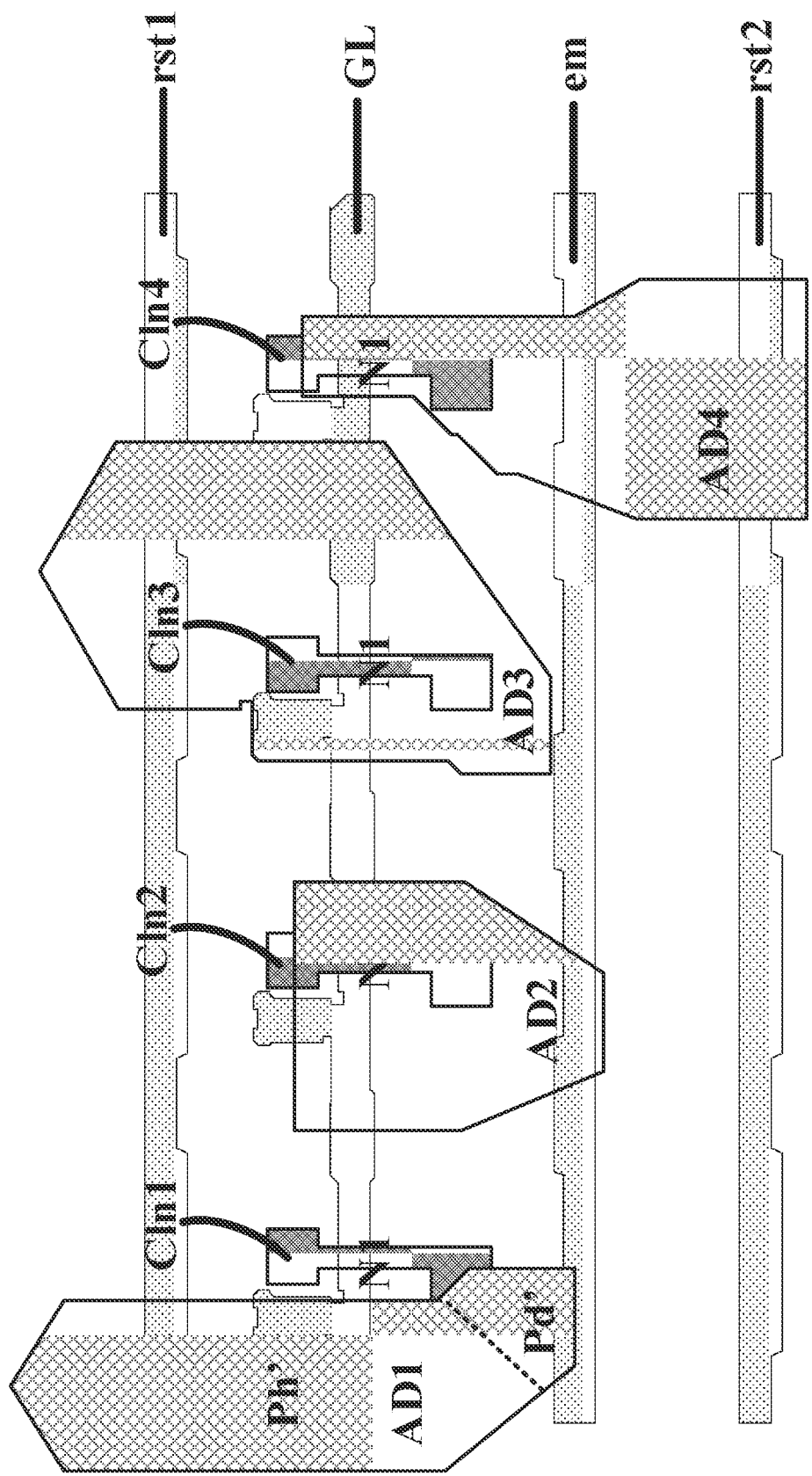
FIG. 15E is a diagram illustrating the structure of anodes, node connecting lines, and a first conductive layer in an array substrate depicted in FIG. 11.

FIG. 15E is a diagram illustrating the structure of anodes, node connecting lines, and a first conductive layer in an array substrate depicted in FIG. 11, As a comparison to the array substrate depicted in FIG. 14E, the first anode AD1 in the array substrate depicted in FIG. 15E includes a hexagonal portion Ph' and a pentagonal portion Pd'. In the array substrate depicted in FIG. 11, FIG. 13, and FIG. 15E, the second portion Pr and a part of the third portion Pd in FIG. 14E is missing. In the array substrate depicted in FIG. 11, FIG. 13, and FIG. 15E, the orthographic projection of the first respective node connecting line Cln1 in the first subpixel sp1 on the base substrate BS are not, respectively, substantially covered by the first anode AD1. An orthographic projection of a portion of the first respective node connecting line Cln1 in the second main via v2 on the base substrate BS is not covered by an orthographic projection of the second portion Pr on the base substrate BS. An orthographic projection of a portion of the first respective node connecting line Cln1 in the first main via v1 on the base substrate BS is substantially covered by an orthographic projection of the first anode AD1 on the base substrate BS. An orthographic projection of the first anode AD1 on the base substrate BS is non-overlapping with an orthographic projection of the source electrode S3 of the third transistor T3 in the first subpixel sp1 on the base substrate BS. The orthographic projection of the first anode AD1 on the base substrate BS is non-overlapping with an orthographic projection of the respective voltage supply line Vdd in the first subpixel sp1 on the base substrate BS.

Referring to FIG. 14E, in some embodiments, the second anode AD2 of the second light emitting element in the second subpixel sp2 includes a fourth portion P4 of a rectangular shape and a fifth portion P5 of a trapezoidal shape. The fourth portion P4 and the fifth portion P5 abut each other along a fourth side S4.

Referring to FIG. 14E, in some embodiments, the third anode AD3 of the third light emitting element in the third subpixel sp3 includes a sixth portion P6 of a pentagonal shape, a seventh portion P7 of a rectangular shape, an eighth portion P8 of a quasi-rectangular shape, and a ninth portion P9 of a triangular shape. The sixth portion P6 and the seventh portion P7 abut each other along a fifth side S5. The seventh portion P7 abuts, along a sixth side S6, the eighth portion P8 and the ninth portion P9, respectively. The eighth portion P8 and the ninth portion P9 abut each other along a seventh side S7.

Referring to FIG. 14E, in some embodiments, the fourth anode AD4 of the fourth light emitting element in the fourth subpixel sp4 includes a tenth portion P10 of a pentagonal shape, an eleventh portion P11 of a rectangular shape, and a twelfth portion P12 of a quasi-triangular shape. The tenth portion P10 abuts, along an eighth side S8, the eleventh portion P11 and the twelfth portion P12, respectively. The eleventh portion P11 and the twelfth portion P12 abut each other along a ninth side S9.

Referring to FIG. 3, FIG. 5, and FIG. 14E, in some embodiments, a gate line GL extends through the first subpixel sp1, the second subpixel sp2, the third subpixel sp3, and the fourth subpixel sp4. The first respective node connecting line Cln1, the second respective node connecting line Cln2, the third respective node connecting line Cln3, and the fourth respective node connecting line Cln4 respectively cross over the gate line GL.

Referring to FIG. 3, FIG. 5, and FIG. 14E, in some embodiments, the first anode AD1 crosses over the first reset control signal line rst1 and the gate line GL; the second anode AD2 crosses over the gate line GL and the light emitting control signal line em; the third anode AD3 crosses over the first reset control signal line rst1 and the gate line GL; and the fourth anode AD4 crosses over the gate line GL, the light emitting control signal line em, and the second reset control signal line rst2.

In another aspect, the present disclosure provides a display panel including the array substrate described herein or fabricated by a method described herein, and a counter substrate facing the array substrate. Optionally, the display panel is an organic light emitting diode display panel. Optionally, the display panel is micro light emitting diode display panel.

Figure 16:
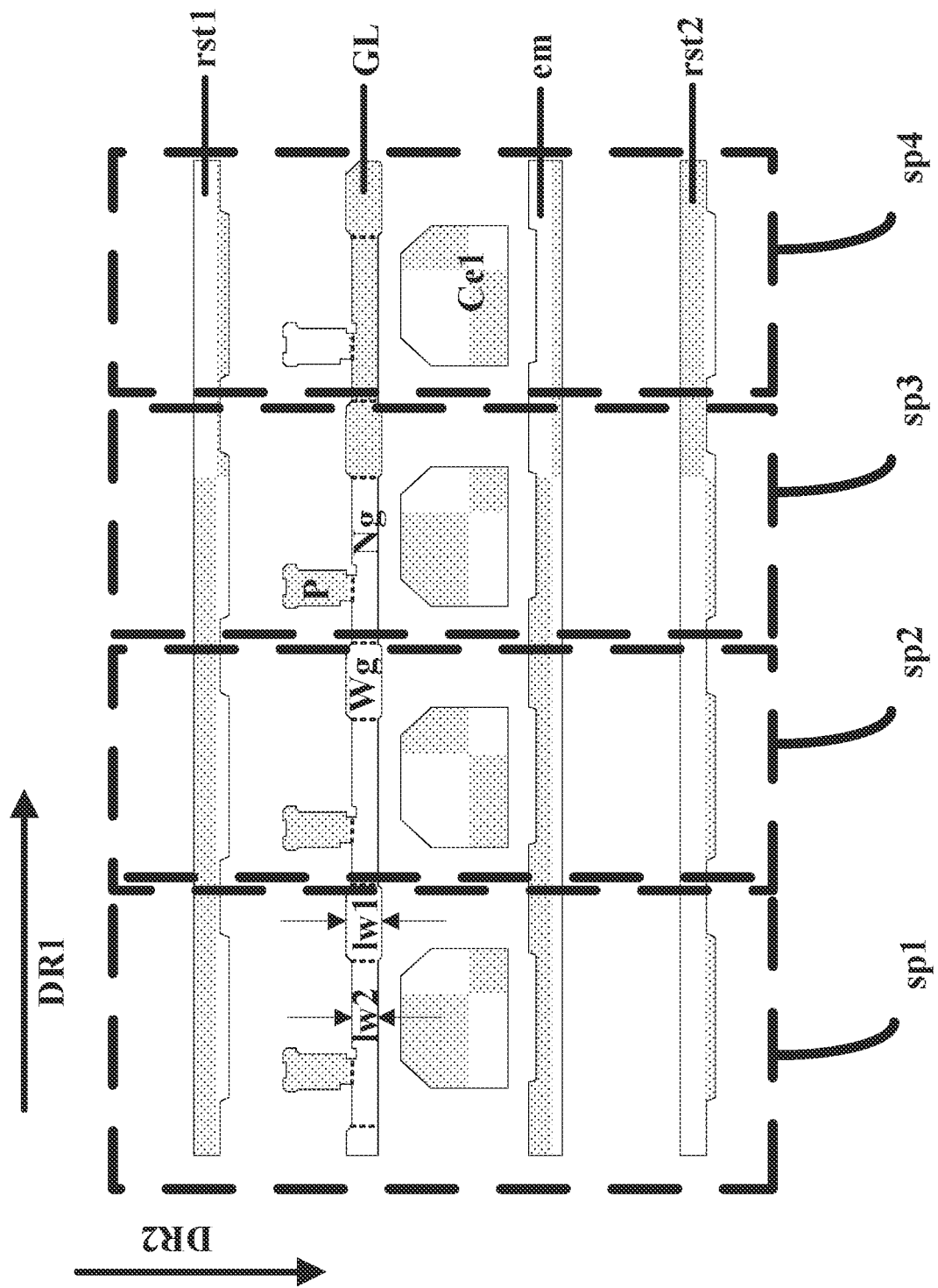
FIG. 16 is a diagram illustrating the structure of a first conductive layer in a plurality of subpixels of an array substrate depicted in FIG. 3.

FIG. 16 is a diagram illustrating the structure of a first conductive layer in a plurality of subpixels of an array substrate depicted in FIG. 3. Referring to FIG. 16, in some embodiments, the gate line GL extends along a first direction DR1. In some embodiments, the gate line GL includes a plurality of wide portions Wg, a plurality of narrow portions Ng, and a plurality of protrusions P alternately arranged along the first direction DR1 The plurality of wide portions Wg has a first line width lw1 greater than a second line width lw2 of the plurality of narrow portions Ng. The plurality of wide portions Wg are respectively in subpixels along the first direction DR1. In some embodiments, a respective one of the plurality of pixel driving circuits includes a driving transistor (the driving transistor Td in FIG. 2), a data-write transistor (e.g., the second transistor T2 in FIG. 2), and a compensating transistor (e.g., the third transistor T3 in FIG. 2). The driving transistor configured to generate a driving current for driving a light emitting element to emit light. The data-write transistor configured to write a voltage of a data voltage signal and a threshold voltage of the driving transistor into a second capacitor electrode in a data write phase. By having the first line width lw1 greater than the second line width lw2, the active layer of the data-write transistor can have an increased channel length, and the data signal can be written in a more stable manner.

Optionally, a ratio of the first line width lw1 to the second line width lw2 is in a range of 1.1:1.0 to 3.0:1.0, e.g., 1.1:1.0 to 1.5:1.0, 1.5:1.0 to 2.0:1.0, 2.0:1.0 to 2.5:1.0, or 2.5:1.0 to 3.0:1.0. Optionally, the ratio of the first line width lw1 to the second line width lw2 is 1.8:1.0. Optionally, the first line width lw1 is in a range of 3.5 μm to 4.5 μm. Optionally, the second line width lw2 is in a range of 2.5 μm to 3.5 μm.

In some embodiments, the plurality of wide portions Wg have a first dimension greater than a second dimension of the plurality of narrow portions along a second direction Dr2. Optionally, the second direction DR2 is at an angle in a range of 80 degrees to 100 degrees with respect to the first direction DR1. Optionally, a ratio of the first line width lw1 to the second line width lw2 is in a range of 1.1:1.0 to 3.0:1.0, e.g., 1.1:1.0 to 1.5:1.0, 1.5:1.0 to 2.0:1.0, 2.0:1.0 to 2.5:1.0, or 2.5:1.0 to 3.0:1.0, Optionally, the ratio of the first dimension to the second dimension is 1.8:1.0. Optionally, the first dimension is in a range of 3.5 μm to 4.5 μm. Optionally, the second dimension is in a range of 2.5 μm to 3.5 μm. Optionally, the respective one of the plurality of wide portions Wg has the first dimension greater than the second dimension by protruding toward both sides along the second direction DR2 relative to the respective one of the plurality of narrow portions Ng.

In some embodiments, the plurality of wide portions Wg and the plurality of narrow portion Ng are arranged alternately along the first direction DR1. Optionally, the plurality of wide portions Wg are respectively in subpixels along the first direction DR1.

Figure 17:
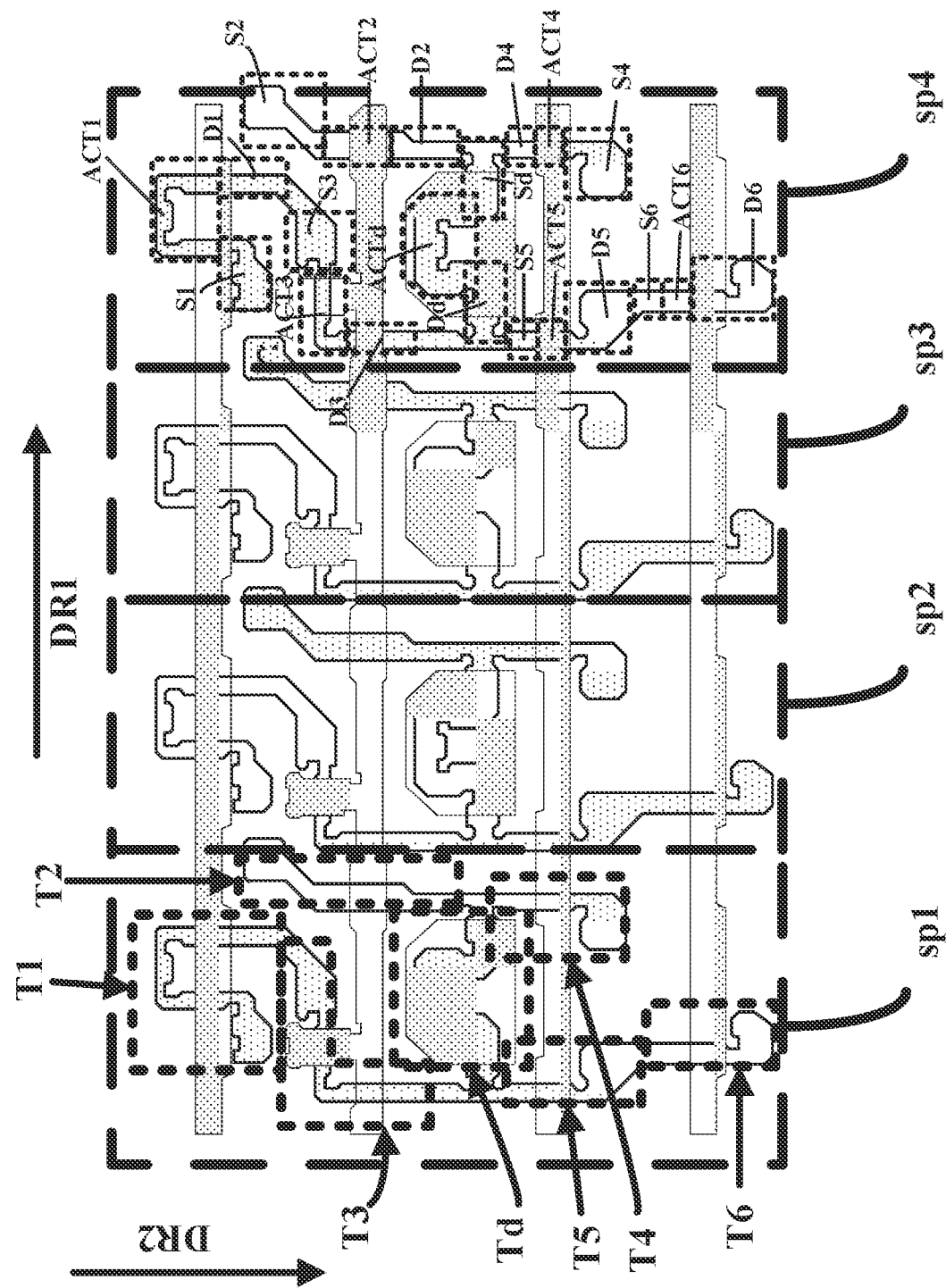
FIG. 17 is a diagram illustrating the structure of a semiconductor material layer and a first conductive layer in a plurality of subpixels of an array substrate depicted in FIG. 3.

FIG. 17 is a diagram illustrating the structure of a semiconductor material layer and a first conductive layer in a plurality of subpixels of an array substrate depicted in FIG. 3. Referring to FIG. 17, in some embodiments, a respective one of the plurality of protrusions P is a gate electrode of the compensating transistor (e.g., the third transistor T3 in FIG. 2) in the respective subpixel on the base substrate. An orthographic projection of a respective one of the plurality of protrusions P in a respective subpixel on a base substrate overlaps with an orthographic projection of an active layer of the compensating transistor (e.g., the third transistor T3 in FIG. 2) in the respective subpixel on the base substrate. In some embodiments, an orthographic projection of a respective one of the plurality of wide portions Wg in the respective subpixel on a base substrate overlaps with an orthographic projection of a portion of the semiconductor material layer in the respective subpixel on the base substrate, forming an active layer of the data-write transistor (e.g., the second transistor T2 in FIG. 2) in the respective subpixel. An orthographic projection of a respective one of the plurality of wide portions Wg in the respective subpixel on a base substrate overlaps with an orthographic projection of an active layer of the data-write transistor (e.g., the second transistor T2 in FIG. 2) in the respective subpixel on the base substrate.

In some embodiments, an aspect ratio of the active layer of the data-white transistor is in a range of 1:1 to 3:1, 1:1 to 1.5:1, 1.5:1 to 2:1, 2:1 to 2.5:1, or 2.5:1 to 3:1. The present array substrate includes a gate line having a plurality of wide portions Wg, thereby increasing the channel length of the active layer of the data-write transistor. As used herein, the term aspect ratio of the active layer refers to a ratio of a channel length to a channel width of an active layer. Optionally, the channel length of the active layer of the data-write transistor is in a range of 3.5 μm to 4.5 μm. Optionally, the channel width of the active layer of the data-write transistor is in a range of 1.5 μm to 3.5 μm. Optionally, the active layer of the data-write transistor, e.g., a portion of the semiconductor material layer whose orthographic projection on the base substrate covers by the orthographic projection of the respective one of the plurality of wide portions Wg on the base substrate, is not treated to increase conductivity, e.g., is undoped.

Figure 18:
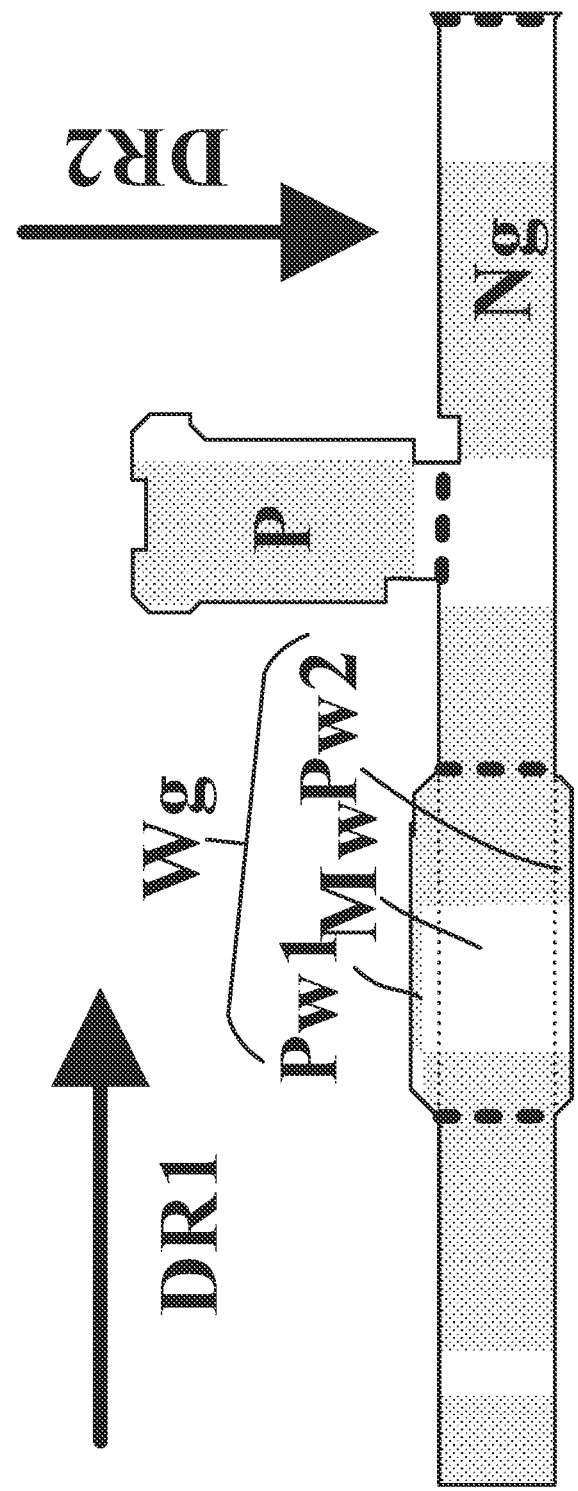
FIG. 18 is a zoom-in view of a portion of a gate line in some embodiments according to the present disclosure.

FIG. 18 is a zoom-in view of a portion of a gate line in some embodiments according to the present disclosure. Referring to FIG. 18, in some embodiments, the respective one of the plurality of wide portions Wg is wider than a respective one of the plurality of narrow portions Ng by protruding toward both sides along a direction perpendicular to the first direction DR1 relative to the respective one of the plurality of narrow portions Ng. In one example, the respective one of the plurality of wide portions Wg includes a main body Mw having a line width same as the line width of the respective one of the plurality of narrow portions Ng, a first protruding part Pw1 and a second protruding part Pw2 respectively protruding toward two sides along a direction perpendicular to the first direction DR1 relative to the respective one of the plurality of narrow portions Ng.

Figure 19:
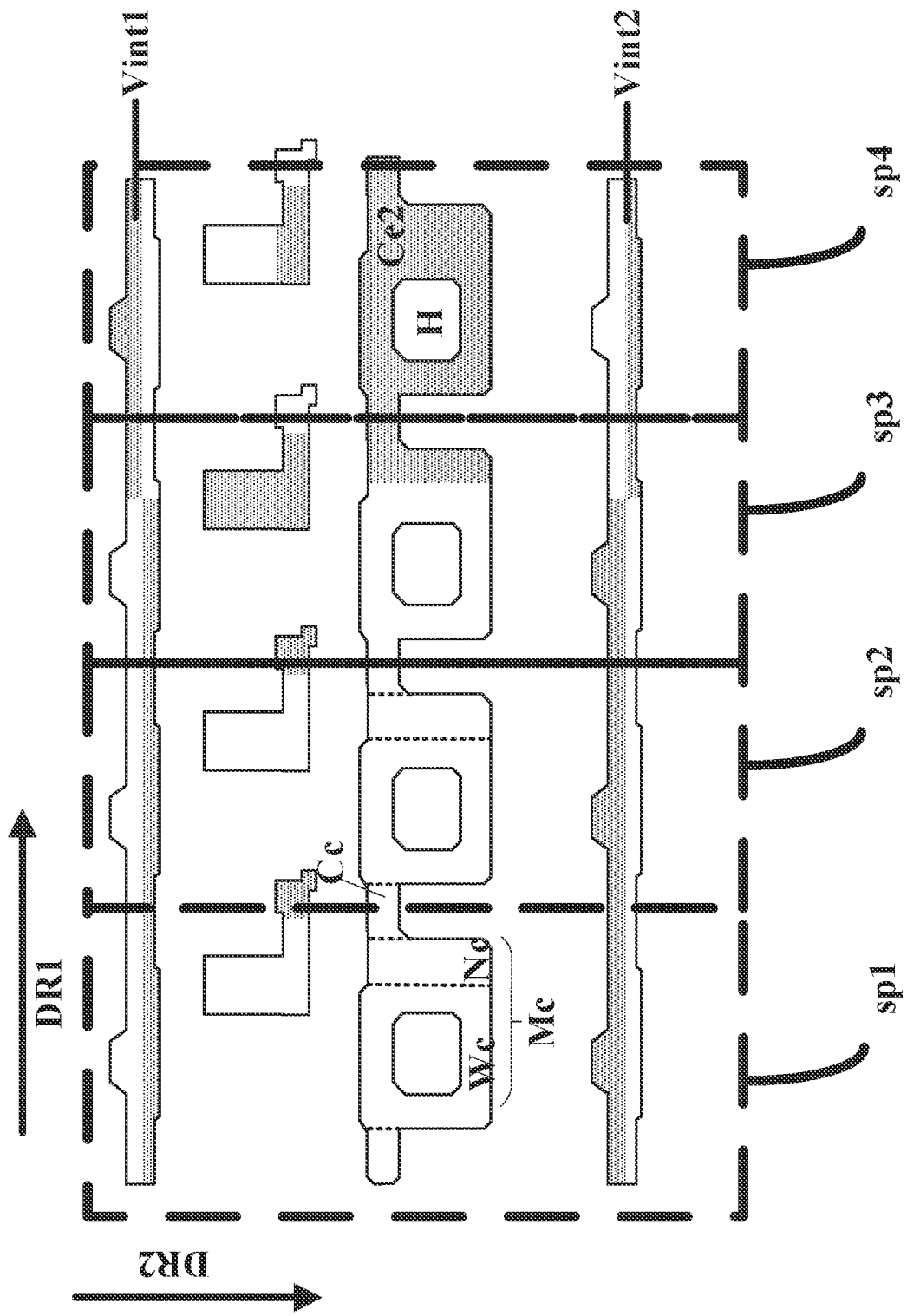
FIG. 19 is a diagram illustrating the structure of a second conductive layer in a plurality of subpixels of an array substrate depicted in FIG. 3.

FIG. 19 is a diagram illustrating the structure of a second conductive layer in a plurality of subpixels of an array substrate depicted in FIG. 3. Referring to FIG. 19, the second capacitor electrode Ce1 includes a main portion Mc and a connection portion Cc connecting main portions of second capacitor electrodes respectively from two adjacent subpixels along the first direction DR1. The main portion Mc has a wider portion Wc and a narrower portion Nc, the wider portion Wc having a width along a direction perpendicular to the first direction DR1 (e.g., along the second direction DR2) greater than a width of the narrower portion Nc along the direction perpendicular to the first direction DR1.

Figure 20:
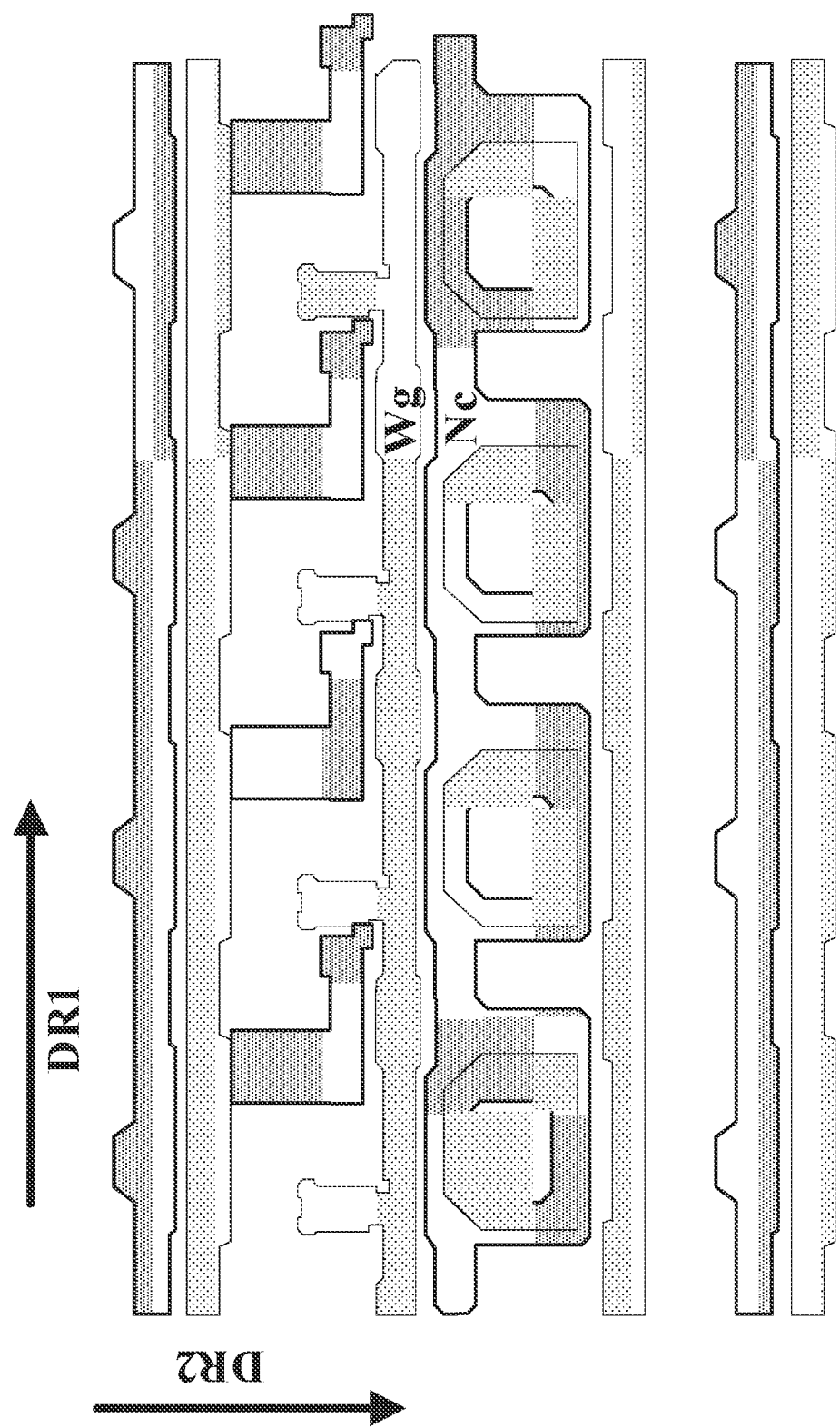
FIG. 20 is a diagram illustrating the structure of a first conductive layer and a second conductive layer in a plurality of subpixels of an array substrate depicted in FIG. 3.

FIG. 20 is a diagram illustrating the structure of a first conductive layer and a second conductive layer in a plurality of subpixels of an array substrate depicted in FIG. 3. Referring to FIG. 20, in some embodiments, a respective one of the plurality of wide portions Wg and the narrower portion Nc are arranged along the second direction DR2. Optionally, orthographic projections of a respective one of the plurality of wide portions Wg and the narrower portion Nc on a plane containing a line along a first direction DR1 at least partially overlaps with each other.

Optionally, a respective one of the plurality of wide portions Wg and the connection portion Cc are arranged along the second direction DR2. Optionally, orthographic projections of a respective one of the plurality of wide portions Wg and the connection portion Cc on a plane containing a line along a first direction at least partially overlaps with each other.

In some embodiments, a respective column of pixel driving circuits corresponds to the data line Optionally, the data line DL includes a main data line portion and a protruding data line portion. Optionally, the protruding data line portion has a dimension along the first direction DR1 greater than a dimension of the main data line portion along the first direction DR1.

Figure 21:
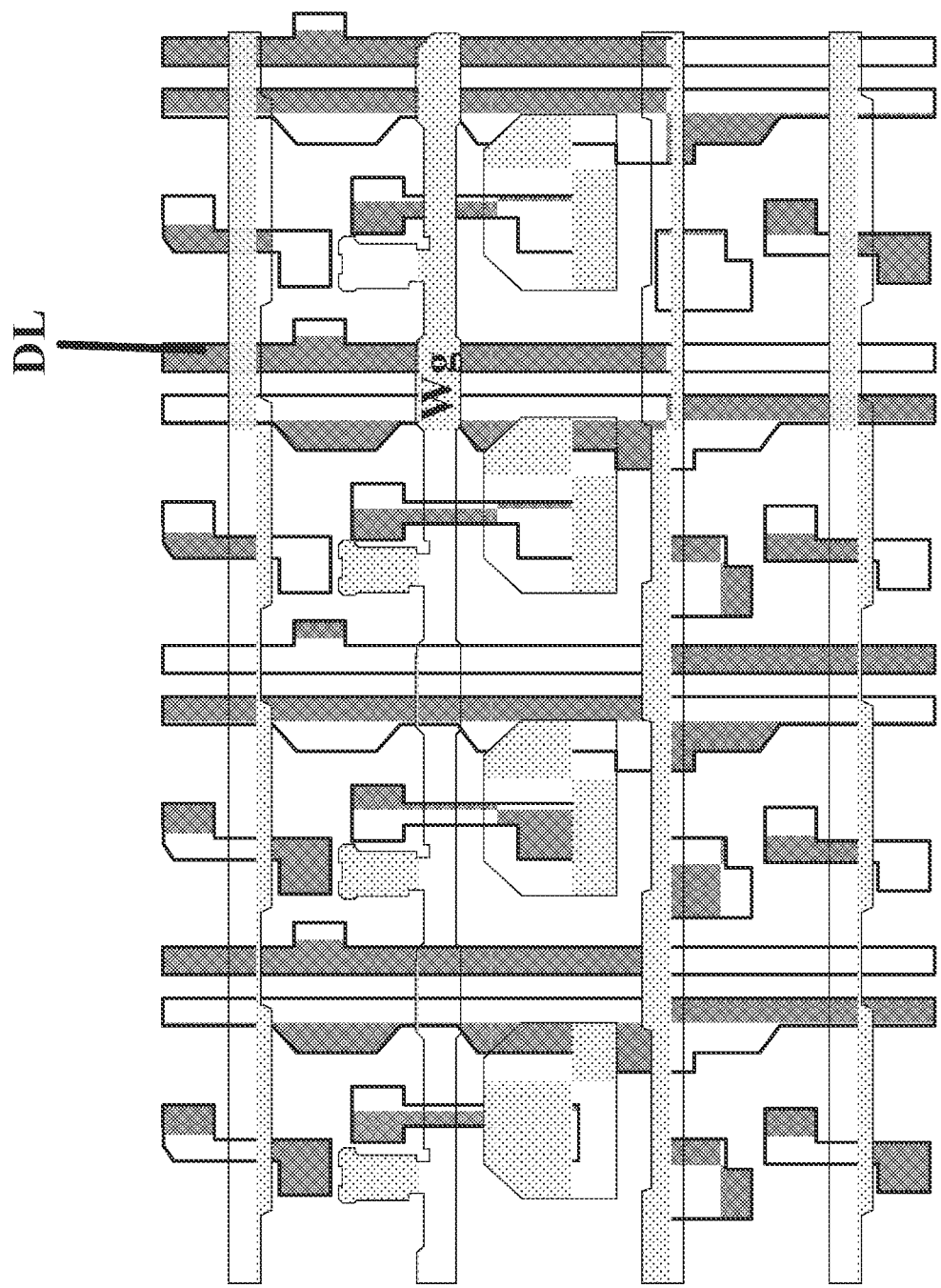
FIG. 21 is a diagram illustrating the structure of a first conductive layer and a first signal line layer in a plurality of subpixels of an array substrate depicted in FIG. 3.

FIG. 21 is a diagram illustrating the structure of a first conductive layer and a first signal line layer in a plurality of subpixels of an array substrate depicted in FIG. 3. Referring to FIG. 21, in some embodiments, the orthographic projection of the respective one of the plurality of wide portions Wg on the base substrate only partially overlaps with an orthographic projection of the data line DL on the base substrate. Optionally, the orthographic projection of the respective one of the plurality of wide portions Wg on the base substrate partially overlaps with an orthographic projection of the data line DL on the base substrate forming an overlapped part, a ratio of a dimension of the overlapped part along the first direction DR1 to a dimension of the main data line portion along the first direction DR1 is in a range of 10% to 100%.

The overlapping between the orthographic projection of the respective one of the plurality of wide portions Wg on the base substrate with the orthographic projection of the data line DL on the base substrate can be minimized. Optionally, the orthographic projection of the respective one of the plurality of wide portions Wg on the base substrate is non-overlapping with an orthographic projection of the data line DL on the base substrate. Optionally, the orthographic projection of the respective one of the plurality of wide portions Wg on the base substrate and an orthographic projection of the data line DL on the base substrate are alternately arranged.

Referring to FIG. 3, FIG. 10 and FIG. 14A, in some embodiments, orthographic projections of first nodes respectively in the first subpixel sp1, the second subpixel sp2, and the third subpixel sp3 on a base substrate are respectively at least 50% (e.g., at least 60%, at least 70%, at least 80%, at least 90%, or at least 95%) covered by orthographic projections of a first anode AD1 of a first light emitting element in the first subpixel sp1, a second anode AD2 of a second light emitting element in the second subpixel sp2, and a third anode AD3 of a third light emitting element in the third subpixel sp3 on the base substrate. As used herein, a respective first node N1 in a respective subpixel includes a respective gate electrode (e.g., the first capacitor electrode Ce1) of the driving transistor and a respective node connecting line in the respective subpixel. Optionally, orthographic projections of node connecting lines respectively in the first subpixel sp1, the second subpixel sp2, and the third subpixel sp3 on the base substrate are respectively at least 80% covered by orthographic projections of the first anode AD1 of the first light emitting element in the first subpixel sp1, the second anode AD2 of the second light emitting element in the second subpixel sp2, and the third anode AD3 of the third light emitting element in the third subpixel sp3 on the base substrate. By having this structure, the subpixels in the array substrate can emit light in a more uniform manner. Orthographic projections of the anodes in the present array substrate covers more of the orthographic projections of node connecting lines, thus covers less of orthographic projections of capacitor electrodes, thereby reducing load on the storage capacitor.

In some embodiments, the orthographic projections of first nodes respectively in the first subpixel sp1, the second subpixel sp2, the third subpixel sp3, and the fourth subpixel sp4 on a base substrate are respectively at least 50% (e.g., at least 60%, at least 70%, at least 80%, at least 90%, or at least 95%) covered by orthographic projections of a first anode AD1 of a first light emitting element in the first subpixel sp1, a second anode AD2 of a second light emitting element in the second subpixel sp2, a third anode AD3 of a third light emitting element in the third subpixel sp3, and a fourth anode AD4 of a fourth light emitting element in the fourth subpixel sp4 on the base substrate. Optionally, orthographic projections of node connecting lines respectively in the first subpixel sp1, the second subpixel sp2, the third subpixel sp3, and the fourth subpixel sp4 on the base substrate are respectively at least 80% covered by orthographic projections of the first anode AD1 of the first light emitting element in the first subpixel sp1, the second anode AD2 of the second light emitting element in the second subpixel sp2, the third anode AD3 of the third light emitting element in the third subpixel sp3, and the fourth anode AD4 of the fourth light emitting element in the fourth subpixel sp4, on the base substrate.

In some embodiments, an orthographic projection of a first node N1 in the second subpixel sp2 on the base substrate is at least 60% covered by an orthographic projection of the second anode AD2 of the second light emitting element in the second subpixel sp2 on the base substrate; an orthographic projection of a first node N1 in the fourth subpixel sp4 on the base substrate is at least 60% covered by an orthographic projection of a fourth anode AD4 of a fourth light emitting element in the fourth subpixel sp4 on the base substrate; and a first area of the orthographic projection of the first node N1 in the second subpixel sp2 on the base substrate covered by the orthographic projection of the second anode AD2 of the second light emitting element in the second subpixel sp2 on the base substrate is greater than a second area of the orthographic projection of the first node N1 in the fourth subpixel sp4 on the base substrate covered by the orthographic projection of the fourth anode AD4 of the fourth light emitting element in the fourth subpixel sp4 on the base substrate.

Figure 22:
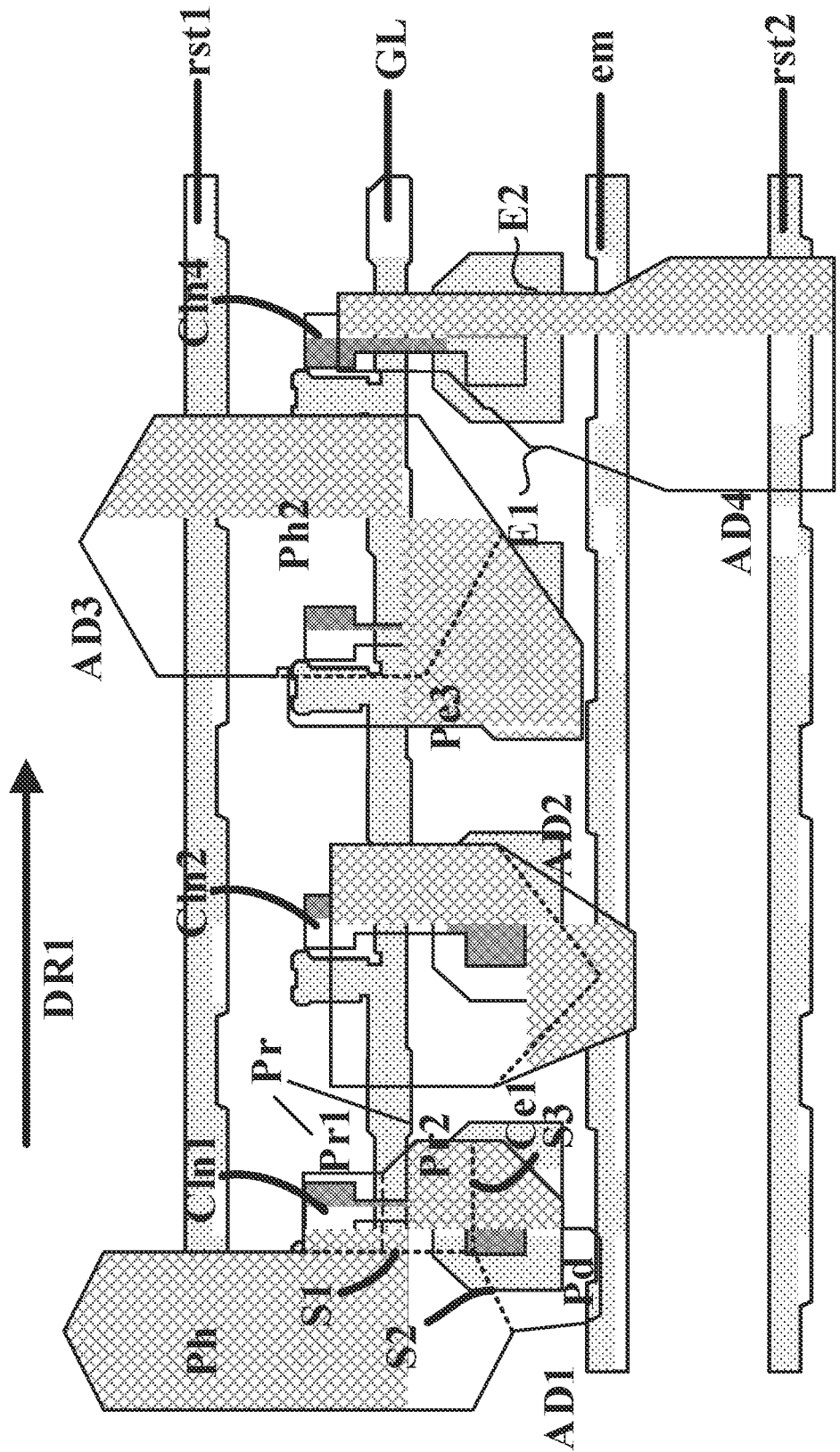
FIG. 22 is a diagram illustrating the structure of anodes, node connecting lines, and a first conductive layer in an array substrate depicted in FIG. 3.

FIG. 22 is a diagram illustrating the structure of anodes, node connecting lines, and a first conductive layer in an array substrate depicted in FIG. 3. Referring to FIG. 22, the orthographic projection of the fourth anode AD4 of the fourth light emitting element in the fourth subpixel on the base substrate has a first edge E1 and a second edge E2 respectively on two sides, along the first direction, of an orthographic projection of a node connecting line Cln4 in the fourth subpixel on the base substrate. Optionally, the first edge E1 is a non-straight line; and the second edge E2 includes a straight line. Optionally, the first edge E1 is a curved line; and the second edge E2 includes one or more straight lines. The first direction DR1 is perpendicular to the orthographic projection of a node connecting line Cln4 in the fourth subpixel on the base substrate.

Referring to FIG. 22, the third anode AD3 of the third light emitting element in the third subpixel in some embodiments includes a main third anode portion Ph2 of a hexagonal shape and an extra third anode portion Pe3. Referring to FIG. 22 and FIG. 16, an orthographic projection of a portion (e.g., the extra third anode portion Pe3) the third anode AD3 of the third light emitting element in the third subpixel on the base substrate at least partially overlaps with an orthographic projections of a gate electrode (e.g., the respective one of the plurality of protrusion P in FIG. 16) of the third transistor on the base substrate, thereby stabilizing potential level of the third transistor.

Referring to FIG. 22, in some embodiments, the first anode AD1 of the first light emitting element in the first subpixel sp1 includes a first portion Ph of a hexagonal shape, a second portion Pr, and a third portion Pd. Optionally, the hexagonal shape has a first side S and a second side S2 directly connected to each other. The second portion Pr abuts the first side S1. The third portion Pd abuts the second side S2. The second portion Pr and the third portion Pd abut each other along a third side S3. The first side S1, the second side S2, and the third side S3 are directly connected to each other at a corner of the hexagonal shape.

In some embodiments, the second portion Pr includes a first sub-portion Pr1 and a second sub-portion Pr2. An orthographic projection of the first sub-portion Pr1 on the base substrate at least partially overlaps with an orthographic projection of a node connecting line Cln1 in the first subpixel on the base substrate but is non-overlapping with an orthographic projection of the gate electrode (e.g., the first capacitor electrode Ce1) of the driving transistor in the first subpixel on the base substrate. An orthographic projection of the second sub-portion Pr2 on the base substrate at least partially overlaps with the orthographic projection of the node connecting line Cln1 in the first subpixel on the base substrate and at least partially overlaps with the orthographic projection of the gate electrode of the driving transistor in the first subpixel on the base substrate.

Figure 23:
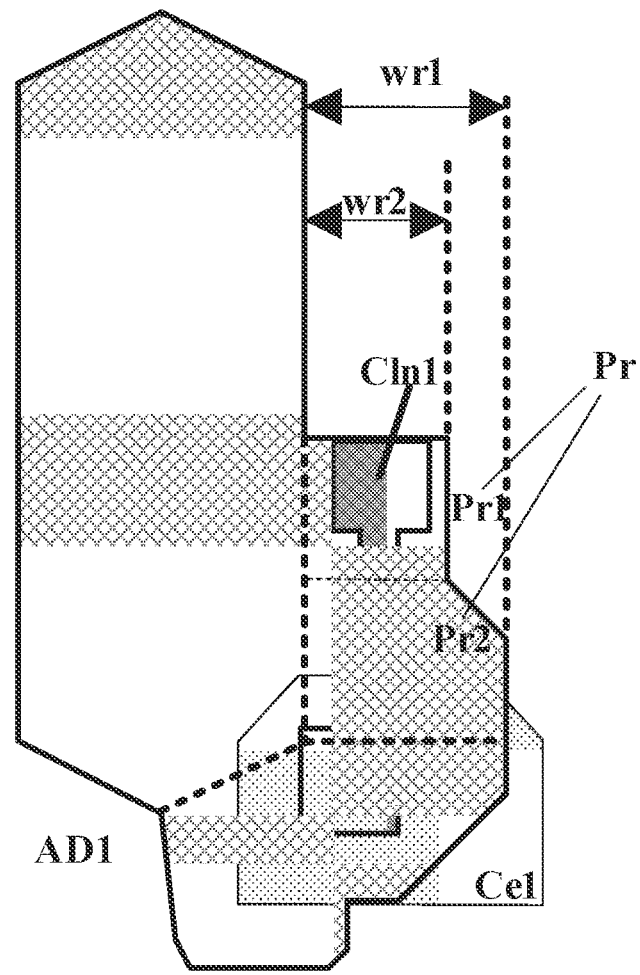
FIG. 23 is a partial zoom-in view of FIG. 22.

FIG. 23 is a partial zoom-in view of FIG. 22. Referring to FIG. 22 and FIG. 23, a first width wr1 of the second sub-portion Pr2 along the first direction DR1 is greater than a second width wr2 of the first sub-portion Pr1 along the first direction DR1.

Figure 24:
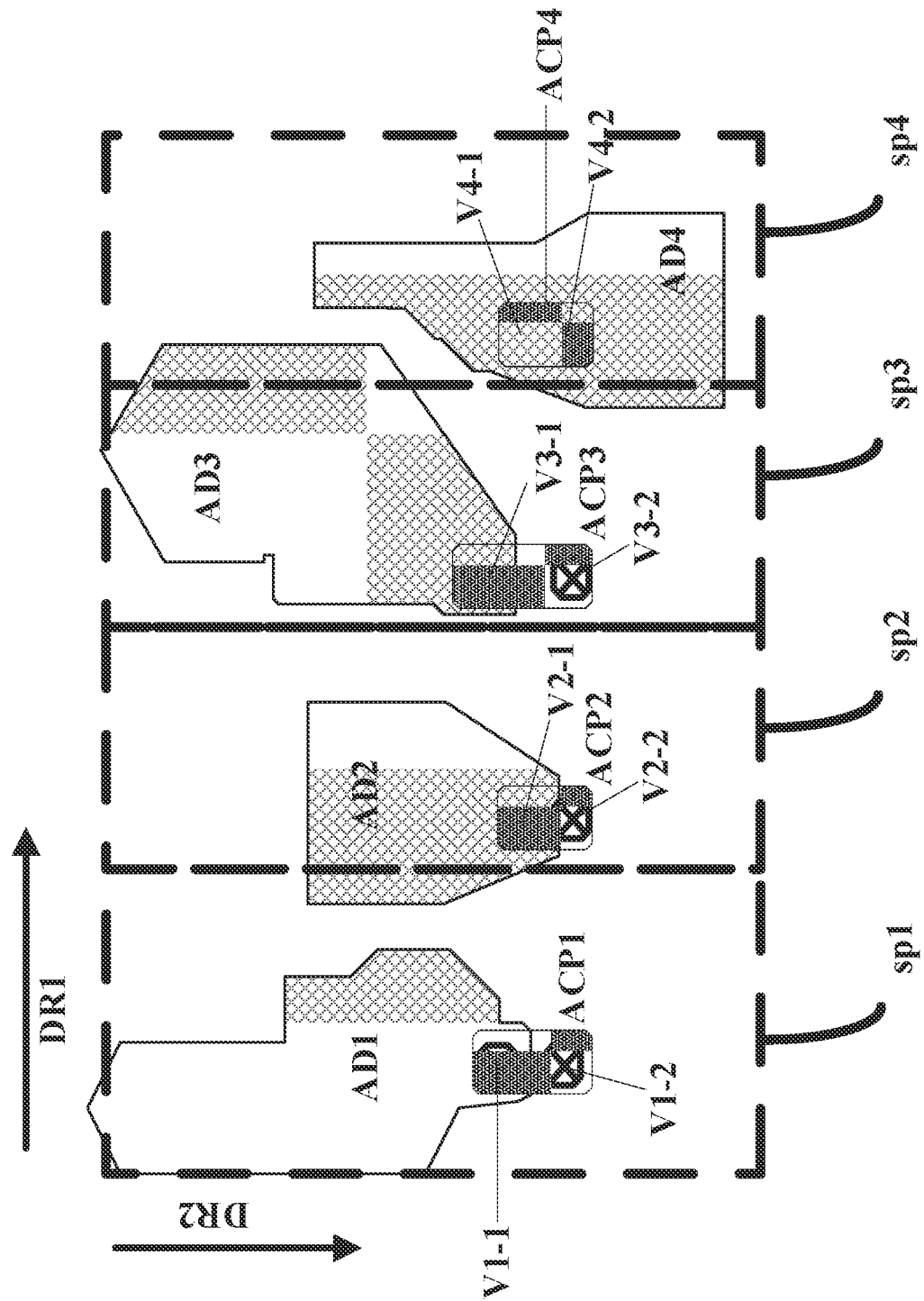
FIG. 24 is a diagram illustrating the structure of anodes and anode contact pads in an array substrate depicted in FIG. 3.

FIG. 24 is a diagram illustrating the structure of anodes and anode contact pads in an array substrate depicted in FIG. 3. Referring to FIG. 24, and FIG. 7 to FIG. 9, in some embodiments, in the first subpixel sp1, the first anode AD1 is connected to a first anode contact pad ACP1 through a first via V1-1 extending through the second planarization layer, the first anode contact pad ACP1 is connected to a first relay electrode RE1 through a second via V1-2 extending through the first planarization layer; in the second subpixel sp2, the second anode AD2 is connected to a second anode contact pad ACP2 through a third via V2-1 extending through the second planarization layer, the second anode contact pad ACP2 is connected to a second relay electrode RE2 through a fourth via V2-2 extending through the first planarization layer; in the third subpixel sp3, the third anode AD3 is connected to a third anode contact pad ACP3 through a fifth via V3-1 extending through the second planarization layer, the third anode contact pad ACP3 is connected to a third relay electrode RE3 through a sixth via V3-2 extending through the first planarization layer; and in the fourth subpixel sp4, the fourth anode AD4 is connected to a fourth anode contact pad ACP4 through a seventh via V4-1 extending through the second planarization layer, the fourth anode contact pad ACP4 is connected to a fourth relay electrode RE4 through an eighth via V4-2 extending through the first planarization layer. As shown in FIG. 24, a first distance between the first via V1-1 and the second via V1-2 is greater than a second distance between the third via V2-1 and the fourth via V2-2. A third distance between the fifth via V3-1 and the sixth via V3-2 is greater than the second distance between the third via V2-1 and the fourth via V2-2.

In the present array substrate, by having the second distance less than the first distance and less than the third distance, the fourth via V2-2 can be spaced apart from a effective light emitting region of the second subpixel sp2. In some embodiments, a first shortest distance between an orthographic projection of a first effective light emitting region of the first subpixel sp1 on the base substrate and an orthographic projection of the second via V1-2 on the base substrate is greater than a second shortest distance between an orthographic projection of a second effective light emitting region of the second subpixel sp2 on the base substrate and an orthographic projection of the fourth via. V2-2 on the base substrate. Optionally, a third shortest distance between an orthographic projection of a third effective light emitting region of the third subpixel sp3 on the base substrate and an orthographic projection of the sixth via V3-2 on the base substrate is greater than the second shortest distance.

In some embodiments, a fourth shortest distance between an orthographic projection of the second via V1-2 on the base substrate and an orthographic projection of any anodes adjacent to the first anode AD1 on the base substrate is greater than a fifth shortest distance between an orthographic projection of the sixth via V3-2 on the base substrate and an orthographic projection of any anodes adjacent to the third anode AD3 on the base substrate. Optionally, a sixth shortest distance between an orthographic projection of the fourth via V2-2 on the base substrate and an orthographic projection of any anodes adjacent to the second anode AD2 on the base substrate is greater than the fifth shortest distance.

In some embodiments, a first length of the first anode contact pad ACP1 along the second direction DR2 and a second length of the second anode contact pad ACP2 along the second direction DR2 are less than a third length of the third anode contact pad ACP3 along the second direction DR2. Optionally, a fourth length of the fourth anode contact pad ACP4 along the second direction DR2 is less than the third length of the third anode contact pad. ACP3 along the second direction DR2.

By having the third length greater than the first length and the second length, the sixth via V3-2 can be spaced apart from a first anode of the first subpixel sp1 in an adjacent row. By having this structure, the first anode can be disposed on a more even surface. In some embodiments, a shortest distance between the orthographic projection of the sixth via V3-2 on the base substrate and orthographic projections of anodes in an adjacent row on the base substrate is less than a shortest distance between the orthographic projection of the second via V1-2 on the base substrate and orthographic projections of anodes in an adjacent row on the base substrate, and is also less than a shortest distance between the orthographic projection of the fourth via V2-2 on the base substrate and orthographic projections of anodes in an adjacent row on the base substrate.

Referring to FIG. 3, FIG. 10 and FIG. 14A, in some embodiments, a third area of an orthographic projection of a first node N1 in the first subpixel sp1 on the base substrate covered by an orthographic projection of the first anode AD1 of the first light emitting element in the first subpixel sp1 on the base substrate is substantially same as a fourth area of an orthographic projection of a first node N1 in the third subpixel sp3 on the base substrate covered by an orthographic projection of the third anode AD3 of the third light emitting element in the third subpixel sp3 on the base substrate. Optionally, the third area and the fourth area are less than a first area of an orthographic projection of a first node N1 in the second subpixel sp1 on the base substrate covered by the orthographic projection of the second anode AD2 of the second light emitting element in the second subpixel sp2 on the base substrate.

Figure 25:
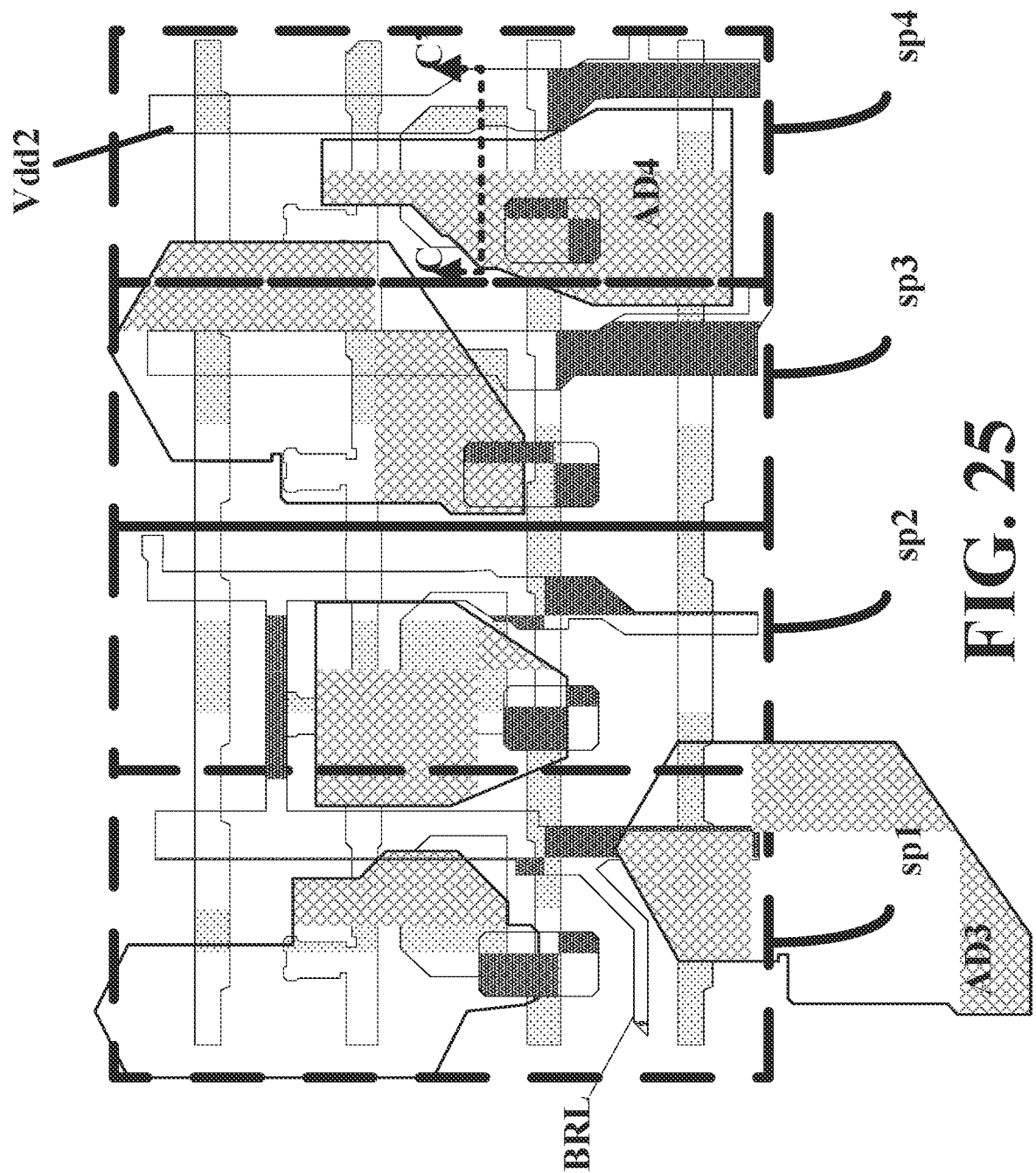
FIG. 25 is a diagram illustrating the structure of anodes, a first conductive layer, and a second signal line layer in an array substrate depicted in FIG. 3.
Figure 26:
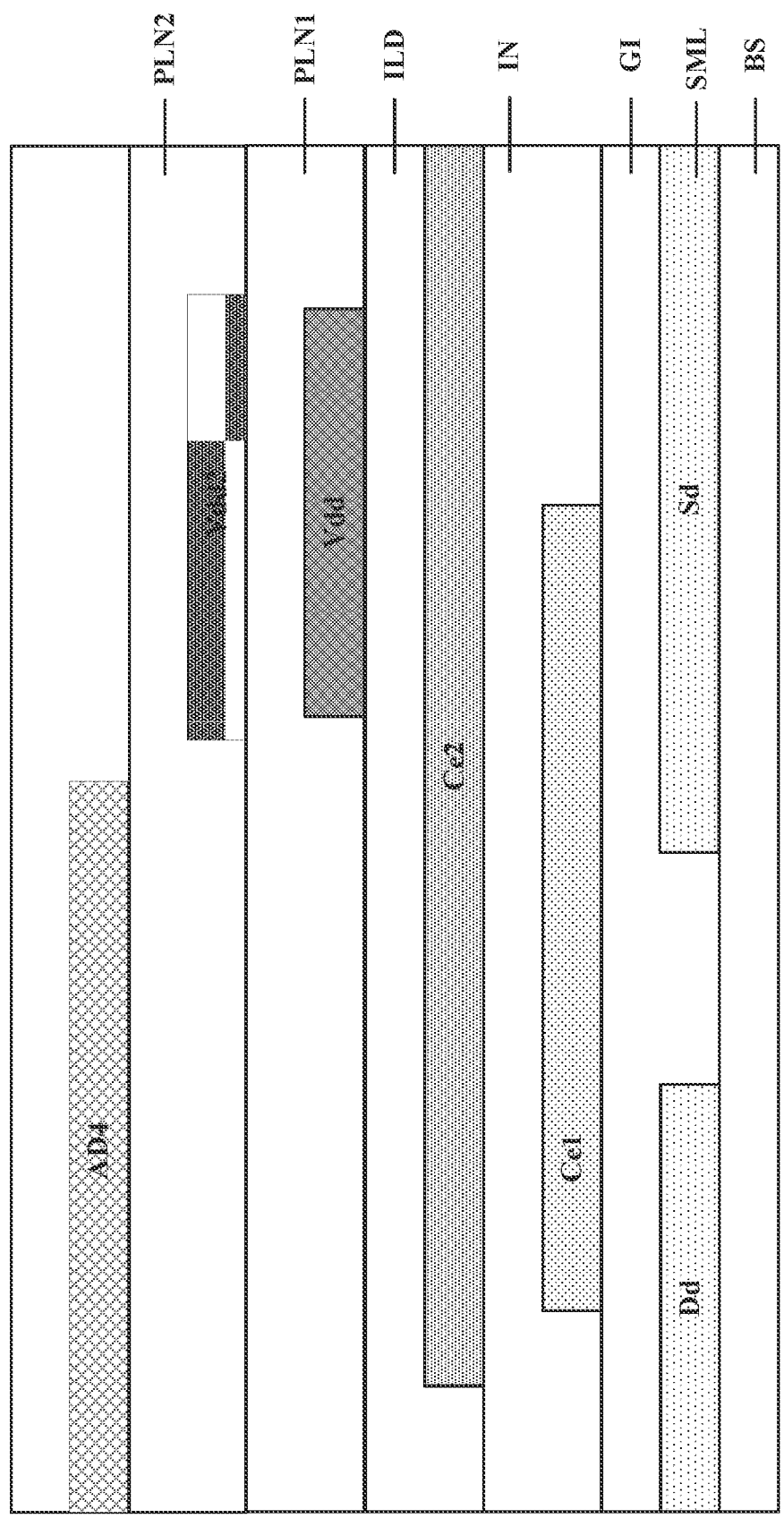
FIG. 26 is a cross-sectional view along a C-C' line in FIG. 11.

FIG. 25 is a diagram illustrating the structure of anodes, a first conductive layer, and a second signal line layer in an array substrate depicted in FIG. 3. FIG. 26 is a cross-sectional view along a C-C' line in FIG. 11. Referring to FIG. 25 and FIG. 26, the orthographic projection of the fourth anode AD4 on the base substrate overlaps with a first side of an orthographic projection of the first capacitor electrode Ce1 in the fourth subpixel on the base substrate, but is non-overlapping with a second side of the orthographic projection of the first capacitor electrode Ce1 in the fourth subpixel on the base substrate, to avoid any overlapping with the orthographic projection of a second voltage supply line Vdd2 on the base substrate. The orthographic projection of the fourth anode AD4 on the base substrate is non-overlapping with an orthographic projection of the second voltage supply line Vdd2 on the base substrate, achieving a substantially even surface of the second planarization layer PLN2 underneath the fourth anode AD4. As a result, the fourth anode AD4 is not tilted, obviating color shift issue.

Similarly, an orthographic projection of the third anode AD3 on the base substrate is non-overlapping with an orthographic projection of a branch line BRL in the second signal line layer on the base substrate, to achieving a substantially even surface of the second planarization layer PLN2 underneath the third anode AD3.

Figure 27:
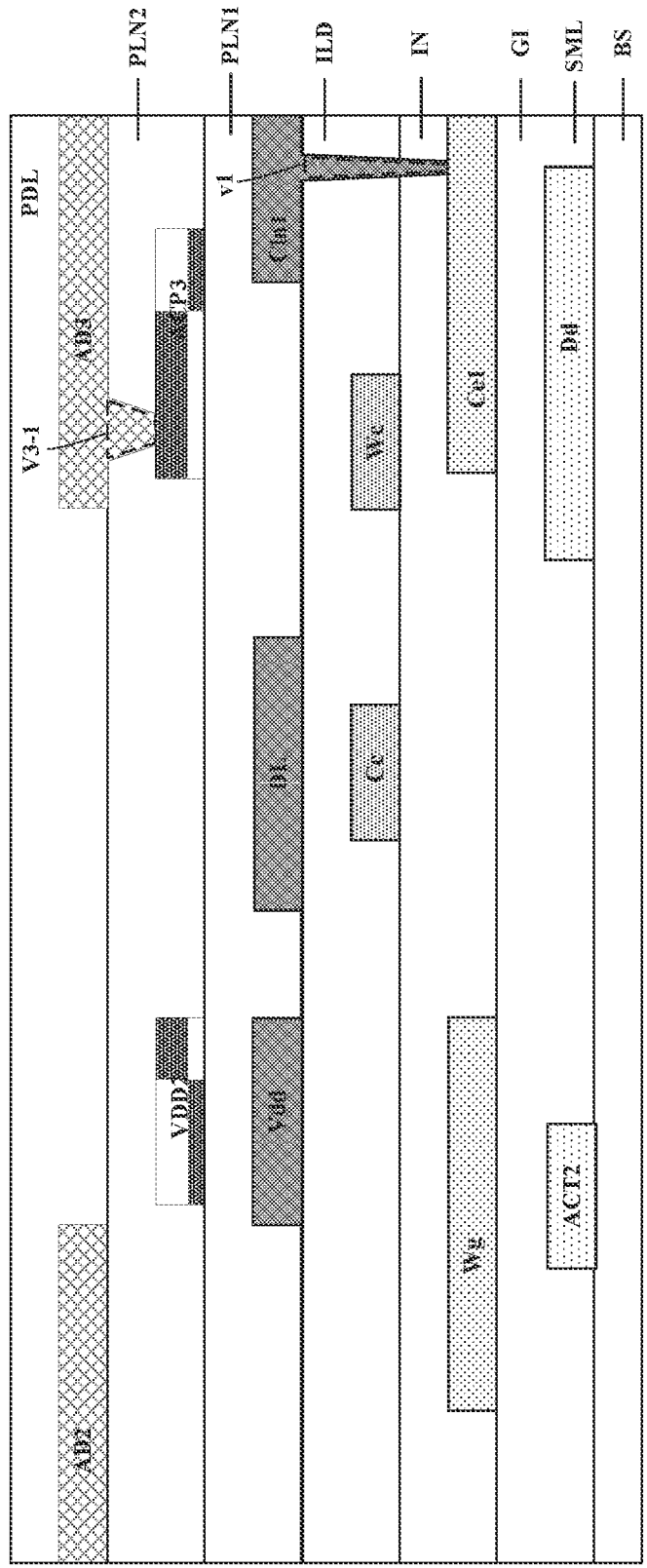
FIG. 27 is a cross-sectional view along a D-D' line in FIG. 11.

FIG. 27 is a cross-sectional view along a D-D' line in FIG. 11. Referring to FIG. 27, the respective one of the plurality of wide portions Wg and the connecting portion Cc are arranged along the second direction. Optionally, orthographic projections of a respective one of the plurality of wide portions Wg and the connecting portion Cc on a plane containing a line along a first direction at least partially overlaps with each other.

In another aspect, the present invention provides a display apparatus, comprising the array substrate described herein or fabricated by a method described herein, and one or more integrated circuits connected to the array substrate.

In another aspect, the present invention provides a method of fabricating an array substrate. In some embodiments, the method includes forming a plurality of light emitting elements, and forming a plurality of pixel driving circuits respectively in a plurality of subpixels configured to respectively drive the plurality of light emitting elements. Optionally, forming a respective one of the plurality of pixel driving circuits includes forming a plurality of transistors, and forming a storage capacitor. Optionally, forming the storage capacitor includes forming a first capacitor electrode, forming a second capacitor electrode electrically connected to a respective voltage supply line, and forming an insulating layer between the first capacitor electrode and the second capacitor electrode.

In some embodiments, the method includes forming a semiconductor material layer on a base substrate; forming a node connecting line in a same layer as the respective voltage supply line; forming a first main via and a second main via in the array substrate; connecting the node connecting line to the first capacitor electrode through the first main via; and connecting the node connecting line to the semiconductor material layer through the second main via.

In some embodiments, forming the plurality of subpixels includes forming a first subpixel configured to emit a light of a first color; forming a second subpixel configured to emit a light of a second color; forming a third subpixel configured to emit a light of a third color; and forming a fourth subpixel configured to emit a light of the second color.

In some embodiments, percentages of orthographic projections of a first respective node connecting line in the first subpixel, a second respective node connecting line in the second subpixel, a third respective node connecting line in the third subpixel, and a fourth respective node connecting line in the fourth subpixel on the base substrate respectively covered by orthographic projections of a first anode of a first light emitting element in the first subpixel, a second anode of a second light emitting element in the second subpixel, a third anode of a third light emitting element in the third subpixel, and a fourth anode of a fourth light emitting element in the fourth subpixel on the base substrate are within 20% of each other.

In some embodiments, the orthographic projections of the first respective node connecting line in the first subpixel, the second respective node connecting line in the second subpixel, the third respective node connecting line in the third subpixel, and the fourth respective node connecting line in the fourth subpixel on the base substrate are, respectively, substantially covered by the orthographic projections of the first anode of the first light emitting element in the first subpixel, the second anode of the second light emitting element in the second subpixel, the third anode of the third light emitting element in the third subpixel, and the fourth anode of the fourth light emitting element in the fourth subpixel on the base substrate.

In some embodiments, percentages of orthographic projections of first capacitor electrodes respectively in the first subpixel, the second subpixel, the third subpixel, and the fourth subpixel on the base substrate respectively covered by the orthographic projections of the first anode of the first light emitting element in the first subpixel, the second anode of the second light emitting element in the second subpixel, the third anode of the third light emitting element in the third subpixel, and the fourth anode of the fourth light emitting element in the fourth subpixel on the base substrate are within 20% of each other.

In some embodiments, the method further includes forming a semiconductor material layer on the base substrate; forming a gate insulating layer on a side of the semiconductor material layer away from the base substrate, the first capacitor electrode being on a side of the gate insulating layer away from the base substrate; and forming an inter-layer dielectric layer on a side of the first capacitor electrode away from the gate insulating layer, the node connecting line being on a side of the inter-layer dielectric layer away from the second capacitor electrode. Optionally, the first main via is formed in a hole region in which a portion of the second capacitor electrode is absent, and formed to extend through the inter-layer dielectric layer and the insulating layer. Optionally, an orthographic projection of the second capacitor electrode on a base substrate completely covers, with a margin, an orthographic projection of the first capacitor electrode on the base substrate except for the hole region. Optionally, the second main via is formed to extend through the inter-layer dielectric layer, the insulating layer, and the gate insulating layer.

In some embodiments, percentages of orthographic projections of hole regions respectively in the first subpixel, the second subpixel, the third subpixel, and the fourth subpixel on the base substrate respectively covered by the orthographic projections of the first anode of the first light emitting element in the first subpixel, the second anode of the second light emitting element in the second subpixel, the third anode of the third light emitting element in the third subpixel, and the fourth anode of the fourth light emitting element in the fourth subpixel on the base substrate are within 20% of each other. Optionally, respective portions of second capacitor electrodes in the first subpixel, the second subpixel, the third subpixel, and the fourth subpixel are respectively absent in the hole regions. Optionally, the hole regions are respectively surrounded by the second capacitor electrodes.

In some embodiments, the orthographic projections of the hole regions respectively in the first subpixel, the second subpixel, the third subpixel, and the fourth subpixel on the base substrate are, respectively, substantially covered by the orthographic projections of the first anode of the first light emitting element in the first subpixel, the second anode of the second light emitting element in the second subpixel, the third anode of the third light emitting element in the third subpixel, and the fourth anode of the fourth light emitting element in the fourth subpixel on the base substrate.

In some embodiments, forming the plurality of transistors in the respective one of the plurality of pixel driving circuits includes forming a driving transistor. The first capacitor electrode in the respective one of the plurality of pixel driving circuits also functions as a gate electrode of the driving transistor. Forming the semiconductor material layer includes forming an active layer of the driving transistor. Optionally, percentages of orthographic projections of active layers of driving transistors respectively in the first subpixel, the second subpixel, the third subpixel, and the fourth subpixel on the base substrate respectively covered by the orthographic projections of the first anode of the first light emitting element in the first subpixel, the second anode of the second light emitting element in the second subpixel, the third anode of the third light emitting element in the third subpixel, and the fourth anode of the fourth light emitting element in the fourth subpixel on the base substrate are within 20% of each other.

In some embodiments, the orthographic projections of the active layers of the driving transistors respectively in the first subpixel, the second subpixel, the third subpixel, and the fourth subpixel on the base substrate are, respectively, substantially covered by the orthographic projections of the first anode of the first light emitting element in the first subpixel, the second anode of the second light emitting element in the second subpixel, the third anode of the third light emitting element in the third subpixel, and the fourth anode of the fourth light emitting element in the fourth subpixel on the base substrate.

In some embodiments, the first anode of the first light emitting element in the first subpixel is formed to include a first portion of a hexagonal shape, a second portion, and a third portion. The hexagonal shape has a first side and a second side directly connected to each other. The second portion abuts the first side. The third portion abuts the second side. The second portion and the third portion abut each other along a third side. The first side, the second side, and the third side are directly connected to each other at a corner of the hexagonal shape.

In some embodiments, the orthographic projection of the first respective node connecting line in the first subpixel on the base substrate are, respectively, substantially covered by a combination of orthographic projections of the second portion and the third portion on the base substrate, and is substantially non-overlapping with an orthographic projection of the first portion on the base substrate.

In some embodiments, an orthographic projection of a portion of the first respective node connecting line in the second main via on the base substrate is substantially covered by an orthographic projection of the second portion on the base substrate; and an orthographic projection of a portion of the first respective node connecting line in the first main via on the base substrate is substantially covered by an orthographic projection of the third portion on the base substrate.

In some embodiments, forming the plurality of transistors in the respective one of the plurality of pixel driving circuits includes forming a third transistor. Optionally, the semiconductor material layer in the first subpixel is formed to include a source electrode of the third transistor in the first subpixel, the source electrode of the third transistor in the first subpixel electrically connected to the first capacitor electrode through the first respective node connecting line in the first subpixel. Optionally, an orthographic projection of the second portion on the base substrate at least partially overlaps with an orthographic projection of the source electrode of the third transistor in the first subpixel on the base substrate.

In some embodiments, an orthographic projection of at least one of the second portion or the third portion on the base substrate at least partially overlaps with an orthographic projection of the respective voltage supply line in the first subpixel on the base substrate.

In some embodiments, the second anode of the second light emitting element in the second subpixel is formed to include a fourth portion of a rectangular shape and a fifth portion of a trapezoidal shape. The fourth portion and the fifth portion abut each other along a fourth side.

In some embodiments, the third anode of the third light emitting element in the third subpixel is formed to include a sixth portion of a pentagonal shape, a seventh portion of a rectangular shape, an eighth portion of a quasi-rectangular shape, and a ninth portion of a triangular shape. The sixth portion and the seventh portion abut each other along a fifth side. The seventh portion abuts, along a sixth side, the eighth portion and the ninth portion, respectively. The eighth portion and the ninth portion abut each other along a seventh side.

In some embodiments, the fourth anode of the fourth light emitting element in the fourth subpixel is formed to include a tenth portion of a pentagonal shape, an eleventh portion of a rectangular shape, and a twelfth portion of a quasi-triangular shape. The tenth portion abuts, along an eighth side, the eleventh portion and the twelfth portion, respectively. The eleventh portion and the twelfth portion abut each other along a ninth side.

In some embodiments, the method further includes forming a gate line extending through the first subpixel, the second subpixel; the third subpixel, and the fourth subpixel. Optionally, the first respective node connecting line, the second respective node connecting line, the third respective node connecting line, and the fourth respective node connecting line are formed to respectively cross over the gate line.

In some embodiments, forming the plurality of transistors includes forming a driving transistor; forming a first transistor; forming a second transistor; forming a third transistor; forming a fourth transistor; forming a fifth transistor; and forming a sixth transistor. Optionally, the method further includes forming a first reset control signal line connected to a gate electrode of the first transistor; forming a gate line connected to a gate electrode of the second transistor and the third transistor; forming a light emitting control signal line connected to a gate electrode of the fourth transistor and the fifth transistor; and forming a second reset control signal line connected to a gate electrode of the sixth transistor.

In some embodiments, the first anode crosses over the first reset control signal line and the gate line; the second anode crosses over the gate line and the light emitting control signal line; the third anode crosses over the first reset control signal line and the gate line; and the fourth anode crosses over the gate line, the light emitting control signal line, and the second reset control signal line.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:
a base substrate;
a semiconductor material layer on the base substrate;

a gate line extending along a first direction;

a plurality of pixel driving circuits respectively in a plurality of subpixels configured to respectively drive a plurality of light emitting elements;

wherein a respective one of the plurality of pixel driving circuits comprises a driving transistor configured to generate a driving current for driving a light emitting element to emit light, a data-write transistor configured to write a voltage into a source electrode of the driving transistor, and a compensating transistor;

the gate line comprises a plurality of wide portions and a plurality of narrow portions respectively arranged along the first direction, the plurality of wide portions having a first dimension greater than a second dimension of the plurality of narrow portions along a second direction, the second direction being at an angle in a range of 80 degrees to 100 degrees with respect to the first direction;

an orthographic projection of a respective one of the plurality of wide portions in the respective subpixel on the base substrate overlaps with an orthographic projection of a portion of the semiconductor material layer in the respective subpixel on the base substrate, forming an active layer of the data-write transistor in the respective subpixel; and a ratio of a channel length to a channel width of the active layer of the data-write transistor is in a range of 1.5:1 to 3:1;

wherein the array substrate further comprises a node connecting line connecting the gate electrode of the driving transistor and one of a source electrode and drain electrode of the compensating transistor;

wherein the plurality of subpixels comprises a first subpixel configured to emit a light of a first color; a second subpixel configured to emit a light of a second color; a third subpixel configured to emit a light of a third color;

orthographic projections of first nodes respectively in the first subpixel, the second subpixel, and the third subpixel on the base substrate are respectively at least 50% covered by orthographic projections of a first anode of a first light emitting element in the first subpixel, a second anode of a second light emitting element in the second subpixel, and a third anode of a third light emitting element in the third subpixel on the base substrate, a respective first node in a respective subpixel comprising a respective gate electrode of the driving transistor and a respective node connecting line in the respective subpixel; and orthographic projections of node connecting lines respectively in the first subpixel, the second subpixel, and the third subpixel on the base substrate are respectively at least 80% covered by orthographic projections of the first anode of the first light emitting element in the first subpixel, the second anode of the second light emitting element in the second subpixel, and the third anode of the third light emitting element in the third subpixel on the base substrate.

2. The array substrate of claim 1, wherein the ratio of the channel length to the channel width of the active layer of the data-write transistor is in a range of 2:1 to 3:1.

3. The array substrate of claim 1, wherein the plurality of wide portions and the plurality of narrow portions are arranged alternately along the first direction; and the plurality of wide portions are respectively in subpixels along the first direction.

4. The array substrate of claim 1, wherein the plurality of wide portions has a first line width along the second direction;

the plurality of narrow portions has a second line width along the second direction; and a ratio of the first line width to the second line width is in a range of 1.1:1 to 3:1.

5. The array substrate of claim 1, wherein the respective one of the plurality of wide portions has the first dimension greater than the second dimension by protruding towards both sides along the second direction relative to the respective one of the plurality of narrow portions.

6. The array substrate of claim 1, wherein the respective one of the plurality of pixel driving circuits further comprises a storage capacitor comprising a first capacitor electrode, a second capacitor electrode, and an insulating layer between the first capacitor electrode and the second capacitor electrode;

the second capacitor electrode comprises a main portion and a connection portion connecting main portions of second capacitor electrodes respectively from two adjacent subpixels along the first direction;

the main portion has a wider portion and a narrower portion, the wider portion having a width along a second direction greater than a width of the narrower portion along the direction perpendicular to the first direction; and orthographic projections of a respective one of the plurality of wide portions and the narrower portion on a plane containing a line arranged along a first direction at least partially overlap with each other.

7. The array substrate of claim 1, wherein the respective one of the plurality of pixel driving circuits further comprises a storage capacitor comprising a first capacitor electrode, a second capacitor electrode, and an insulating layer between the first capacitor electrode and the second capacitor electrode;

the second capacitor electrode comprises a main portion and a connection portion connecting main portions of second capacitor electrodes respectively from two adjacent subpixels along the first direction; and orthographic projections of a respective one of the plurality of wide portions and the connection portion on a plane containing a line arranged along a first direction at least partially overlap with each other.

8. The array substrate of claim 1, further comprising a data line extending along the second direction;

a respective column of pixel driving circuits corresponds to the data line;

the data line comprises a main data line portion and a protruding data line portion;

the protruding data line portion has a dimension along the first direction greater than a dimension of the main data line portion along the first direction;

wherein the orthographic projection of the respective one of the plurality of wide portions on the base substrate partially overlaps with an orthographic projection of the data line on the base substrate forming an overlapped part, a ratio of a dimension of the overlapped part along the first direction to a dimension of the main data line portion along the first direction is in a range of 10% to 100%.

9. The array substrate of claim 1, further comprising a data line extending along the second direction;

a respective column of pixel driving circuits corresponds to the data line;

the data line comprises a main data line portion and a protruding data line portion;

the protruding data line portion has a dimension along the first direction greater than a dimension of the main data line portion along the first direction;

wherein the orthographic projection of any one of the plurality of wide portions on the base substrate and an orthographic projection of the data line on the base substrate are spaced apart from each other.

10. A display apparatus, comprising the array substrate of claim 1.

11. An array substrate, comprising a plurality of pixel driving circuits respectively in a plurality of subpixels configured to respectively drive a plurality of light emitting elements;

wherein a respective one of the plurality of pixel driving circuits comprises a driving transistor and a compensating transistor;

wherein the array substrate comprises:

a node connecting line, the node connecting line connecting a gate electrode of the driving transistor and one of a first electrode and a second electrode of the compensating transistor;

wherein the plurality of subpixels comprise a first subpixel configured to emit a light of a first color; a second subpixel configured to emit a light of a second color; a third subpixel configured to emit a light of a third color;

orthographic projections of first nodes respectively in the first subpixel, the second subpixel, and the third subpixel on a base substrate are respectively at least 50% covered by orthographic projections of a first anode of a first light emitting element in the first subpixel, a second anode of a second light emitting element in the second subpixel, and a third anode of a third light emitting element in the third subpixel on the base substrate, a respective first node in a respective subpixel comprising a respective gate electrode of the driving transistor and a respective node connecting line in the respective subpixel; and orthographic projections of node connecting lines respectively in the first subpixel, the second subpixel, and the third subpixel on the base substrate are respectively at least 80% covered by orthographic projections of the first anode of the first light emitting element in the first subpixel, the second anode of the second light emitting element in the second subpixel, and the third anode of the third light emitting element in the third subpixel on the base substrate.

12. The array substrate of claim 11, wherein the plurality of subpixels further comprise a fourth subpixel configured to emit a light of the second color;

wherein an orthographic projection of a first node in the second subpixel on the base substrate is at least 60% covered by an orthographic projection of the second anode of the second light emitting element in the second subpixel on the base substrate;

an orthographic projection of a first node in the fourth subpixel on the base substrate is at least 60% covered by an orthographic projection of a fourth anode of a fourth light emitting element in the fourth subpixel on the base substrate; and a first area of the orthographic projection of the first node in the second subpixel on the base substrate covered by the orthographic projection of the second anode of the second light emitting element in the second subpixel on the base substrate is greater than a second area of the orthographic projection of the first node in the fourth subpixel on the base substrate covered by the orthographic projection of the fourth anode of the fourth light emitting element in the fourth subpixel on the base substrate.

13. The array substrate of claim 12, wherein the orthographic projection of the fourth anode of the fourth light emitting element in the fourth subpixel on the base substrate has a first edge and a second edge respectively on two sides, along the first direction, of an orthographic projection of a node connecting line in the fourth subpixel on the base substrate, the first direction being perpendicular to the orthographic projection of a node connecting line in the fourth subpixel on the base substrate;

the first edge is a non-straight line; and the second edge comprises a straight line.

14. The array substrate of claim 11, wherein the compensating transistor has a double gate structure comprising two gate electrodes;

an orthographic projection of a portion of the third anode of the third light emitting element in the third subpixel on the base substrate at least partially overlaps with an orthographic projection of a gate electrode of the compensating transistor on the base substrate.

15. The array substrate of claim 11, wherein the first anode of the first light emitting element in the first subpixel comprises a first portion of a hexagonal shape, a second portion, and a third portion;

the hexagonal shape has a first side and a second side directly connected to each other;

the second portion abuts the first side;

the third portion abuts the second side;

the second portion and the third portion abut each other along a third side; and the first side, the second side, and the third side are directly connected to each other at a corner of the hexagonal shape.

16. The array substrate of claim 15, wherein the second portion comprises a first sub-portion and a second sub-portion;

an orthographic projection of the first sub-portion on the base substrate at least partially overlaps with an orthographic projection of a node connecting line in the first subpixel on the base substrate but is non-overlapping with an orthographic projection of the gate electrode of the driving transistor in the first subpixel on the base substrate;

an orthographic projection of the second sub-portion on the base substrate at least partially overlaps with the orthographic projection of the node connecting line in the first subpixel on the base substrate and at least partially overlaps with the orthographic projection of the gate electrode of the driving transistor in the first subpixel on the base substrate;

the array substrate comprises a gate line extending along a first direction; and a first width of the second sub-portion along the first direction is greater than a second width of the first sub-portion along the first direction.

17. The array substrate of claim 11, wherein anodes are on a side of a second planarization layer away from a first planarization layer;

wherein, in the first subpixel, the first anode is connected to a first anode contact pad through a first via extending through the second planarization layer, the first anode contact pad is connected to a first relay electrode through a second via extending through the first planarization layer;

in the second subpixel, the second anode is connected to a second anode contact pad through a third via extending through the second planarization layer, the second anode contact pad is connected to a second relay electrode through a fourth via extending through the first planarization layer;

in the third subpixel, the third anode is connected to a third anode contact pad through a fifth via extending through the second planarization layer, the third anode contact pad is connected to a third relay electrode through a sixth via extending through the first planarization layer; and a first distance between orthographic projections of the first via and the second via on the base substrate is greater than a second distance between the third via and the fourth via; and a third distance between orthographic projections of the fifth via and the sixth via is greater than the second distance between the third via and the fourth via.

18. The array substrate of claim 17, wherein a first shortest distance between an orthographic projection of a first effective light emitting region of the first subpixel on the base substrate and an orthographic projection of the second via on the base substrate is greater than a second shortest distance between an orthographic projection of a second effective light emitting region of the second subpixel on the base substrate and an orthographic projection of the fourth via on the base substrate; and a third shortest distance between an orthographic projection of a third effective light emitting region of the third subpixel on the base substrate and an orthographic projection of the sixth via on the base substrate is greater than the second shortest distance.

19. A display apparatus, comprising the array substrate of claim 11.

20. The array substrate of claim 11, wherein a third area of an orthographic projection of a first node in the first subpixel on the base substrate covered by an orthographic projection of the first anode of the first light emitting element in the first subpixel on the base substrate is substantially same as a fourth area of an orthographic projection of a first node in the third subpixel on the base substrate covered by an orthographic projection of the third anode of the third light emitting element in the third subpixel on the base substrate; and the third area and the fourth area are less than a first area of an orthographic projection of a first node in the second subpixel on the base substrate covered by the orthographic projection of the second anode of the second light emitting element in the second subpixel on the base substrate.

* * * * *